US011502250B2

(12) United States Patent
Loy et al.

(10) Patent No.: US 11,502,250 B2
(45) Date of Patent: Nov. 15, 2022

(54) MEMORY DEVICES AND METHODS OF FORMING MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 241 days.

(21) Appl. No.: 16/882,795

(22) Filed: May 26, 2020

(65) Prior Publication Data

US 2021/0376235 A1 Dec. 2, 2021

(51) Int. Cl.
*H01L 45/00* (2006.01)

(52) U.S. Cl.
CPC ...... *H01L 45/1253* (2013.01); *H01L 45/1233* (2013.01); *H01L 45/1608* (2013.01); *H01L 45/146* (2013.01)

(58) Field of Classification Search
CPC ............ H01L 45/1253; H01L 45/1233; H01L 45/1608; H01L 45/146; H01L 27/2436; H01L 45/08
See application file for complete search history.

(56) References Cited

U.S. PATENT DOCUMENTS

| | | | |
|---|---|---|---|
| 7,560,723 B2* | 7/2009 | Liu | H01L 45/124 438/242 |
| 7,952,087 B2* | 5/2011 | Czubatyj | H01L 45/06 257/4 |
| 9,112,148 B2* | 8/2015 | Chang | H01L 45/1675 |
| 9,431,604 B2 | 8/2016 | Liao et al. | |
| 9,608,204 B2 | 3/2017 | Lee et al. | |
| 9,865,814 B2 | 1/2018 | Fest et al. | |
| 10,847,720 B1 | 11/2020 | Loy et al. | |
| 2015/0069316 A1 | 3/2015 | Lee et al. | |
| 2015/0340606 A1 | 11/2015 | Tada et al. | |
| 2017/0117463 A1 | 4/2017 | Chen | |
| 2018/0138403 A1 | 5/2018 | Chang et al. | |
| 2021/0020834 A1 | 1/2021 | Loy et al. | |

OTHER PUBLICATIONS

Platzgummer et al., "Electron multibeam technology for mask and wafer writing at 0.1 nm address grid", Journal of Micro/Nanolithography, MEMS, and MOEMS, 2013, 9 pages, SPIE.
Chuang et al., "Effects of Electric Fields on the Switching Properties Improvements of RRAM Device With a Field-Enhanced Elevated-Film-Stack Structure", Journal of the Electron Devices Society, 2018, pp. 622-626, vol. 6, IEEE.

(Continued)

*Primary Examiner* — Allison Bernstein
(74) *Attorney, Agent, or Firm* — Viering Jentschura & Partner MBB

(57) ABSTRACT

A memory device may be provided, including a base insulating layer, a bottom electrode arranged within the base insulating layer, a substantially planar switching layer arranged over the base insulating layer and a substantially planar top electrode arranged over the switching layer in a laterally offset position relative to the bottom electrode.

20 Claims, 49 Drawing Sheets

(56) References Cited

OTHER PUBLICATIONS

Niu et al., "Geometric conductive filament confinement by nanotips for resistive switching of HfO2-RRAM devices with high performance", Scientific Reports, 2016, pp. 1-9, Springer Nature.
Feng et al., "Investigation of switching mechanism in HfOx-ReRAM under low power and conventional operation modes", Scientific Reports, 2016, pp. 1-8, Springer Nature.
Mehr et al., "Ultra Sharp Crystalline Silicon Tip Array Used as Field Emitter", Microelectronic Engineering, 1996, pp. 395-398, vol. 30, Elsevier Science B.V.
Wei et al., "Highly Reliable TaOx ReRAM and Direct Evidence of Redox Reaction Mechanism", IEEE International Electron Devices Meeting, 2009, 4 pages, IEEE.
Chen et al., "Variability of Resistive Switching Memories and Its Impact on Crossbar Array Performance", Internationa Reliability Physics Symposium, 2011, 4 pages, IEEE.
Nakayama, "ReRAM technologies: Applications and outlook", 2017 IEEE International Memory Workshop (IMW), 2017, 4 pages, IEEE.
Tkachev, "Field-Induced Generation of Electron Traps in the Tunnel Oxide of Flash Memory Cells", 2015 IEEE International Integrated Reliability Workshop (IIRW), 2015, pp. 99-102, IEEE.
Loy et al., "Nearest Neighbor Hopping in High Retention MgO-based Resistive Switching Devices in the High Resistance State", Abstract submitted to MRS (Materials Research Society) Spring Meeting & Exhibit, Apr. 22-26, 2019.
Non-final Office Action received for U.S. Appl. No. 16/513,745, dated Dec. 10, 2020, 25 pages (Reference Purpose Only).
Non-Final Office Action received for U.S. Appl. No. 16/744,223, dated Apr. 13, 2022, 22 pages (Reference Purpose Only).

\* cited by examiner

MEMORY DEVICES AND METHODS OF FORMING MEMORY DEVICES

TECHNICAL FIELD

The present disclosure relates generally to memory devices and methods of forming the memory devices.

BACKGROUND

Non-volatile memory devices are often used in consumer electronic products such as smart phones and tablets. One type of non-volatile memory device is the resistive random access memory device (RRAM). A RRAM typically uses a switching layer such as a dielectric layer sandwiched between a top electrode and a bottom electrode. The switching layer is normally insulating. However, upon application of a sufficiently high potential difference between the top and bottom electrodes, a dielectric breakdown event can occur and conducting filaments may be formed within the switching layer between the top and bottom electrodes. The switching layer thus becomes conductive via the conducting filaments. The switching layer can be made insulating again by applying a sufficiently low voltage difference to the top and bottom electrodes to break the conducting filaments. A typical RRAM can switch between states based on the resistance of the switching layer. When the switching layer is insulating, the switching layer has a high resistance, and the RRAM may be referred to as being in a high resistance state (HRS). When the switching layer is conductive, the switching layer has a low resistance and the RRAM may be referred to as being in a low resistance state (LRS). To set the RRAM, the RRAM is switched from the HRS to the LRS. To reset the RRAM, the RRAM is switched from the LRS to the HRS.

Conducting filaments are often formed at random across many locations within the switching layer. Such uncontrolled distribution of the conducting filaments can cause the resistance of the switching layer (and hence, the RRAM) to vary greatly across multiple dielectric breakdown events. For example, the resistance of the switching layer when the RRAM is in the HRS tends to vary greatly over different cycles. This can lead to high device-to-device variability and cycle-to-cycle variability.

Accordingly, it is desirable to provide an improved memory device having reduced variability in its resistance.

SUMMARY

According to various non-limiting embodiments, there may be provided a memory device including a base insulating layer, a bottom electrode arranged within the base insulating layer, a substantially planar switching layer arranged over the base insulating layer and a substantially planar top electrode arranged over the switching layer in a laterally offset position relative to the bottom electrode.

According to various non-limiting embodiments, there may be provided a memory device including a base insulating layer, a bottom electrode arranged within the base insulating layer, a substantially planar switching layer arranged over the base insulating layer and a substantially planar top electrode arranged over the switching layer in a laterally offset position relative to the bottom electrode. A bottom edge between a bottom surface and a side surface of the top electrode, and a top edge between a top surface and a side surface of the bottom electrode may be spaced apart by a distance at least equal to a thickness of the switching layer.

According to various non-limiting embodiments, there may be provided a method of fabricating a memory device. The method may include providing a base insulating layer, forming a bottom electrode within the base insulating layer, forming a substantially planar switching layer over the base insulating layer and forming a substantially planar top electrode over the switching layer in a laterally offset position relative to the bottom electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
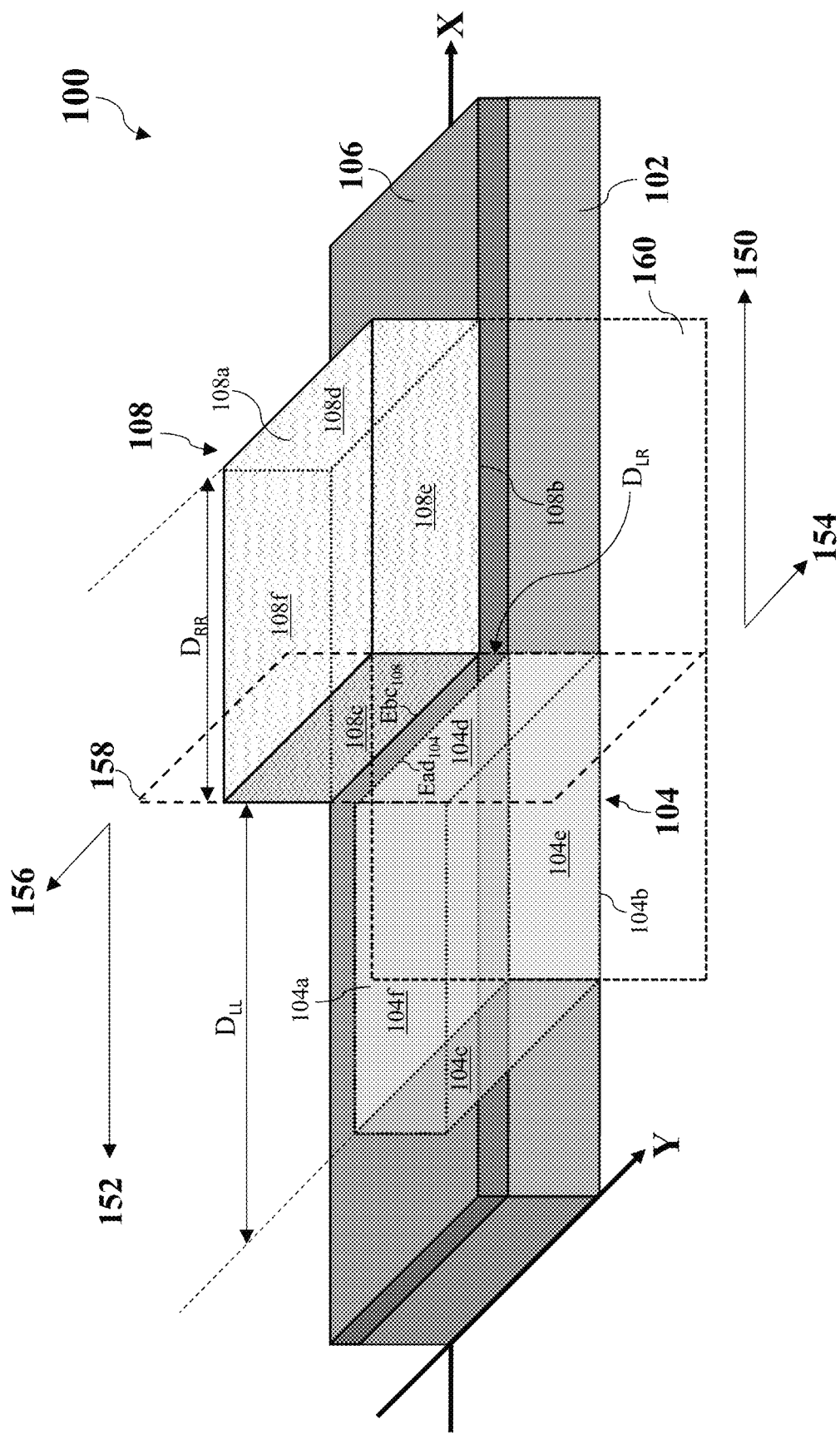
FIGS. 1A, 1B and 1C respectively show a simplified perspective view, a simplified top view and a simplified cross-sectional view of a memory device according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
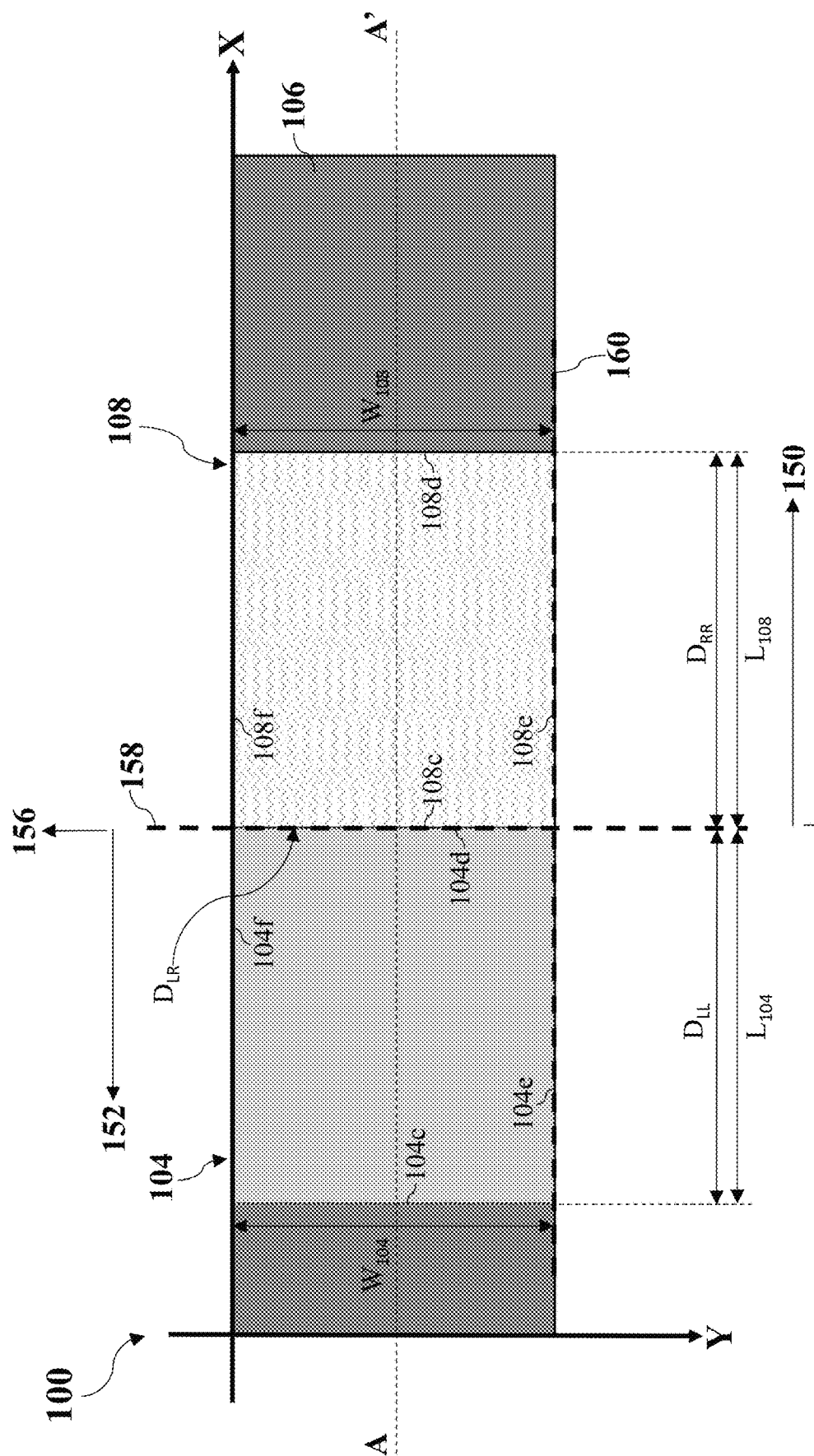
Figure 1C:
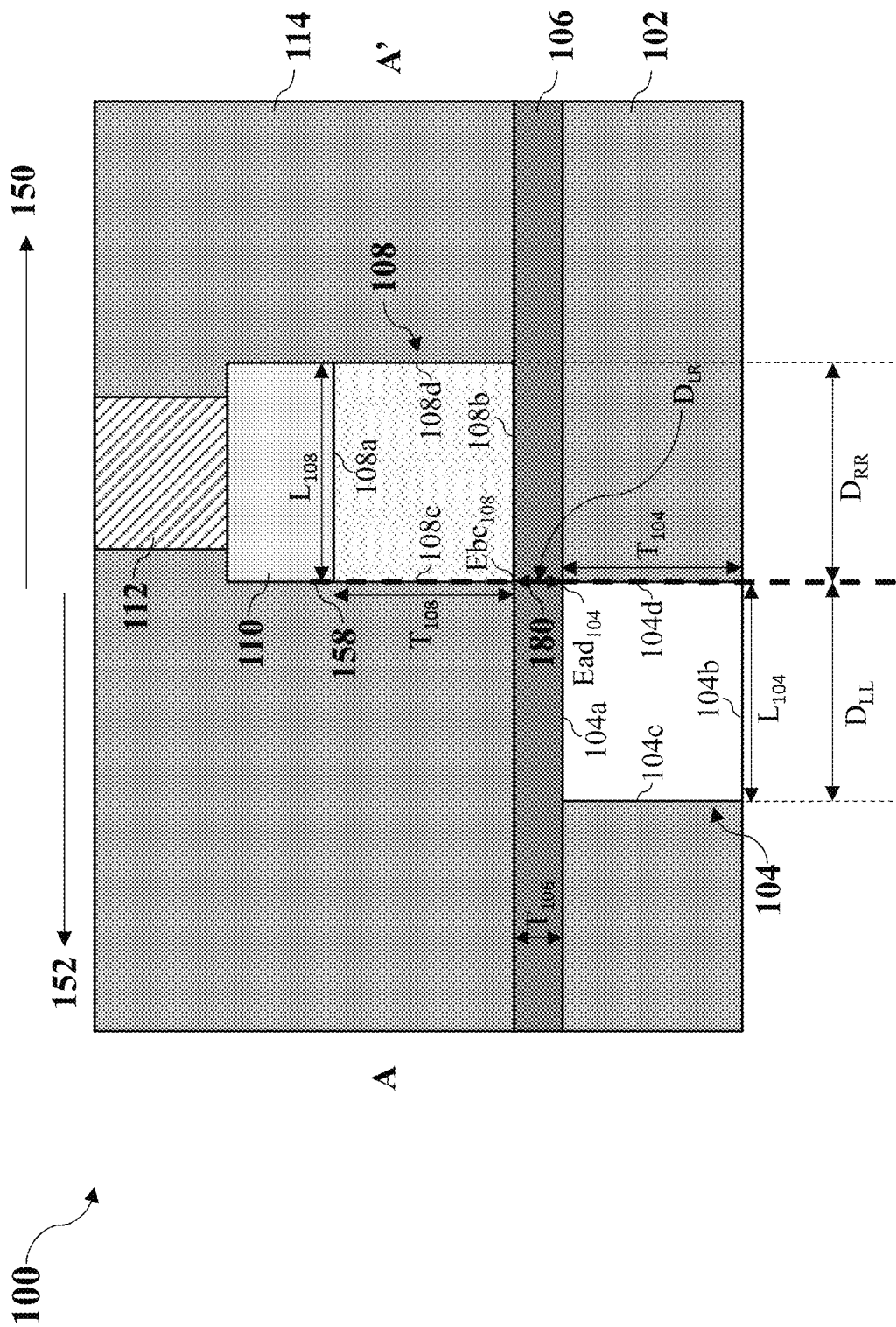

FIG. 1A shows a simplified perspective view of a memory device 100 according to various non-limiting embodiments. FIG. 1B shows a simplified top view of the memory device 100 and FIG. 1C shows a cross-sectional view of the memory device 100 along the line A-A' of FIG. 1B. The memory device 100 may be a RRAM device.

As shown in FIG. 1A, the memory device 100 may include a base insulating layer 102. The base insulating layer 102 may extend along a horizontal plane defined by an X-axis and a Y-axis. The base insulating layer 102 may be an inter-layer dielectric (ILD) layer and may include insulating material, such as, but not limited to, silicon oxide, silicon dioxide, silicon nitride, or combinations thereof.

The memory device 100 may further include a bottom electrode 104 arranged within the base insulating layer 102. As shown in FIGS. 1A to 1C, the bottom electrode 104 may be a cuboid with six surfaces including a top surface 104a, a bottom surface 104b, side surfaces (including a left surface 104c and a right surface 104d), a front surface 104e and a back surface 104f. The left and right surfaces 104c, 104d of the bottom electrode 104 may be substantially parallel to the Y-axis and substantially perpendicular to the X-axis. The front surface 104e may adjoin the side (left and right) surfaces 104c, 104d. The bottom electrode 104 may include inert electrode material, such as, but not limited to, ruthenium (Ru), platinum (Pt), titanium nitride (TiN), tantalum nitride (TaN), alloys thereof or combinations thereof. A thickness $T_{104}$ of the bottom electrode 104 may range from about 3 nm to about 15 nm, and in a non-limiting embodiment, may range from about 5 nm to about 10 nm. A width $W_{104}$ and a length $L_{104}$ of the bottom electrode 104 may be approximately the same, and may range from about 20 nm to about 100 nm, and may be about 30 nm in a non-limiting embodiment.

The memory device 100 may also include a substantially planar switching layer 106 arranged over the base insulating layer 102. The switching layer 106 may include switching material, such as, but not limited to, magnesium oxide (MgO), tantalum oxide (TaO$_2$), hafnium oxide (HfO$_2$), titanium oxide (TiO$_2$), aluminum oxide (AlO$_2$), silicon dioxide (SiO$_2$) or combinations thereof. A thickness $T_{106}$ of the switching layer 106 may range from about 1 nm to about 15 nm, and in a non-limiting embodiment, may range from about 2 nm to about 10 nm.

In addition, the memory device 100 may include a substantially planar top electrode 108 arranged over the switching layer 106. In FIGS. 1A to 1C, the switching layer 106 is depicted as extending under the top electrode 108 and over the bottom electrode 104. However, the switching layer 106 may alternatively extend under only the top electrode 108 and not over the bottom electrode 104. For example, an additional insulating layer (e.g. a dielectric layer) may be provided over the base insulating layer 102 and the switching layer 106 may be arranged within this additional insulating layer under only the top electrode 108.

The top electrode 108 may also be a cuboid with six surfaces including a top surface 108a, a bottom surface 108b, side surfaces (including a left surface 108c and a right surface 108d), a front surface 108e and a back surface 108f. The left and right surfaces 108c, 108d of the top electrode 108 may be substantially parallel to the Y-axis and substantially perpendicular to the X-axis. The front surface 108e may adjoin the side (left and right) surfaces 108c, 108d. The top electrode 108 may include active electrode material such as, but not limited to, tantalum (Ta), hafnium (Hf), titanium (Ti), copper (Cu), silver (Ag), cobalt (Co), tungsten (W), alloys thereof or combinations thereof. A thickness $T_{108}$ of the top electrode 108 may range from about 3 nm to about 35 nm, and in a non-limiting embodiment, may range from about 5 nm to about 30 nm. Further, a width $W_{108}$ and a length $L_{108}$ of the top electrode 108 may be approximately the same, and may range from about 20 nm to about 100 nm, and may be about 30 nm in a non-limiting embodiment. The width $W_{108}$ and length $L_{108}$ of the top electrode 108 may be approximately equal to the width $W_{104}$ and length $L_{104}$ of the bottom electrode 104 respectively. In other words, the sizes of the top and bottom electrodes 108, 104 may be the same. However, the sizes of the top and bottom electrodes 108, 104 may alternatively be different.

As shown in FIGS. 1A to 1C, the right surface 104d of the bottom electrode 104 may face a first direction 150 and the left surface 108c of the top electrode 108 may face a second direction 152 opposite the first direction 150. The bottom surface 108b of the top electrode 108 may face the base insulating layer 102 and the top surface 104a of the bottom electrode 104 may face an opposite direction from the bottom surface 108b of the top electrode 108. Further, the front surfaces 104e, 108e of the bottom and top electrodes 104, 108 may face a same (third) direction 154, and the back surfaces 104f, 108f may face a same (fourth) direction 156.

The top electrode 108 may be in a laterally offset position relative to the bottom electrode 104. "Laterally offset" is defined herein to mean that at most a part of the bottom surface 108b of the top electrode 108 may overlap with the top surface 104a of the bottom electrode 104, and at most a part of the top surface 104a of the bottom electrode 104 may overlap with the bottom surface 108b of the top electrode 108. For instance, as shown in FIGS. 1A to 1C, the top and bottom electrodes 108, 104 may be laterally offset with respect to each other along the X-axis. In particular, the top electrode 108 may extend in the first direction 150 away from the right surface 104d of the bottom electrode 104, and the bottom electrode 104 may extend in the second direction 152 away from the left surface 108c of the top electrode 108. Said differently, "laterally offset" includes embodiments where a first specified surface partially overlaps with a second specified surface, or where such first specified surface does not overlap with the second specified surface and/or where a space is arranged between the first specified surface and the second specified surface. For example, here where at most a part of the bottom surface 108b of the top electrode 108 may overlap with the top surface 104a of the bottom electrode 104 includes where the bottom surface 108b only partially overlaps with the top surface 104a or where the bottom surface 108b does not overlap with the top surface 104a. Similarly, here where at most a part of the top surface 104a of the bottom electrode 104 may overlap with the bottom surface 108b of the top electrode 108 includes where the top surface 104a only partially overlaps with the bottom surface 108b or where the top surface 104a does not overlap with the bottom surface 108b. "Laterally offset" further means that the two electrodes 104, 108 are not arranged in the same vertical plane.

Referring to FIG. 1A, the top electrode 108 may include a bottom edge $Ebc_{108}$; whereas, the bottom electrode 104 may include a top edge $Ead_{104}$. In this document, an edge $Exy_I$ refers to an edge adjoining the surface Ix and the surface Iy of the electrode I. For example, the edge $Ebc_{108}$ adjoins the bottom surface 108b and the side (left) surface 108c of the top electrode 108; whereas, the edge $Ead_{104}$ adjoins the top surface 104a and the side (right) surface 104d of the bottom electrode 104. As further shown in FIG. 1A, the bottom edge $Ebc_{108}$ of the top electrode 108 and the top edge $Ead_{104}$ of the bottom electrode 104 may at least partially extend along a same first vertical plane 158. In this document, by "vertical", it is meant that the plane or axis may be substantially perpendicular to the base insulating layer 102 and the switching layer 106. Accordingly, the top surface 104a of the bottom electrode 104 and the bottom surface 108b of the top electrode 108 may overlap each other at only the edges $Ebc_{108}$, $Ead_{104}$. A distance $D_{LR}$ parallel to the X-axis between the opposite facing surfaces 104d, 108c may be smaller than a distance $D_{LL}$ parallel to the X-axis between the left surfaces 104c, 108c and a distance $D_{RR}$ parallel to the X-axis between the right surfaces 104d, 108d. In particular, the distance $D_{LR}$ may be approximately 0 nm; whereas the distances $D_{LL}$, $D_{RR}$ may be approximately equal to the length $L_{104}$ of the bottom electrode 104 and the length $L_{108}$ of the top electrode 108, respectively.

Further, as shown in FIGS. 1A to 1C, the top and bottom electrodes 108, 104 may be laterally aligned along the Y-axis. In particular, the front surface 108e of the top electrode 108 and the front surface 104e of the bottom electrode 104 may at least partially extend along a same second vertical plane 160. The second vertical plane 160 may be substantially perpendicular to the first vertical plane 158.

Referring to FIG. 1C, a conductive line 112 may be arranged over the top electrode 108. The conductive line 112 may serve as a bit line and may include conductive material, such as, but not limited to, aluminum, copper, tungsten, alloys thereof, or combinations thereof. A connector 110 may be arranged between the conductive line 112 and the top electrode 108 to electrically connect the conductive line 112 with the top electrode 108. The connector 110 may similarly include conductive material, such as, but not limited to, aluminum, copper, tungsten, alloys thereof, or combinations thereof.

As shown in FIG. 1C, the memory device 100 may in addition include a further insulating layer 114. The top electrode 108, the connector 110 and the conductive line 112 may be arranged within the further insulating layer 114. The further insulating layer 114 may include insulating material, such as, but not limited to silicon oxide, silicon dioxide, silicon nitride or combinations thereof.

Note that for clarity of illustration, the further insulating layer 114, the connector 110 and the conductive line 112 are not shown in FIGS. 1A and 1B and some reference numerals are omitted from FIG. 1A.

Referring to FIG. 1C, the top electrode 108 may be arranged relative to the bottom electrode 104 to allow formation of conducting filaments 180 between the top electrode 108 and the bottom electrode 104. In particular, when a sufficiently large potential difference is applied between the top and bottom electrodes 104, 108 of the memory device 100, conducting filaments 180 may be formed between these electrodes 104, 108. The conducting filaments 180 may be confined between the bottom edge $Ebc_{108}$ of the top electrode 108 and the top edge $Ead_{104}$ of the bottom electrode 104, as the electric fields at these edges $Ead_{104}$, $Ebc_{108}$ may be higher than that at other parts of the memory device 100.

Figure 2:
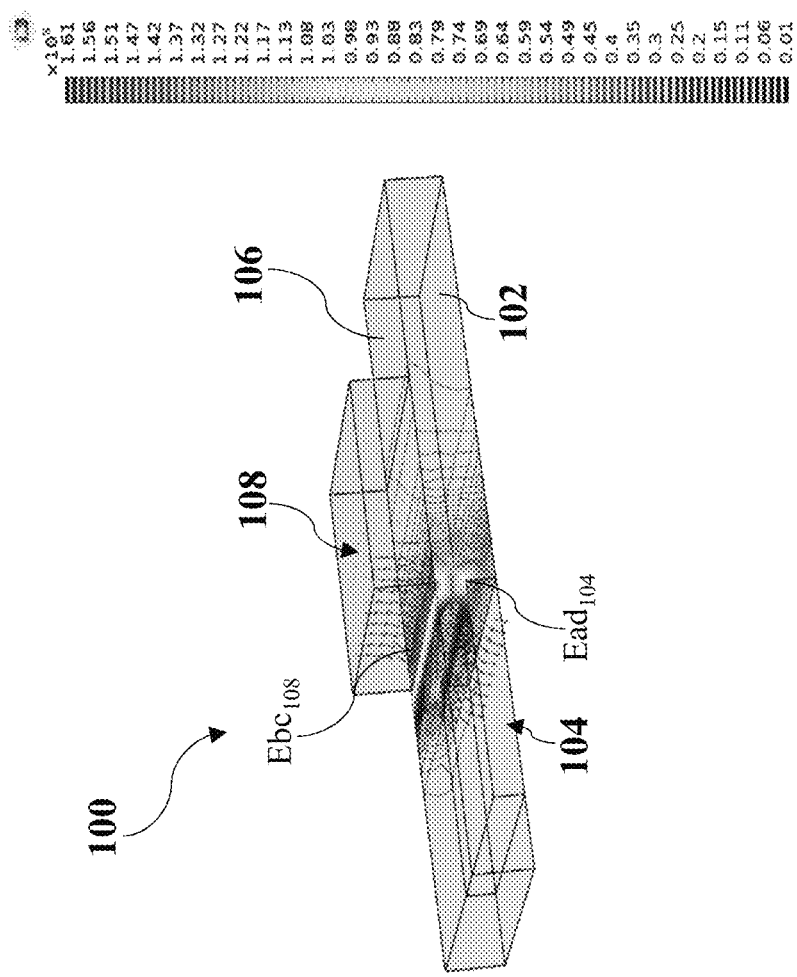
FIG. 2 shows simulated electric fields in the memory device of FIGS. 1A to 1C.

FIG. 2 shows simulated electric fields formed in the memory device 100 when a sufficiently large potential difference is applied between the top and bottom electrodes 104, 108. For clarity of illustration, some reference numerals have been omitted from FIG. 2. As shown in FIG. 2, the simulated electric field strengths at the top edge $Ead_{104}$ of the bottom electrode 104 and at the bottom edge $Ebc_{108}$ of the top electrode 108 are higher than that at other parts of the memory device 100. In particular, the simulated electric field strength at the edge $Ead_{104}$ is approximately $2.83 \times 10^8$ V/m and the simulated electric field strength at the edge $Ebc_{108}$ is approximately $5.99 \times 10^8$ V/m. Accordingly, conducting filaments (e.g. conducting filaments 180 in FIG. 1C) may be confined between the edges $Ead_{104}$, $Ebc_{108}$ where the strengths of the electric fields are the highest.

FIGS. 3A to 3D show simplified cross-sectional views that illustrate a method for fabricating a plurality of the memory devices 100 according to various non-limiting embodiments. Similarly, for clarity of illustration, some reference numerals are omitted from FIGS. 3A to 3D.

Figure 3A:
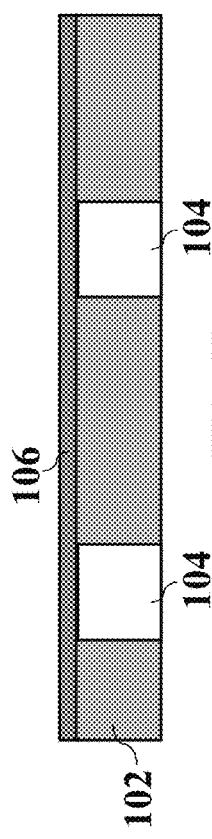
FIGS. 3A to 3D show simplified cross-sectional views that illustrate a method for fabricating a plurality of the memory devices of FIGS. 1A to 1C according to various non-limiting embodiments.

Referring to FIG. 3A, the method may include forming the base insulating layer 102 and the bottom electrodes 104 within the base insulating layer 102. The bottom electrodes 104 may be formed by first depositing inert electrode material over a surface above which the memory device 100 is to be formed, and then selectively etching the inert electrode material using for example, a photoresist mask. The base insulating layer 102 may be formed by depositing insulating material over and between the bottom electrodes 104, and planarizing the insulating material using, for example, a chemical mechanical planarization (CMP) process.

Figure 3B:
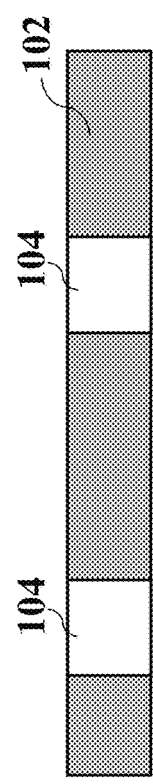

Referring to FIG. 3B, the method may further include forming the switching layer 106 above the base insulating layer 102. The switching layer 106 may be formed by depositing switching material over the base insulating layer 102 and the bottom electrodes 104.

Figure 3C:
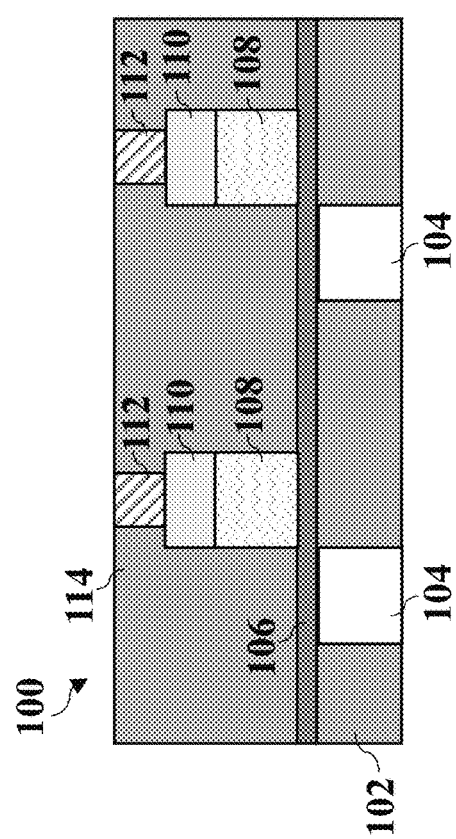

Referring to FIG. 3C, the method may further include forming the top electrodes 108 above the switching layer 106, and forming the connectors 110 over the respective top electrodes 108. The top electrodes 108 and the connectors 110 may be formed by depositing active electrode material over the switching layer 106 and conductive material over the active electrode material, and then selectively etching the active electrode material and the conductive material using for example, an etch down process.

Figure 3D:
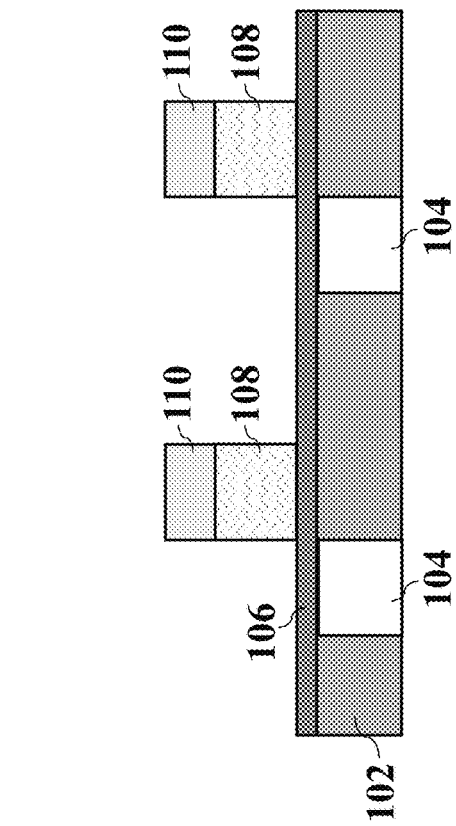

Referring to FIG. 3D, the method may further include forming the conductive lines 112 over the respective connectors 110 and forming the further insulating layer 114. A first part of the further insulating layer 114 may be formed by depositing first insulating material over the top electrodes 108, the connectors 110 and the switching layer 106, and then planarizing the first insulating material (using for example, a CMP process), so that the top surface of the first insulating material may be level with the top surfaces of the connectors 110. The conductive lines 112 may then be formed over the connectors 110 using any process as known to those skilled in the art. For example, the conductive lines 112 may be formed by depositing conductive material over the connectors 110 and the first insulating material, and selectively etching the conductive material. A second part of the further insulating layer 114 may then be formed by depositing second insulating material over the conductive lines 112 and the first insulating material, and planarizing the second insulating material (using, for example, a CMP process), so that the top surface of the second insulating material may be level with the top surfaces of the conductive lines 112.

The above described order for the method is only intended to be illustrative, and the method is not limited to the above specifically described order unless otherwise specifically stated.

Figure 4A:
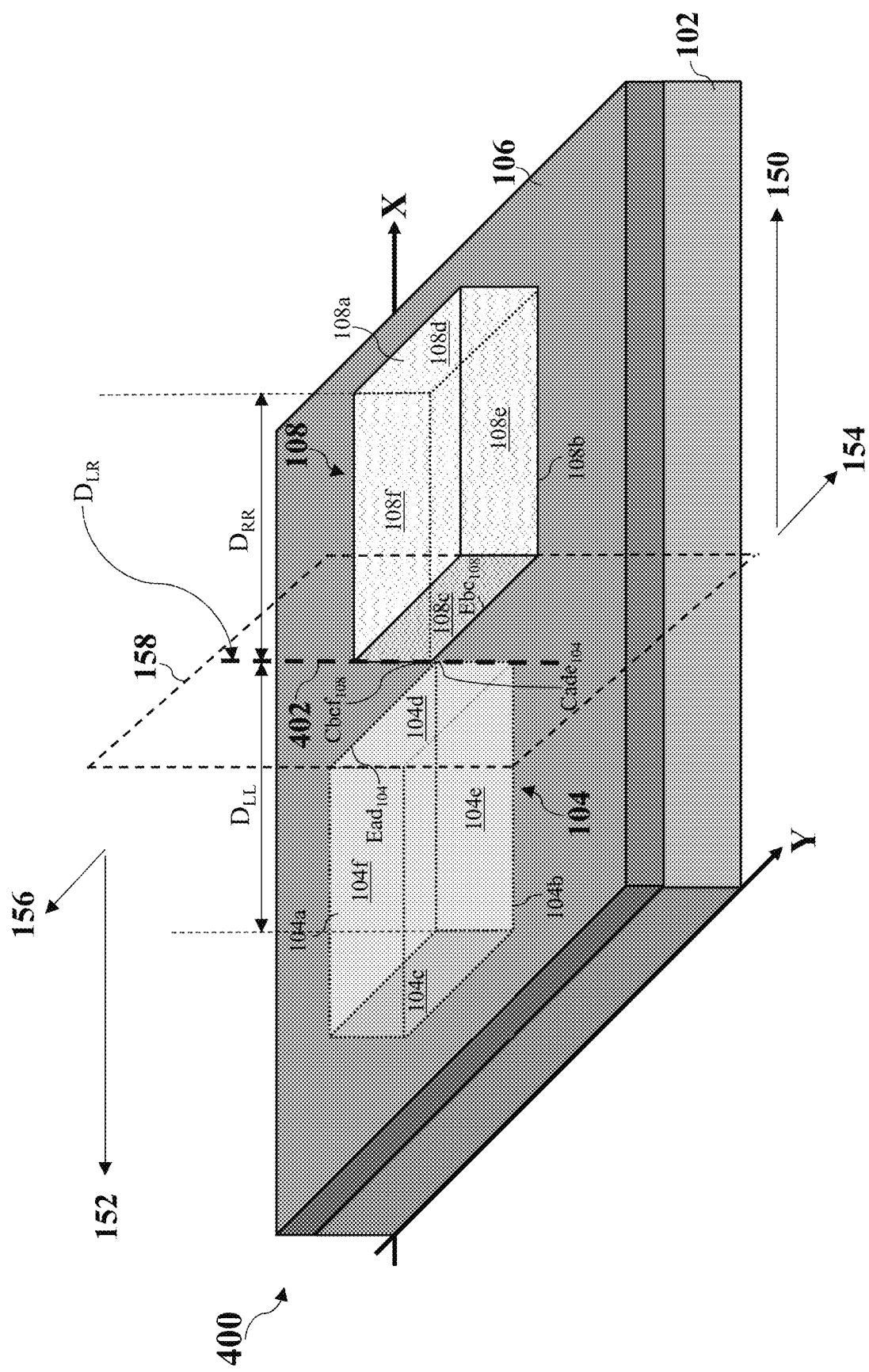
FIGS. 4A and 4B respectively show a simplified perspective view and a simplified top view of a memory device according to alternative non-limiting embodiments.
Figure 4B:
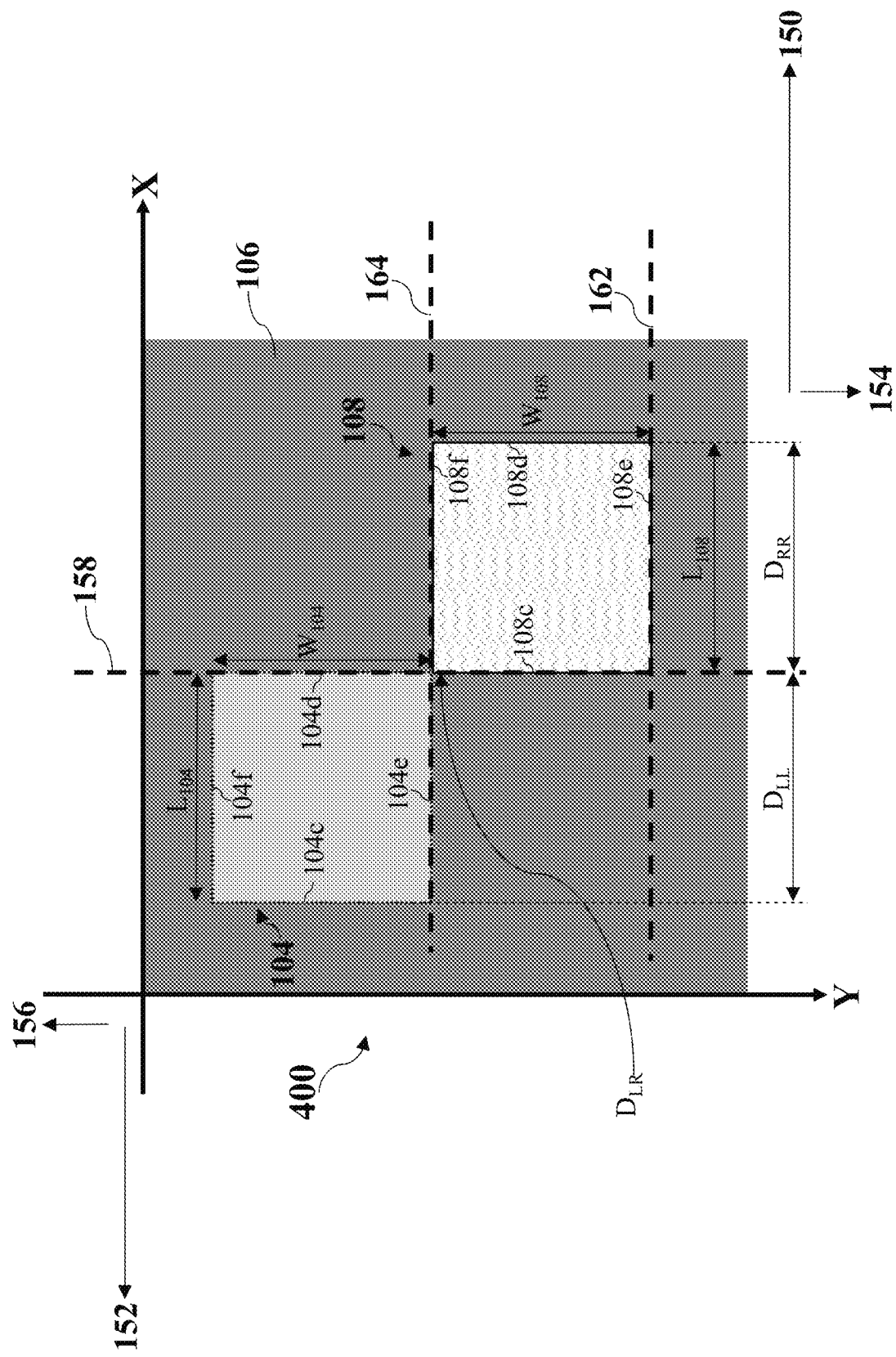

FIG. 4A shows a simplified perspective view of a memory device 400 according to alternative non-limiting embodiments. FIG. 4B shows a simplified top view of the memory device 400. The memory device 400 is similar to the memory device 100, and thus, the common features are labelled with the same reference numerals and need not be discussed.

Similar to the memory device 100, in the memory device 400, the bottom edge $Ebc_{108}$ of the top electrode and the top edge $Ead_{104}$ of the bottom electrode 104 may at least partially extend along a same first vertical plane 158. However, the top and bottom electrodes 108, 104 of the memory device 400 may be laterally offset from each other along both the X-axis and the Y-axis. In other words, referring to FIG. 4B, the front surface 108e of the top electrode 108 and the front surface 104e of the bottom electrode 104 may at least partially extend along different second and third vertical planes 162, 164 respectively. These second and third vertical planes 162, 164 may be substantially parallel to each other and substantially perpendicular to the first vertical plane 158. In addition, the second and third vertical planes 162, 164 may be laterally spaced apart from each other. For clarity of illustration, these vertical planes 162, 164 are not shown in FIG. 4A.

Further, referring to FIG. 4A, in the memory device 400, a corner $Cade_{104}$ of the bottom electrode 104 may be vertically aligned with a corner $Cbcf_{108}$ of the top electrode 108 along a vertical axis 402. In this document, a corner $Cxyz_I$ refers to a corner adjoining the surfaces Ix, Iy and Iz of the electrode I. For example, the corner $Cade_{104}$ adjoins the front surface 104e with two other surfaces (the right surface 104d and the top surface 104a) of the bottom electrode 104; whereas, the corner $Cbcf_{108}$ adjoins the back surface 108f with two other surfaces (the bottom surface 108b and the left surface 108c) of the top electrode 108. The top electrode 108 and the bottom electrode 104 may extend substantially parallel to the vertical plane 158 away from the vertical axis 402 in opposite directions 154, 156, with the top electrode 108 extending in the third direction 154 and the bottom electrode 104 extending in the fourth direction 156.

Figure 5:
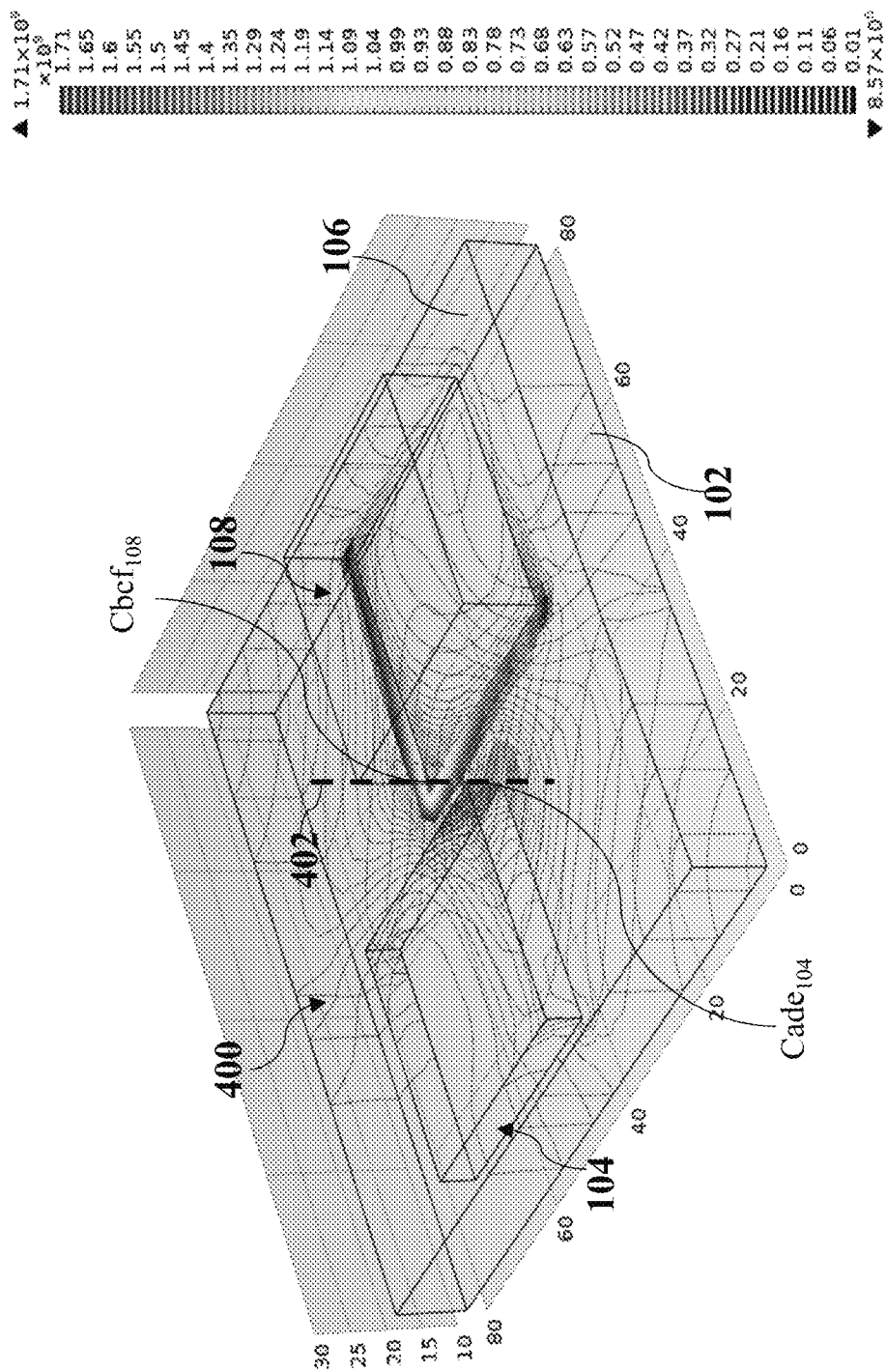
FIG. 5 shows simulated electric fields in the memory device of FIGS. 4A and 4B.

FIG. 5 shows simulated electric fields formed in the memory device 400 when a sufficiently large potential difference is applied between the top and bottom electrodes 104, 108. For clarity of illustration, some reference numerals are omitted in FIG. 5. As shown in FIG. 5, the simulated electric field strength along the vertical axis 402, and between the corner $Cade_{104}$ of the bottom electrode 104 and the corner $Cbcf_{108}$ of the top electrode 108 is higher than the simulated electric field strengths at other parts of the memory device 400. In particular, the simulated electric field strength at the corner $Cade_{104}$ of the bottom electrode 104 is approximately $2.52 \times 10^8$ V/m and the simulated electric field strength at the corner $Cbcf_{108}$ of the top electrode 108 is approximately $3.77 \times 10^8$ V/m. Therefore, conducting filaments may be formed and confined between these corners $Cade_{104}$, $Cbcf_{108}$ where the electric fields have the highest strengths.

In the memory devices 100, 400, the bottom edge $Ebc_{108}$ of the top electrode 108 and the top edge $Ead_{104}$ of the bottom electrode 104 may at least partially extend along a same vertical plane 158. However, in alternative non-limiting embodiments, the bottom edge $Ebc_{108}$ of the top electrode 108 and the top edge $Ead_{104}$ of the bottom electrode 104 may at least partially extend along different vertical planes laterally offset from each other. For example, the bottom surface 108b of the top electrode 108 may partially overlap with the top surface 104a of the bottom electrode 104, or the entire bottom surface 108b of the top electrode 108 and the entire top surface 104a of the bottom electrode 104 may be laterally spaced apart.

Figure 6A:
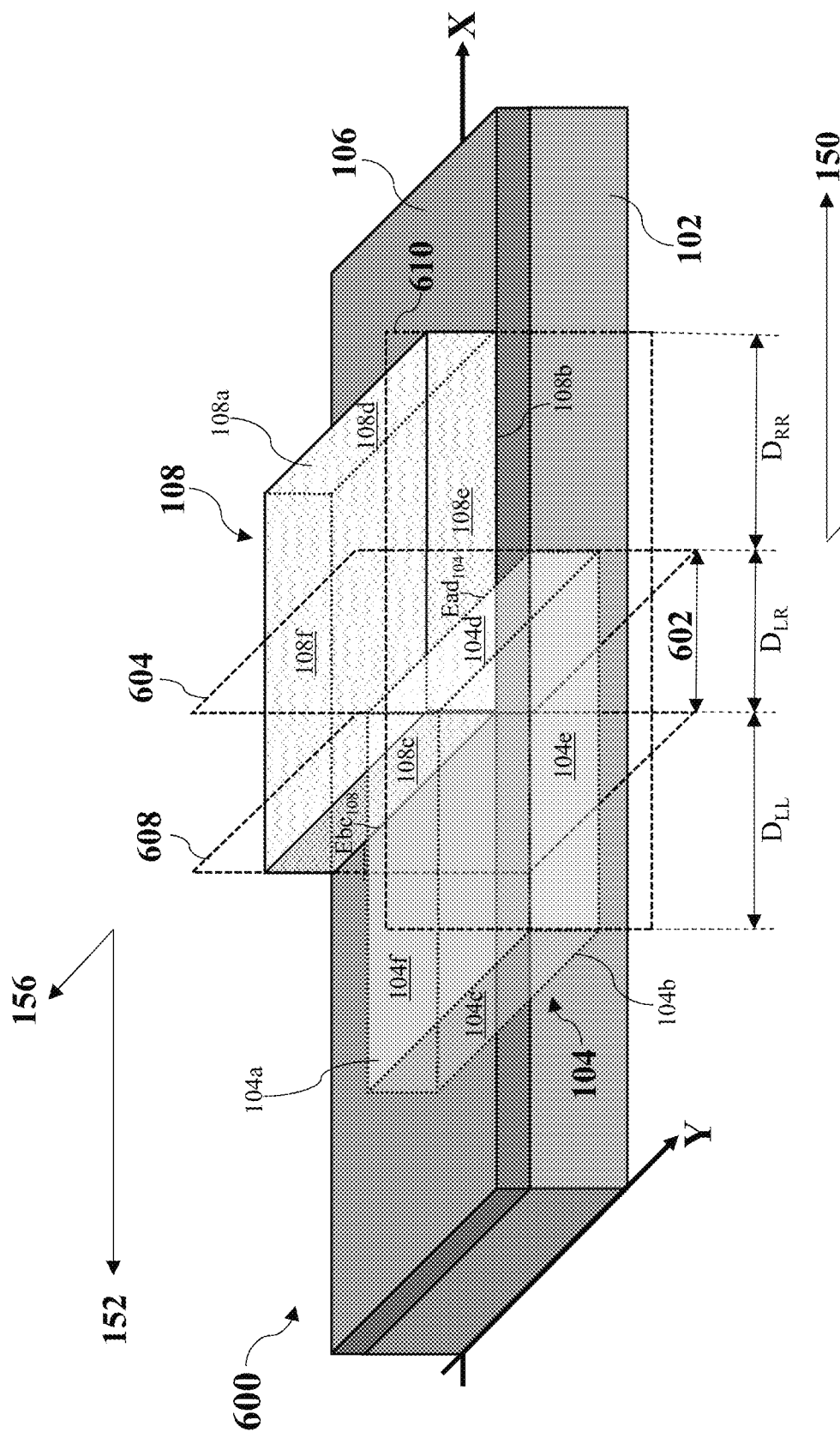
FIGS. 6A, 6B and 6C respectively show a simplified perspective view, a simplified top view and a simplified cross-sectional view of a memory device according to alternative non-limiting embodiments.
Figure 6B:
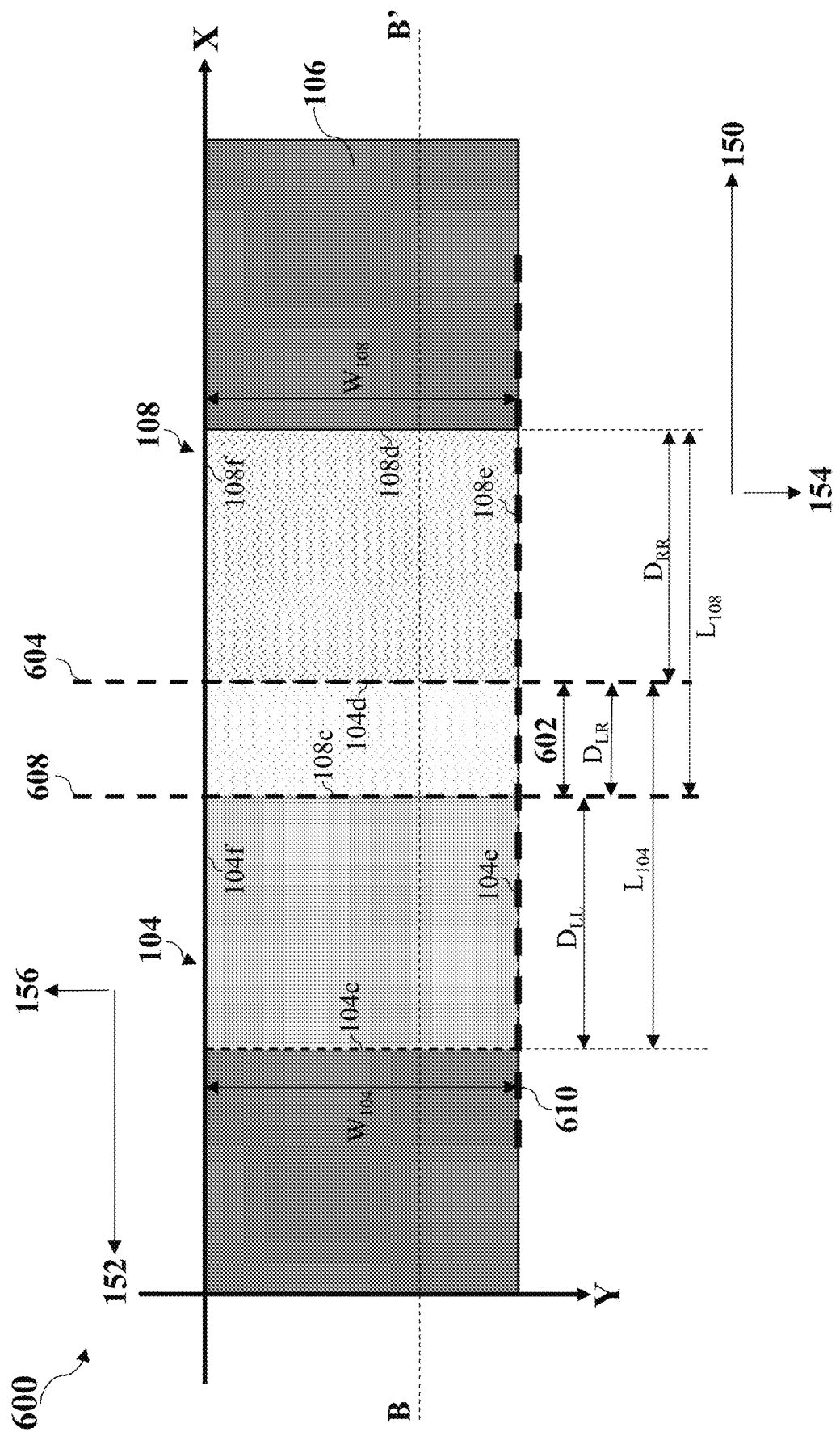
Figure 6C:
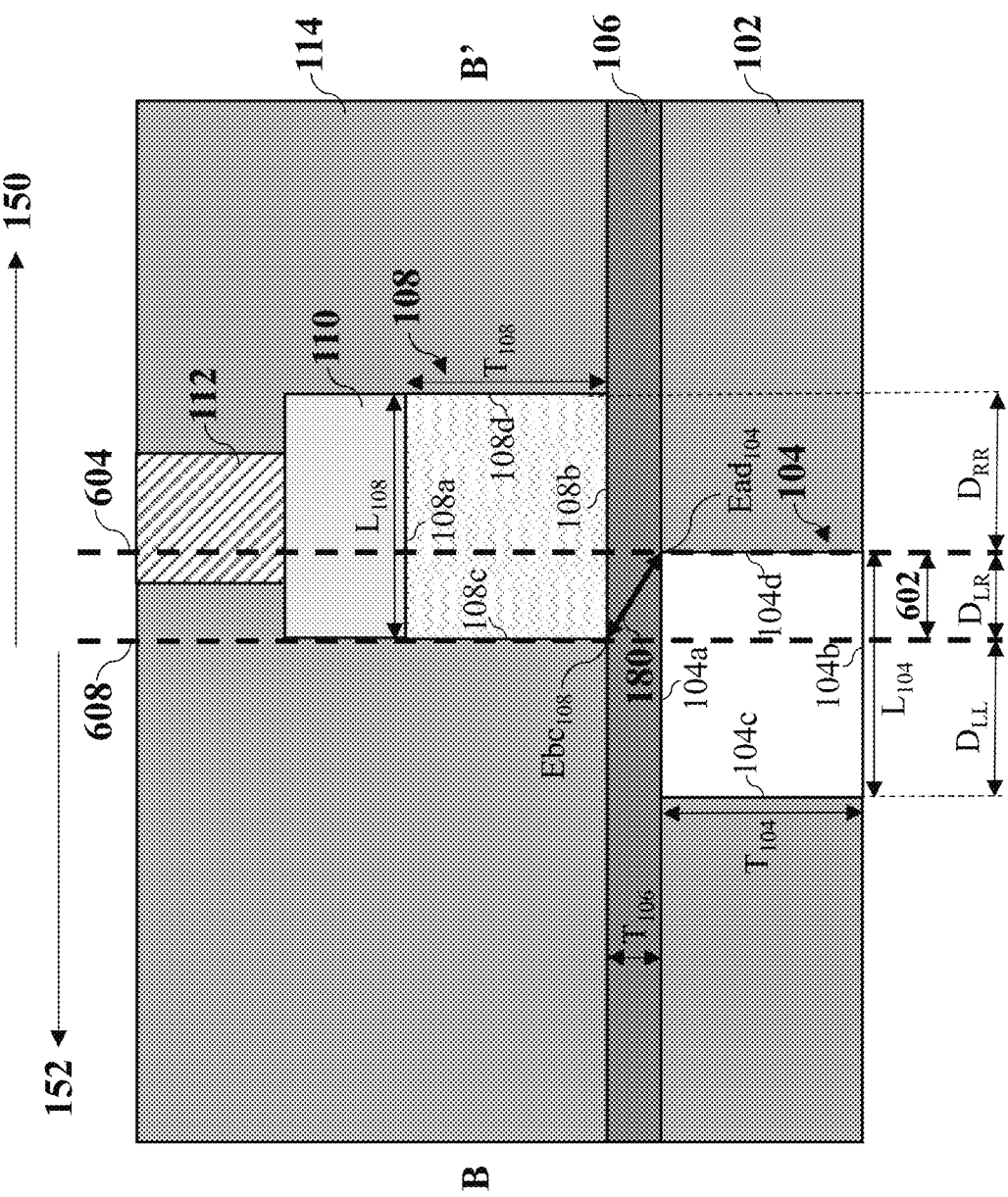

FIG. 6A shows a simplified perspective view of a memory device 600 according to alternative non-limiting embodiments. FIG. 6B shows a simplified top view of the memory device 600 and FIG. 6C shows a simplified cross-sectional view of the memory device 600 along the line B-B' of FIG. 6B. The memory device 600 is similar to the memory device 100, and thus, the common features are labelled with the same reference numerals and need not be discussed.

As shown in FIGS. 6A to 6C, in the memory device 600, the top edge $Ead_{104}$ of the bottom electrode 104 and the bottom edge $Ebc_{108}$ of the top electrode 108 may at least partially extend along different first and second vertical planes 604, 608, respectively. The vertical planes 604, 608 may be substantially parallel to and laterally spaced apart from each other. In particular, the bottom surface 108b of the top electrode 108 may partially overlap with the top surface 104a of the bottom electrode 104 by an overlap distance 602 parallel to the X-axis. The overlap distance 602 may be less than or equal to 50 nm, and may be less than or equal to 30 nm in some non-limiting embodiments. For example, the overlap distance 602 may be about 10 nm, about 20 nm, or about 30 nm in a first, a second and a third non-limiting embodiment. A distance $D_{LR}$ parallel to the X-axis between the left surface 108c of the top electrode 108 and the right surface 104d of the bottom electrode 104 may be equal to the overlap distance 602, and may be smaller than a distance $D_{LL}$ between the left surfaces 108c, 104c of the electrodes 108, 104 and a distance $D_{RR}$ between the right surfaces 108d, 104d of the electrodes 108, 104.

As shown in FIGS. 6A and 6B, the top and bottom electrodes 108, 104 may be laterally offset with respect to each other along the X-axis but laterally aligned along the Y-axis. Accordingly, the front surface 104e of the bottom electrode 104 and the front surface 108e of the top electrode 108 may at least partially extend along a same third vertical plane 610. The third vertical plane 610 may be substantially perpendicular to the first and second vertical planes 604, 608.

Referring to FIG. 6C, when a sufficiently large potential difference is applied between the top and bottom electrodes 104, 108, conducting filaments 180 may be formed between the top and bottom electrodes 104, 108. The conducting filaments 180 may be confined between the top edge $Ead_{104}$ of the bottom electrode 104 and the bottom edge $Ebc_{108}$ of the top electrode 108, as the electric fields at these edges $Ead_{104}$, $Ebc_{108}$ may be higher than that at other parts of the memory device 600.

The minimum electric field strength required to form conducting filaments 180 between the top and bottom electrodes 104, 108 in the memory device 600 may be determined using the following Equation (1).

$$\text{Minimum electric field} = \frac{\text{Potential difference between the top and bottom electrodes}}{\text{Distance between the top edge } Ead_{104} \text{ of the bottom electrode and the bottom edge } Ebc_{108} \text{ of the top electrode}} \quad (1)$$

The distance between the top edge $Ead_{104}$ of the bottom electrode 104 and the bottom edge $Ebc_{108}$ of the top electrode 108 may be determined using Equation (2) as follows, where the horizontal distance between the electrodes 104, 108 may be the distance $D_{LR}$ parallel to the X-axis between the left surface 108c of the top electrode 108 and the right surface 104d of the bottom electrode 104. As shown by Equation (2), the edges $Ead_{104}$, $Ebc_{108}$ may be spaced apart by a distance at least equal to a thickness $T_{106}$ of the switching layer.

Distance between the top edge $Ead_{104}$ of the bottom electrode (2)
and the bottom edge $Ebc_{108}$ of the top electrode =

$$\sqrt{\text{(Thickness } T_{106} \text{ of the switching layer)}^2 + \text{(Horizontal distance between the electrodes)}^2}$$

The lengths of the conducting filaments 180 formed between the top and bottom electrodes 104, 108 may be approximately equal to the distance between the edges $Ead_{104}$, $Ebc_{108}$ determined using Equation (2).

Figures 7A, 7B, 7C:
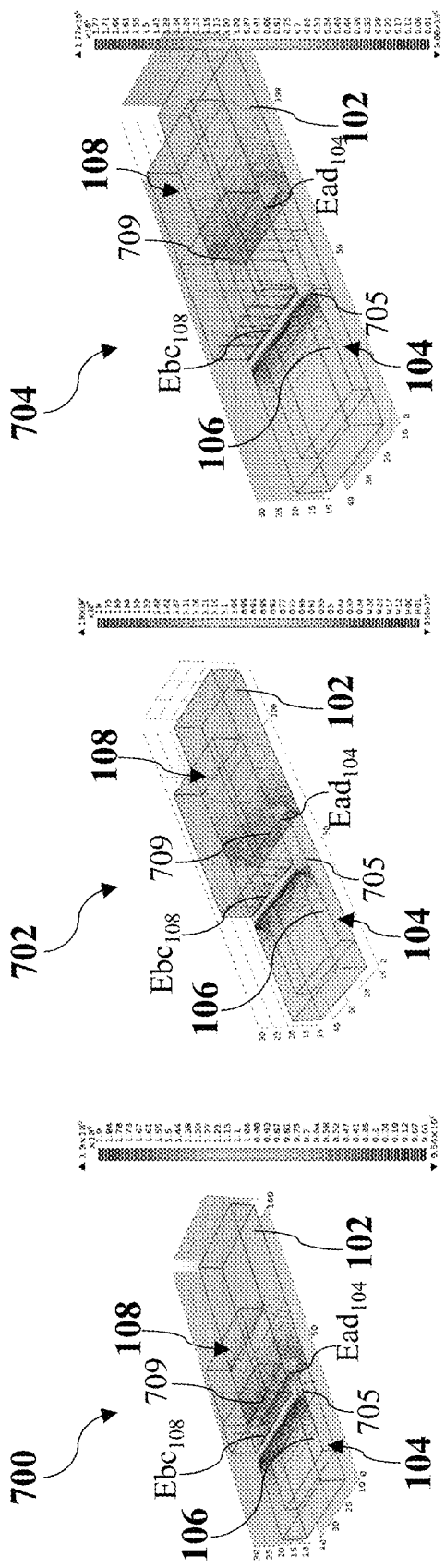
FIGS. 7A to 7C show simulated electric fields of memory devices similar to the memory device of FIGS. 6A to 6C, but with different overlap distances between the top and bottom electrodes.

FIGS. 7A to 7C show simulated electric fields formed in memory devices 700, 702, 704 when a sufficiently large potential difference is applied between the top and bottom electrodes 104, 108 of each memory device 700, 702, 704. For ease of illustration, some reference numerals are omitted from FIGS. 7A to 7C.

The memory devices 700, 702, 704 may be similar to the memory device 600 but with different overlap distances 602 of 10 nm, 20 nm, 30 nm, respectively. The simulated electric fields in FIGS. 7A to 7C were obtained with a thickness $T_{106}$ of each switching layer 106 set as 5 nm and a potential difference between the top and bottom electrodes 104, 108 set as 2V. Using the above Equation (2), the length of the conducting filaments (e.g. conducting filaments 180 as shown in FIG. 6C) may be determined as 11.2 nm, 20.6 nm and 30.4 nm when the overlap distance 602 is 10 nm, 20 nm, or 30 nm respectively. Using the above Equation (1), the minimum electric field strength to form such conducting filaments in the memory device 700, 702, 704 may be determined as $1.79\times10^8$ V/m, $9.7\times10^7$ V/m and $6.58\times10^7$ V/m respectively.

As shown in FIGS. 7A to 7C, in each memory device 700, 702, 704, the simulated electric field strength at the top edge $Ead_{104}$ of the bottom electrode 104 and at the bottom edge $Ebc_{108}$ of the top electrode 108 may be higher than the simulated electric field strengths at other parts of the memory device 700, 702, 704. In particular, when the overlap distance 602 is 10 nm, 20 nm, or 30 nm, the simulated electric field strength at the top edge $Ead_{104}$ of the bottom electrode 104 is approximately $3.23\times10^8$ V/m, $3.07\times10^8$ V/m and $2.74\times10^8$ V/m respectively; whereas, the simulated electric field strength at the bottom edge $Ebc_{108}$ of the top electrode 108 is approximately $6.38\times10^8$ V/m, $6.72\times10^8$ V/m and $6.64\times10^8$ V/m respectively. Comparing these simulated electric field strengths with the above-mentioned minimum electric field strengths determined using Equation (1), conducting filaments may be formed in the memory devices 700, 702, 704. Further, the electric field strength at the portion 705 of the bottom electrode 104 below the edge $Ebc_{108}$ of the top electrode 108 in the memory device 700, 702, 704 is only about $2.12\times10^8$ V/m, $2.16\times10^8$ V/m and $2.16\times10^8$ V/m respectively. Similarly, the electric field strength at the portion 709 of the top electrode 108 above the edge $Ead_{104}$ of the bottom electrode 104 in the memory device 700, 702, 704 is only about $2.28\times10^8$ V/m, $2.27\times10^8$ V/m and $2.27\times10^8$ V/m respectively. Accordingly, the conducting filaments (e.g. conducting filaments 180 in FIG. 6C) may be formed and confined between the edges $Ead_{104}$, $Ebc_{108}$, where the strengths of the electric fields are the highest.

Figure 8:
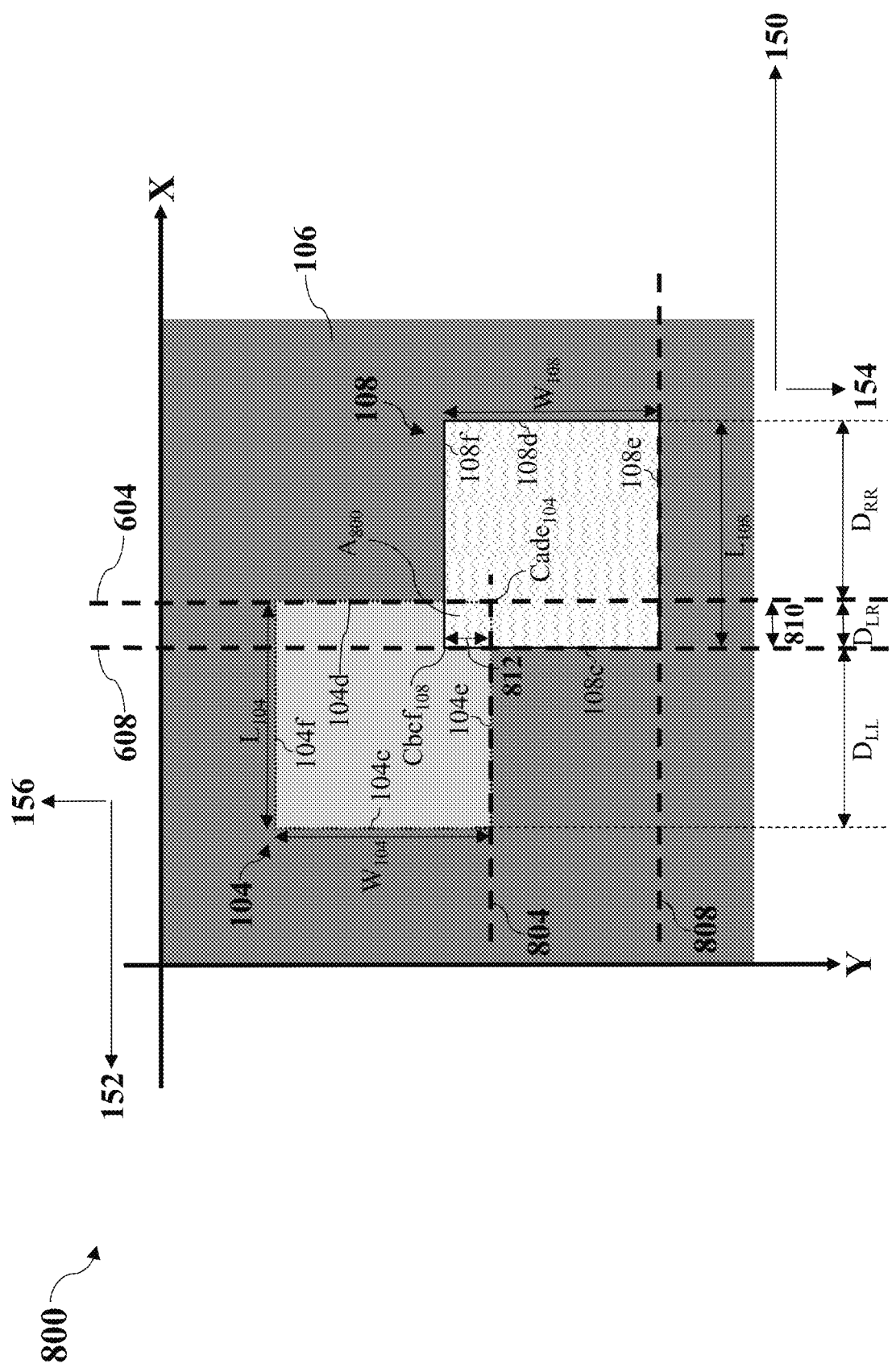
FIG. 8 shows a simplified top view of a memory device according to alternative non-limiting embodiments.

FIG. 8 shows a simplified top view of a memory device 800 according to alternative non-limiting embodiments. The memory device 800 is similar to the memory device 600, and thus, the common features are labelled with the same reference numerals and need not be discussed.

Similar to the memory device 600, in the memory device 800, the top edge $Ead_{104}$ of the bottom electrode 104 and the bottom edge $Ebc_{108}$ of the top electrode 108 may at least partially extend along different first and second vertical planes 604, 608. However, the top and bottom electrodes 108, 104 may be laterally offset from each other along both the X-axis and the Y-axis. In other words, referring to FIG. 8, the front surface 104e of the bottom electrode 104 and the front surface 108e of the top electrode 108 may at least partially extend along different third and fourth vertical planes 804, 808 respectively. These third and fourth vertical planes 804, 808 may be substantially parallel to each other and substantially perpendicular to the first and second vertical planes 604, 608. In addition, the third and fourth vertical planes 804, 808 may be laterally spaced apart from each other.

In the memory device 800, the top surface 104a of the bottom electrode 104 may overlap with a corner $Cbcf_{108}$ of the top electrode 108, and the bottom surface 108b of the top electrode 108 may overlap with a corner $Cade_{104}$ of the bottom electrode 104. In particular, the bottom surface 108b of the top electrode 108 may partially overlap with the top surface 104a of the bottom electrode 104 by a first overlap distance 810 parallel to the X-axis and by a second overlap distance 812 parallel to the Y-axis. Each of these overlap distances 810, 812 may be less than or equal to 50 nm, and may be less than or equal to 30 nm in some non-limiting embodiments. For example, each of these overlap distances 810, 812 may be about 10 nm, about 20 nm, or about 30 nm in a first, a second and a third non-limiting embodiment.

Figure 9A:
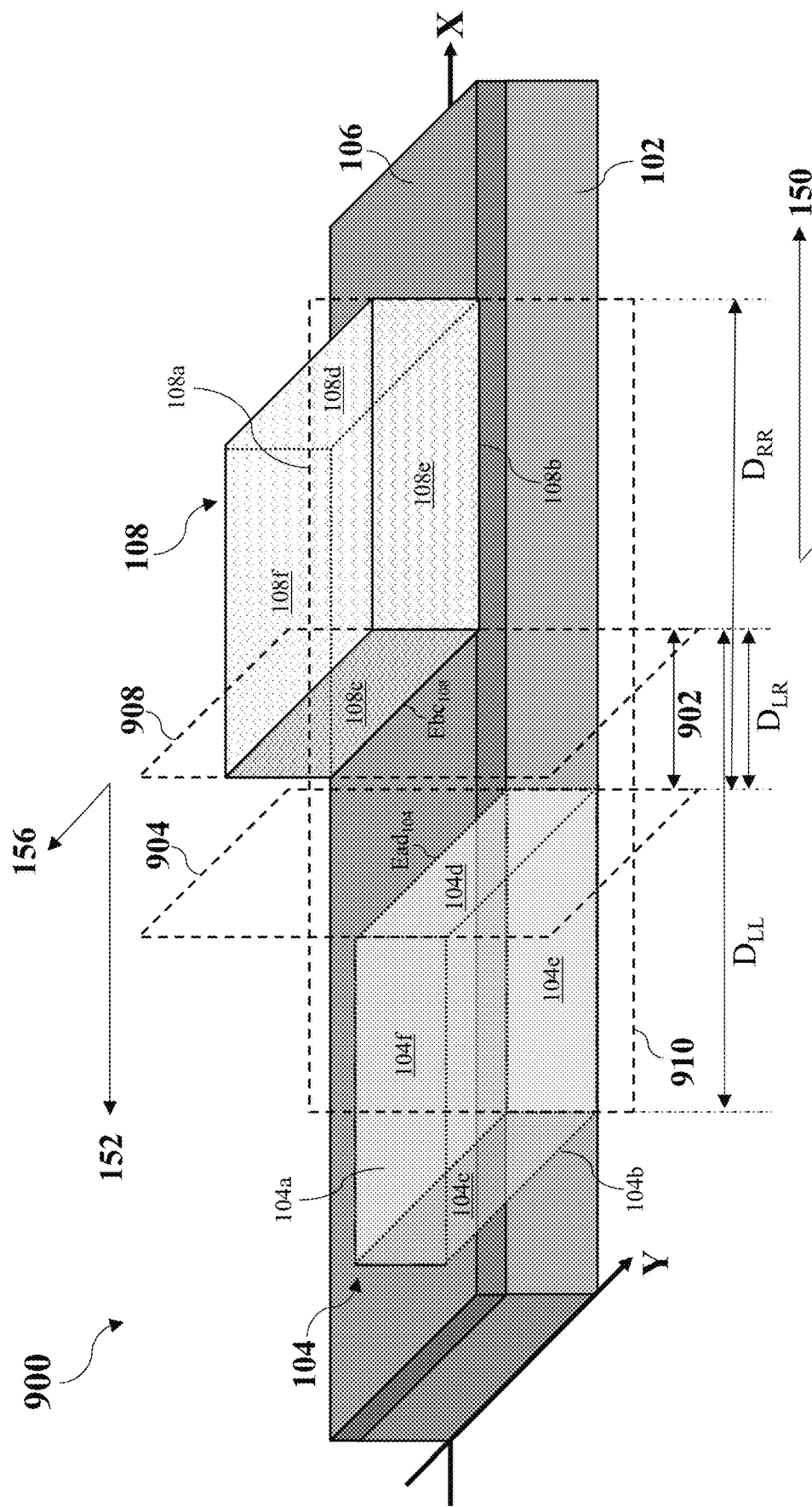
FIGS. 9A, 9B and 9C respectively show a simplified perspective view, a simplified top view and a simplified cross-sectional view of a memory device according to alternative non-limiting embodiments.
Figure 9B:
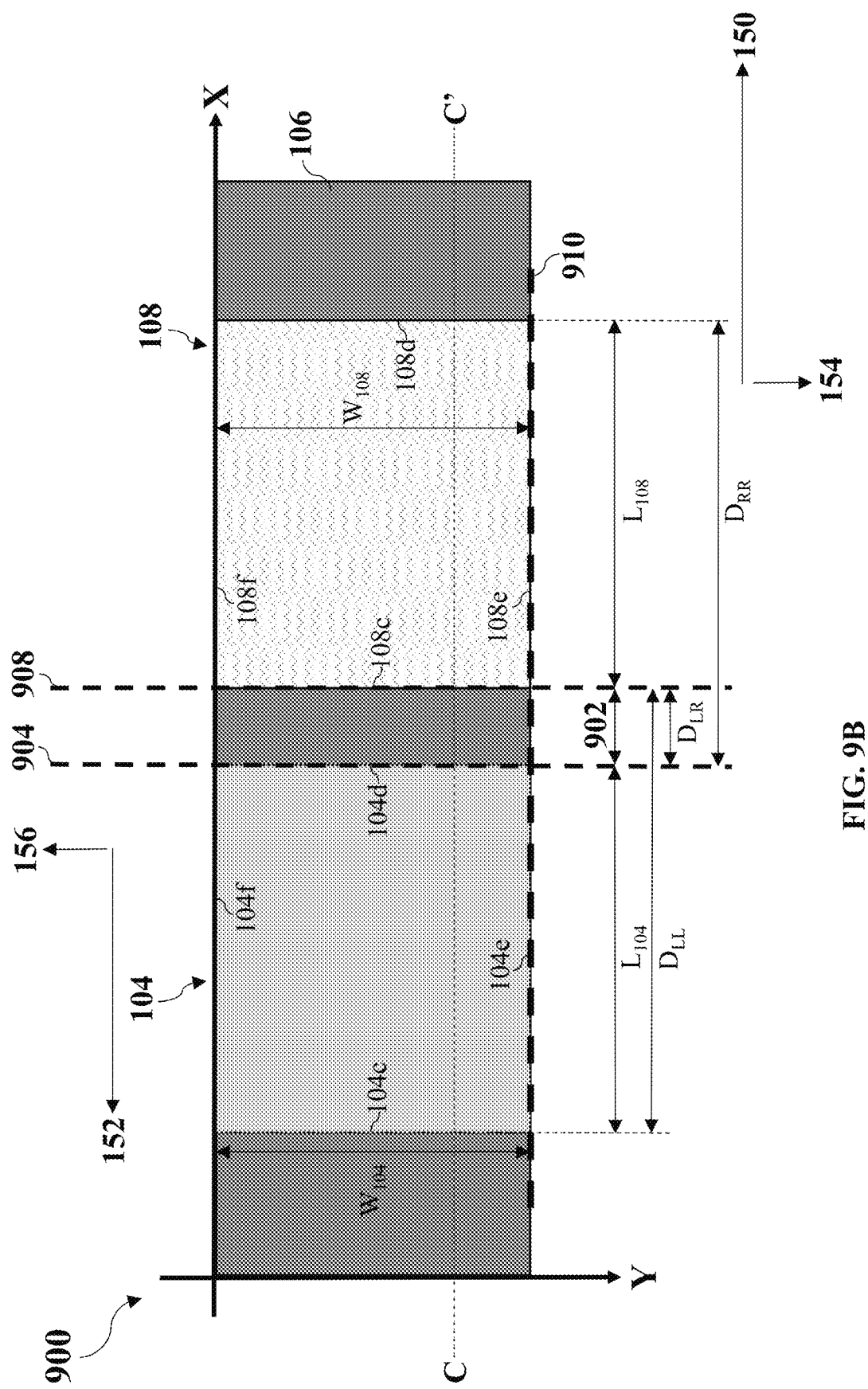
Figure 9C:
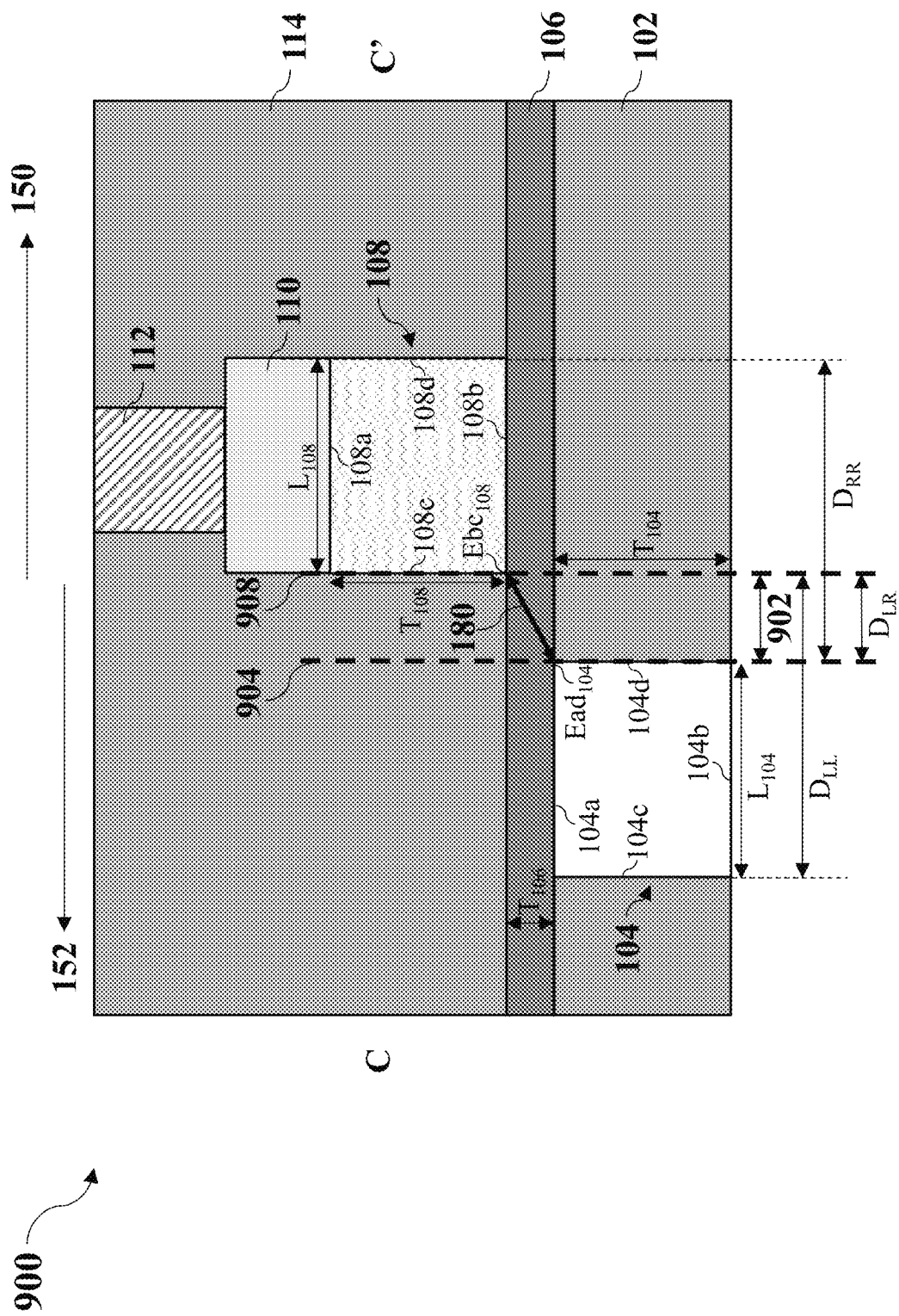

FIG. 9A shows a simplified perspective view of a memory device 900 according to alternative non-limiting embodiments. FIG. 9B shows a simplified top view of the memory device 900 and FIG. 9C shows a simplified cross-sectional view of the memory device 900 along the line C-C' of FIG. 9B. The memory device 900 is similar to the memory device 100, and thus, the common features are labelled with the same reference numerals and need not be discussed.

As shown in FIGS. 9A to 9C, the top edge $Ead_{104}$ of the bottom electrode 104 and the bottom edge $Ebc_{108}$ of the top electrode 108 may at least partially extend along different first and second vertical planes 904, 908. These first and second vertical planes 904, 908 may be substantially parallel to and laterally spaced apart from each other. In particular, the entire bottom surface 108b of the top electrode 108 may be spaced apart from the entire top surface 104a of the bottom electrode 104 by a spacing 902 parallel to the X-axis as shown in FIG. 9A. The spacing 902 may be less than or equal to 30 nm. For example, the spacing 902 may be about 10 nm, about 20 nm, or about 30 nm in a first, a second and a third non-limiting embodiment. A distance $D_{LR}$ parallel to the X-axis between the left surface 108c of the top electrode 108 and the right surface 104d of the bottom electrode 104 may be equal to the spacing 902, and may be smaller than a distance $D_{LL}$ parallel to the X-axis between the left surfaces 108c, 104c of the top and bottom electrodes 108, 104 and a distance $D_{RR}$ parallel to the X-axis between the right surfaces 108d, 104d of the top and bottom electrodes 108, 104.

Referring to FIGS. 9A and 9B, the top and bottom electrodes 108, 104 may be laterally offset along the X-axis but laterally aligned along the Y-axis. Accordingly, the front surface 104e of the bottom electrode 104 and the front surface 108e of the top electrode 108 may at least partially extend along a same third vertical plane 910 substantially perpendicular to the first and second vertical planes 904, 908.

Referring to FIG. 9C, when a sufficiently large potential difference is applied between the top and bottom electrodes 104, 108, conducting filaments 180 may be formed between the top and bottom electrodes 104, 108. The conducting filaments 180 may be confined between the top edge $Ead_{104}$ of the bottom electrode 104 and the bottom edge $Ebc_{108}$ of the top electrode 108, as the electric fields at these edges $Ead_{104}$, $Ebc_{108}$ may be higher than that at other parts of the memory device 900.

Figures 10A, 10B, 10C:
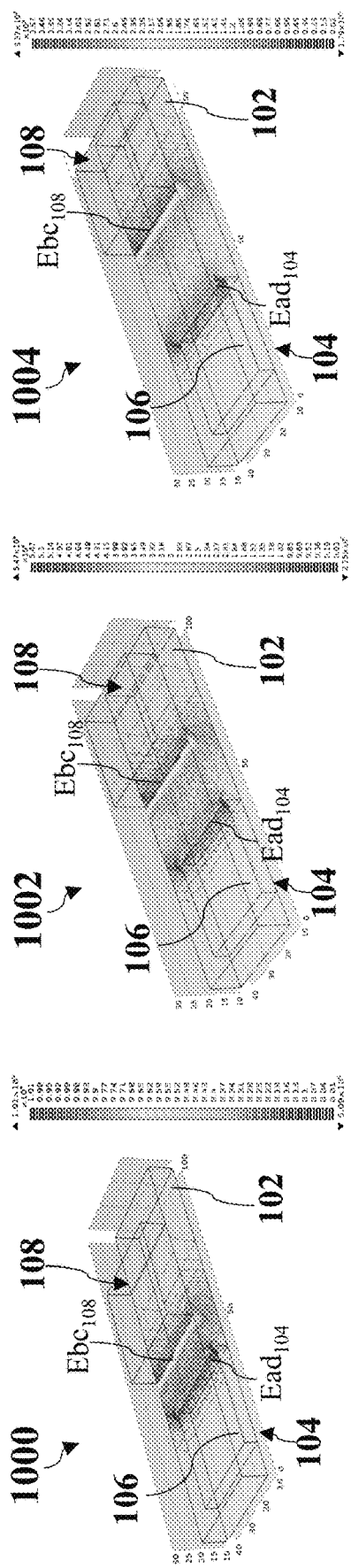
FIGS. 10A to 10C show simulated electric fields in memory devices similar to the memory device of FIGS. 9A to 9C, but with different spacings between the top and bottom electrodes.

FIGS. 10A to 10C show simulated electric fields in memory devices 1000, 1002, 1004 when a sufficiently large potential difference is applied between the top and bottom electrodes 104, 108. For clarity of illustration, some reference numerals are omitted from FIGS. 10A to 10C. The memory devices 1000, 1002, 1004 may be similar to the memory device 900 but with different spacings 902 at 10 nm, 20 nm, or 30 nm, respectively. The simulated electric fields in FIGS. 10A to 10C were obtained with a thickness $T_{106}$ of each switching layer 106 set as 5 nm and a potential difference between the top and bottom electrodes 104, 108 set as 2V. The length of the conducting filaments (e.g. conducting filaments 180 as shown in FIG. 9C) may be determined as 11.2 nm, 20.6 nm and 30.4 nm respectively when the spacing 902 is 10 nm, 20 nm, or 30 nm. The minimum electric field strengths to form conducting filaments in the memory devices 1000, 1002, 1004 may similarly be determined using Equation (1) as approximately $1.79 \times 10^8$ V/m, $9.7 \times 10^7$ V/m and $6.58 \times 10^7$ V/m respectively.

As shown in FIGS. 10A to 10C, in each memory device 1000, 1002, 1004, the simulated electric field strength at the edge $Ead_{104}$ of the bottom electrode 104 and at the edge $Ebc_{108}$ of the top electrode 108 are higher than the simulated electric field strengths at other parts of the memory device 1000, 1002, 1004. In particular, the simulated electric field strength at the edge $Ead_{104}$ of the bottom electrode 104 is approximately $1.28 \times 10^8$ V/m, $7 \times 10^7$ V/m and $4.477 \times 10^7$ V/m in the memory device 1000, 1002, 1004 respectively; whereas, the simulated electric field strength at the edge $Ebc_{108}$ of the top electrode 108 is approximately $2.85 \times 10^8$ V/m, $1.73 \times 10^8$ V/m and $1.125 \times 10^8$ V/m in the memory device 1000, 1002, 1004 respectively. Accordingly, conducting filaments (e.g. conducting filaments 180 as shown in FIG. 9C) may be formed and confined between the edges $Ead_{104}$, $Ebc_{108}$ where the strengths of the electric fields are the highest.

Figure 11:
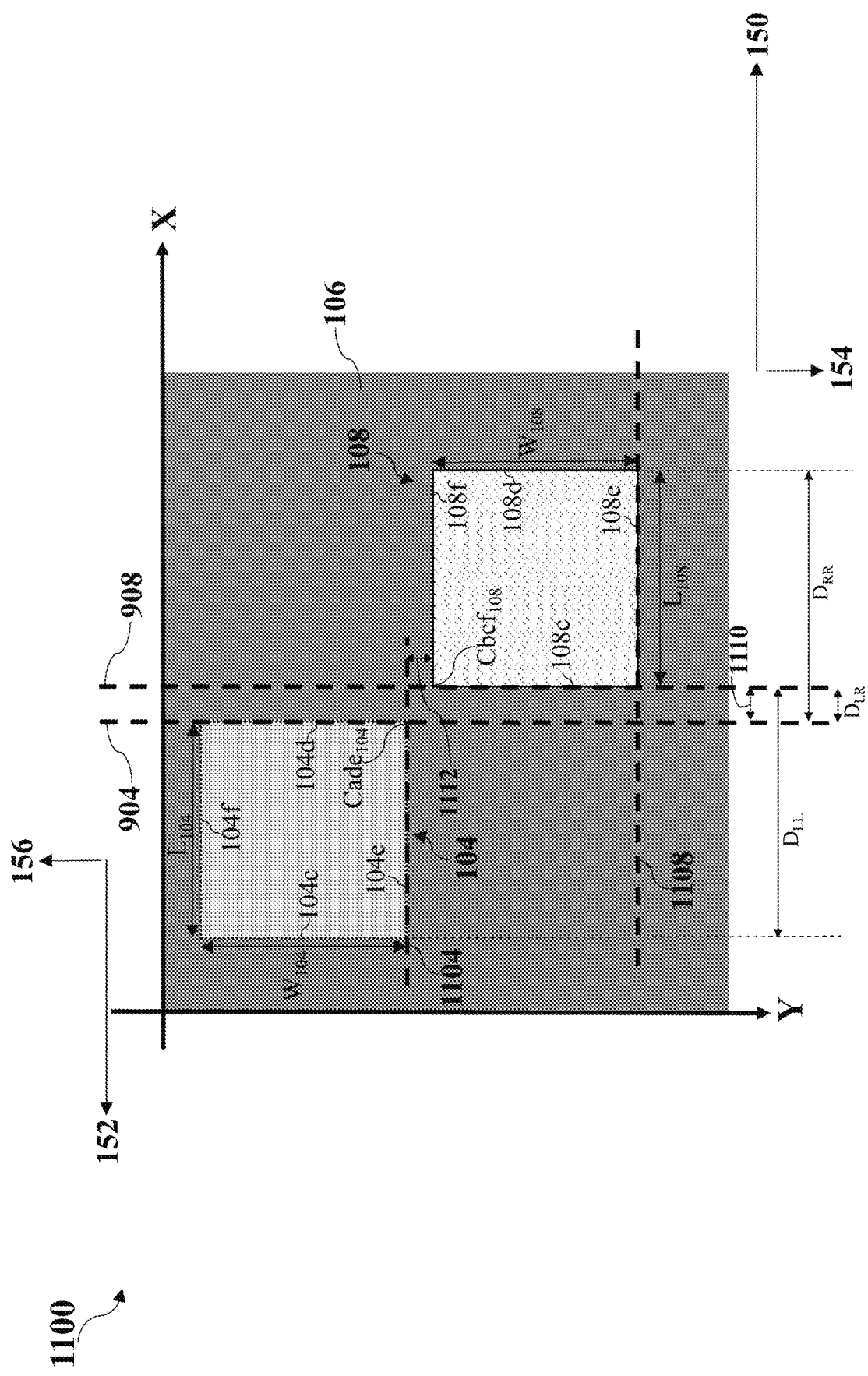
FIG. 11 shows a simplified top view of a memory device according to alternative non-limiting embodiments.

FIG. 11 shows a simplified top view of a memory device 1100 according to alternative non-limiting embodiments. The memory device 1100 is similar to the memory device 900, and thus, the common features are labelled with the same reference numerals and need not be discussed.

Similar to the memory device 900, in the memory device 1100, the top edge $Ead_{104}$ of the bottom electrode 104 and the bottom edge $Ebc_{108}$ of the top electrode 108 may at least partially extend along different first and second vertical planes 904, 908. However, the top and bottom electrodes 108, 104 may be laterally offset from each other along both the X-axis and the Y-axis. In other words, referring to FIG. 11, the front surface 104e of the bottom electrode 104 and the front surface 108e of the top electrode 108 may at least partially extend along different third and fourth vertical planes 1104, 1108 respectively. These third and fourth vertical planes 1104, 1108 may be substantially parallel to each other and substantially perpendicular to the first and second vertical planes 904, 908. In addition, the third and fourth vertical planes 1104, 1108 may be laterally spaced apart from each other.

In particular, the bottom surface 108b of the top electrode 108 may be spaced apart from the top surface 104a of the bottom electrode 104 along both the X-axis and the Y-axis, by a first spacing 1110 parallel to the X-axis and a second spacing 1112 parallel to the Y-axis. Each of these spacings 1110, 1112 may be less than or equal to 30 nm. For example, each of these spacings 1110, 1112 may be about 10 nm, about 20 nm, or about 30 nm in a first, a second and a third non-limiting embodiment. The spacings 1110, 1112 may be substantially the same or may alternatively be different. A corner $Cade_{104}$ of the bottom electrode 104 may be nearer to the top electrode 108 as compared to the other corners of the bottom electrode 104, and a corner $Cbcf_{108}$ of the top electrode 108 may be nearer to the bottom electrode 104 as compared to the other corners of the top electrode 108. Accordingly, conducting filaments may be formed and confined between the corners $Cade_{104}$, $Cbcf_{108}$ of the bottom and top electrodes 104, 108.

In the memory devices 100, 400, 600, 800, 900, 1100, the top electrode 108 may be arranged on the right side of the bottom electrode 104 as seen from the top view. However, the top electrode 108 may alternatively be arranged in a similar manner relative to the bottom electrode 104, but on the left side of the bottom electrode 104 as seen from the top view. In these alternative non-limiting embodiments, a distance $D_{RL}$ parallel to the X-axis between the right surface 108d of the top electrode 108 and the left surface 104c of the bottom electrode 104 may be smaller than or equal to a distance $D_{RR}$ parallel to the X-axis between the right surfaces 108d, 104d of the top and bottom electrodes 108, 104 and a distance $D_{LL}$ parallel to the X-axis between the left surfaces 108c, 104c of the top and bottom electrodes 108, 104.

Figure 12A:
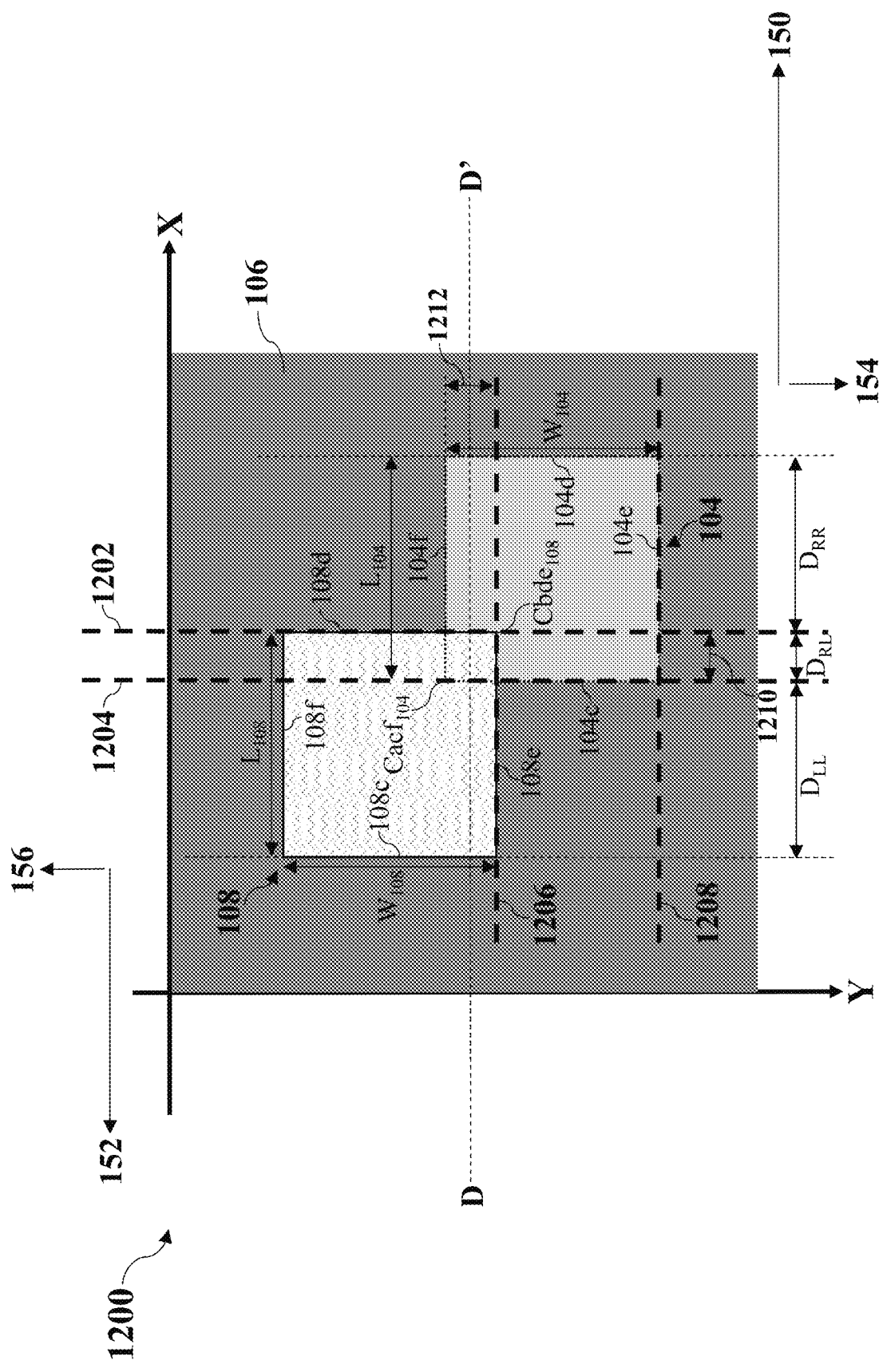
FIGS. 12A and 12B respectively show a simplified top view and a simplified cross-sectional view of a memory device according to alternative non-limiting embodiments.
Figure 12B:
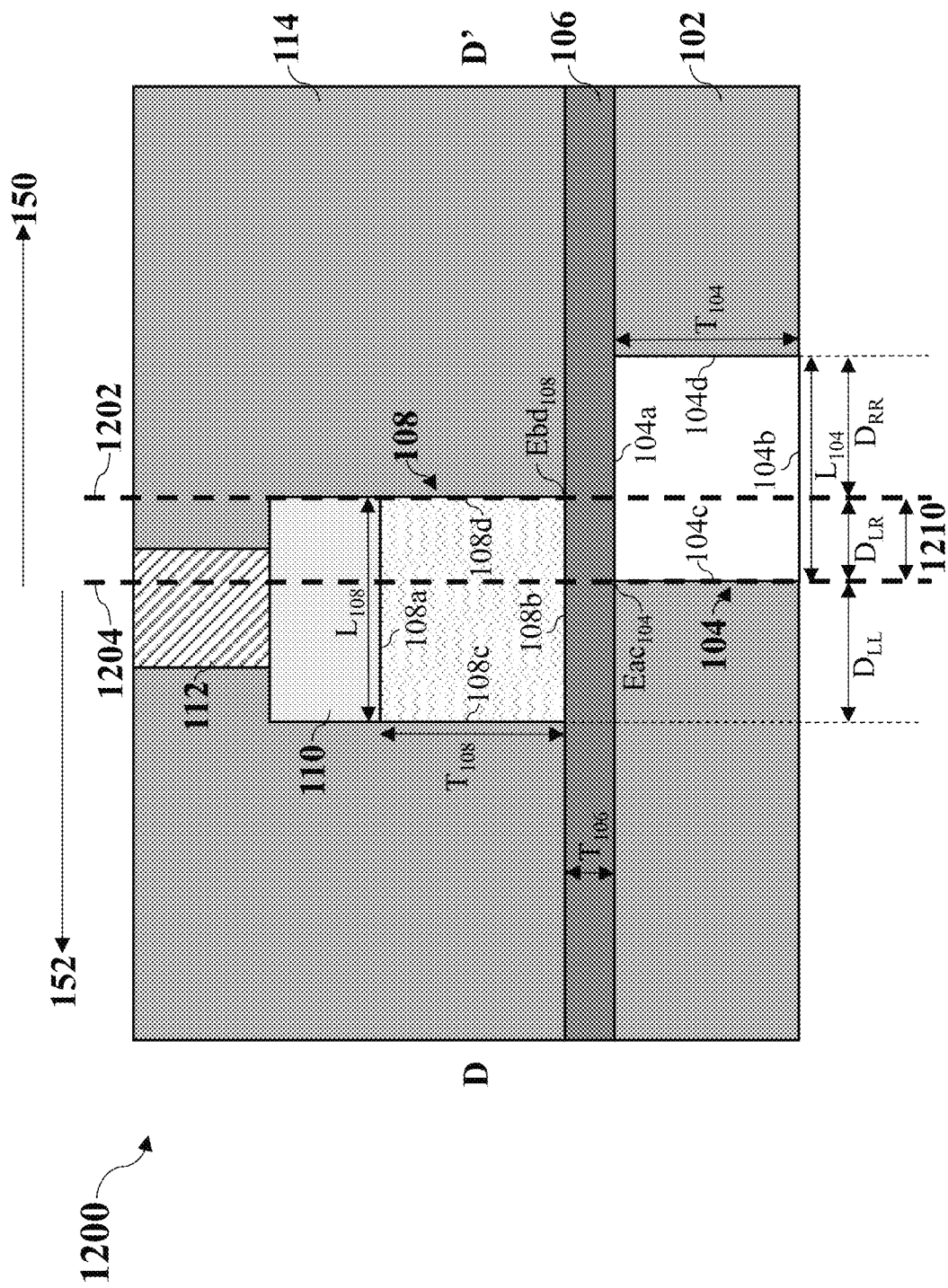

FIG. 12A shows a simplified top view of a memory device 1200 according to alternative non-limiting embodiments. FIG. 12B shows a simplified cross-sectional view of the memory device 1200 along the line D-D' of FIG. 12A. The memory device 1200 is similar to the memory device 800, and thus, the common features are labelled with the same reference numerals and need not be discussed.

Similar to the memory device 800, the top and bottom electrodes 108, 104 of the memory device 1200 may be laterally offset from each other along both the X-axis and the Y-axis. However, the top electrode 108 may be on the left side (instead of the right side) of the bottom electrode 104 as seen from the top view in FIG. 12A. Referring to FIG. 12B, a bottom edge $Ebd_{108}$ of the top electrode 108 and a top edge $Eac_{104}$ of the bottom electrode 104 may at least partially extend along different first and second vertical planes 1202, 1204 substantially parallel to and laterally spaced apart from each other. Referring to FIG. 12A, the front surface 108e of the top electrode 108 and the front surface 104e of the bottom electrode 104 may similarly at least partially extend along different third and fourth vertical planes 1206, 1208 laterally spaced apart from each other. The overlap distances 1210, 1212 along the X-axis and the Y-axis respectively may be similar to the distances 810, 812 in the memory device 800. As shown in FIG. 12A, the top surface 104a of the bottom electrode 104 may overlap with a corner $Cbde_{108}$ of the top electrode 108 and the bottom surface 108b of the top electrode 108 may overlap with a corner $Cacf_{104}$ of the bottom electrode 104. Conducting filaments may be formed and confined between these corners $Cbde_{108}$, $Cacf_{104}$ of the top and bottom electrodes 108, 104.

Figure 13B:
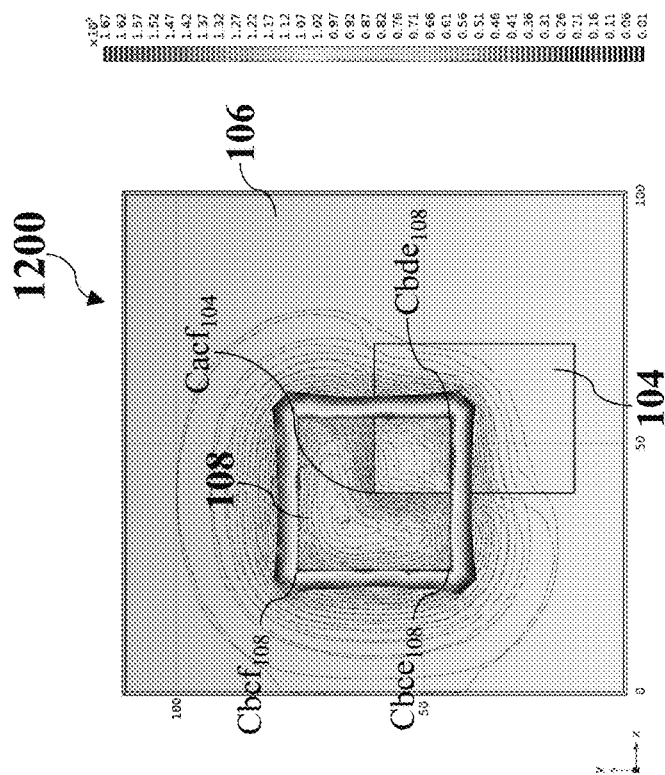
FIGS. 13A and 13B show simulated electric fields in the memory device of FIGS. 12A and 12B.
Figure 13A:
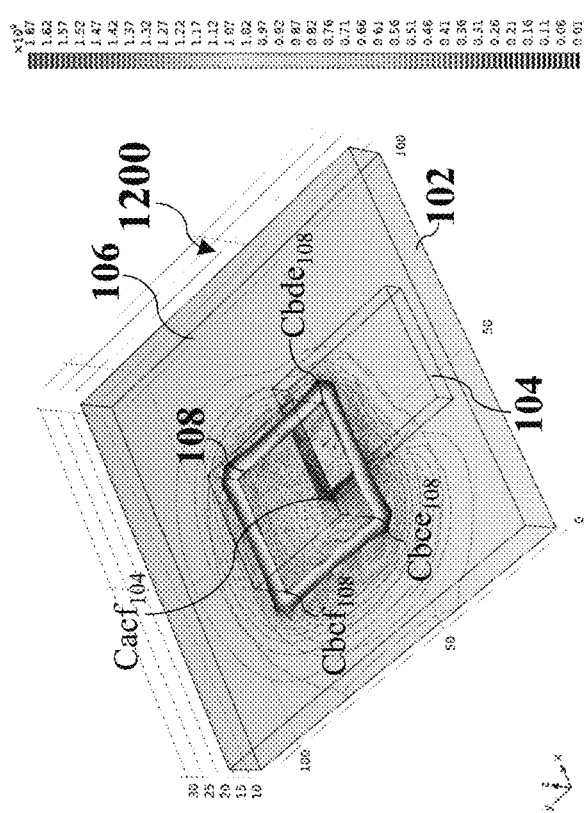

FIGS. 13A and 13B respectively show a perspective view and a top view of the memory device 1200 with simulated electric fields formed therein, when a sufficiently large potential difference is applied between the top and bottom electrodes 108, 104. For clarity of illustration, some reference numerals are omitted from FIGS. 13A and 13B.

As shown in FIGS. 13A and 13B, the simulated electric field strength at the corner $Cbde_{108}$ of the top electrode 108 is higher than the simulated electric field strengths at other parts of the top electrode 108. In particular, the simulated electric field strength at the corner $Cbde_{108}$ of the top electrode 108 is $3.57 \times 10^8$ V/m; whereas, the simulated electric field strengths at other corners $Cbce_{108}$, $Cbcf_{108}$ of the top electrode 108 are $3.366 \times 10^8$ V/m and $2.911 \times 10^8$ V/m respectively. Further, the simulated electric field strength at the corner $Cacf_{104}$ of the bottom electrode 104 is $2.409 \times 10^8$ V/m. Therefore, conducting filaments may be formed and confined between the corners $Cbde_{108}$, $Cacf_{104}$ of the top and bottom electrodes 108, 104, as the electric fields at these corners $Cbde_{108}$, $Cacf_{104}$ may be the higher than that at other parts of the memory device 1200.

As shown in FIG. 1A to FIG. 13, the bottom surface 108b of the top electrode 108 and the top surface 104a of the bottom electrode 104 of each memory device 100-1200 may have a same shape. However, the bottom surface 108b of the top electrode 108 and the top surface 104a of the bottom electrode 104 may alternatively have different shapes.

Figure 14A:
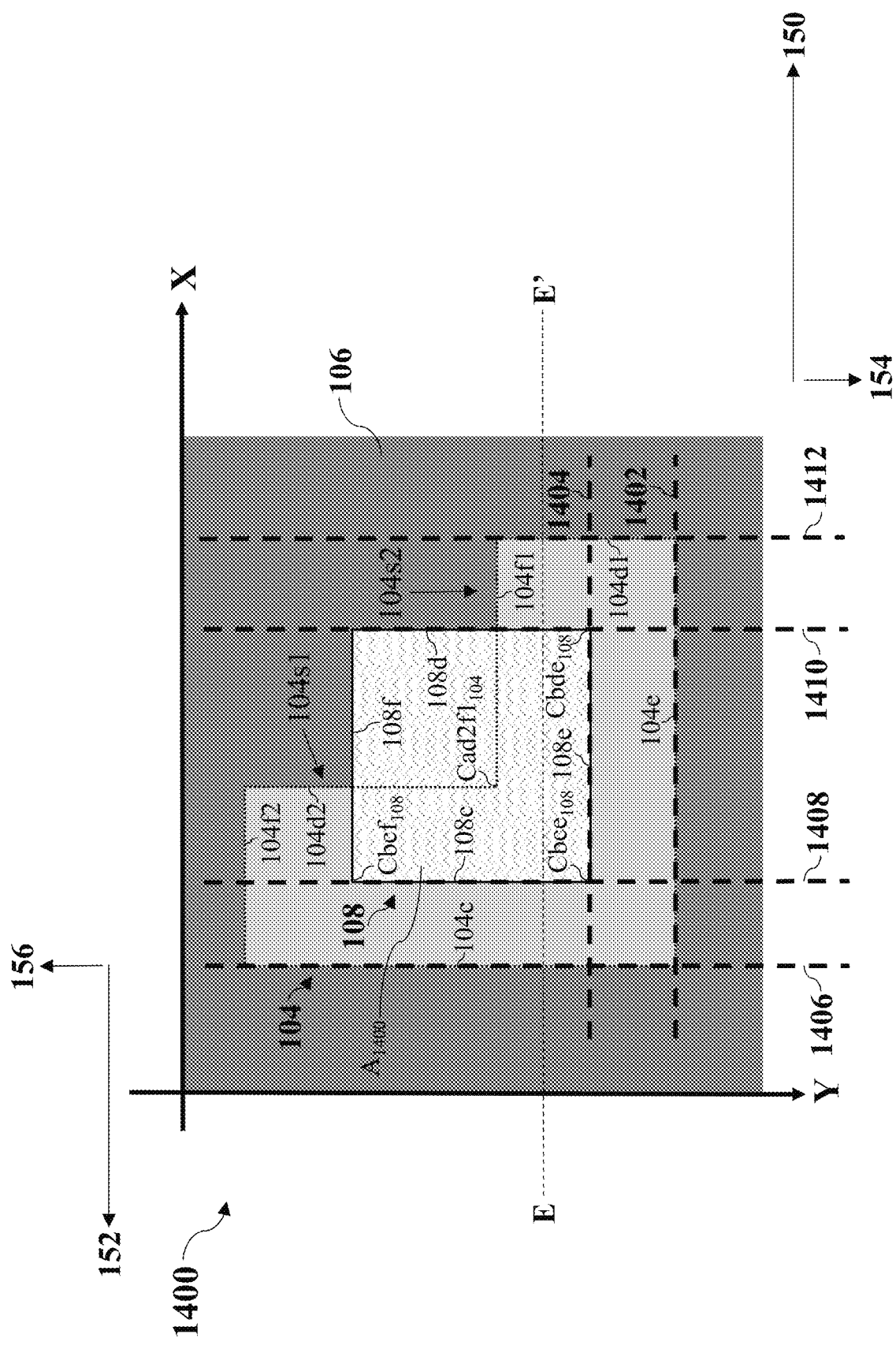
FIGS. 14A and 14B respectively show a simplified top view and a simplified cross-sectional view of a memory device according to alternative non-limiting embodiments.
Figure 14B:
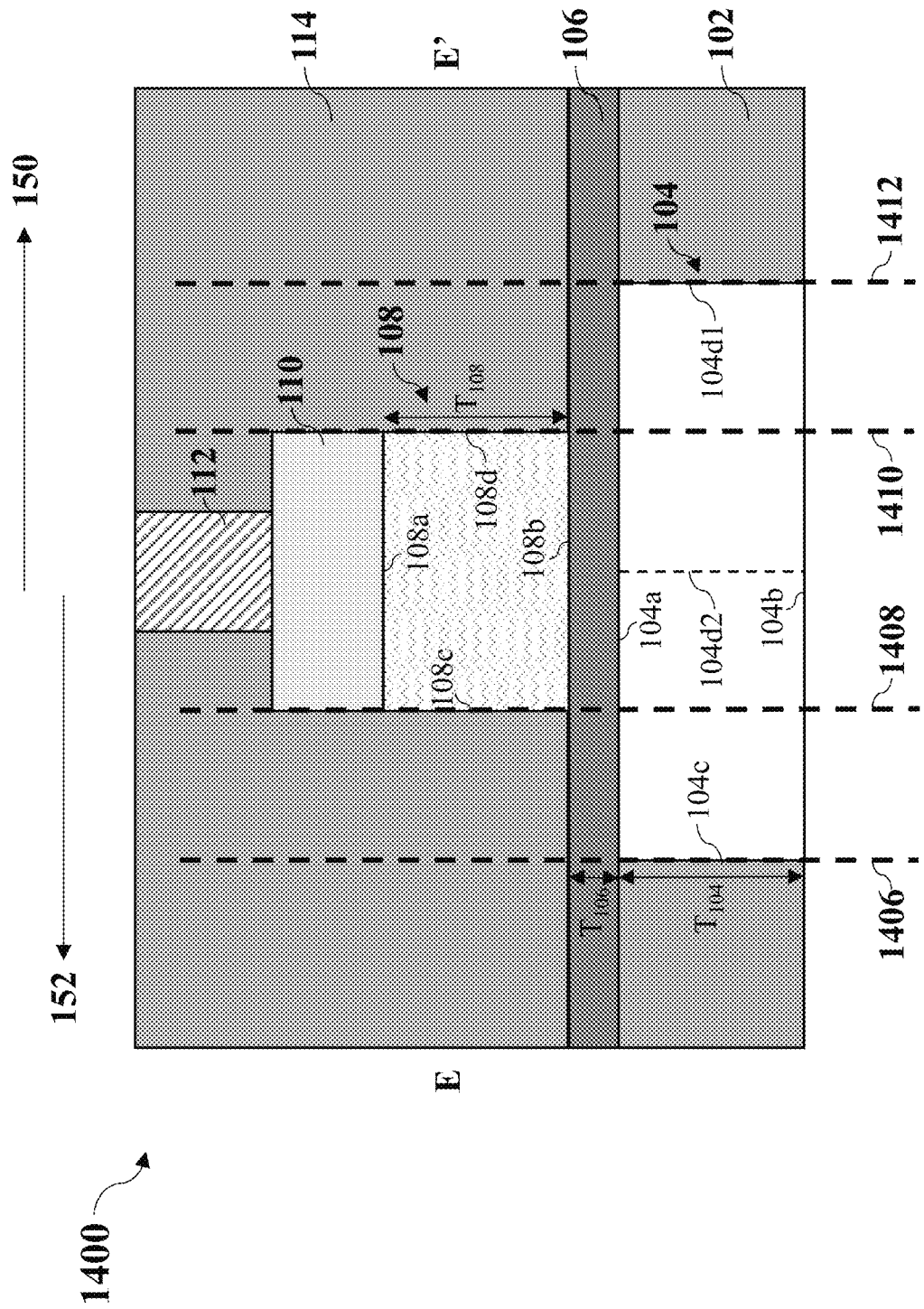

FIG. 14A shows a simplified top view of a memory device 1400 according to alternative non-limiting embodiments and FIG. 14B shows a simplified cross-sectional view of the memory device 1400 along the line E-E' of FIG. 14A. The memory device 1400 is similar to the memory device 800, and thus, the common features are labelled with the same reference numerals and need not be discussed.

As shown in FIG. 14A, in the memory device 1400, the bottom surface 108b of the top electrode 108 and the top surface 104a of the bottom electrode 104 may have different shapes. In particular, while the top electrode 108 may be a cuboid with surfaces 108a-108f, the bottom electrode 104 may include a first segment 104s1 and a second segment 104s2 substantially perpendicular to each other. In other words, the bottom electrode 104 may have L-shaped top and bottom surfaces 104a, 104b. The bottom electrode 104 may further include a left surface 104c, a first right surface 104d1, a second right surface 104d2, a front surface 104e, a first back surface 104f1 and a second back surface 104f2. The first right surface 104d1 may be further right than the second right surface 104d2, and the second back surface 104f2 may be further back than the first back surface 104f1.

As shown in FIGS. 14A and 14B, the bottom surface 108b of the top electrode 108 may partially overlap with the top surface 104a of the bottom electrode 104, with the front surface 104e of the bottom electrode 104 and the front surface 108e of the top electrode 108 extending along different vertical planes 1402, 1404. The bottom surface 108b of the top electrode 108 may overlap with a corner $Cad2f1_{104}$ of the bottom electrode 104, where this corner $Cad2f1_{104}$ may lie between the first segment 104s1 and the second segment 104s2 of the bottom electrode 104. The top surface 104a of the bottom electrode 104 may overlap with multiple corners $Cbce_{108}$, $Cbcf_{108}$, $Cbde_{108}$ of the top electrode 108, among which the corner $Cbce_{108}$ may be nearest to the corner $Cad2f1_{104}$ of the bottom electrode 104. Accordingly, when a sufficiently large potential difference is applied between the top and bottom electrodes 104, 108 of the memory device 1400, electric field strengths at the corners $Cad2f1_{104}$, $Cbce_{108}$ may be higher than at other parts of the memory device 1400 and thus, conducting filaments 180 may be formed between the corners $Cad2f1_{104}$, $Cbce_{108}$ of the respective electrodes 104, 108.

The overlap area $A_{1400}$ between the bottom surface 108b of the top electrode 108 and the top surface 104a of the bottom electrode 104 in the memory device 1400 may be greater than the overlap area $A_{800}$ between the bottom surface 108b of the top electrode 108 and the top surface 104a of the bottom electrode 104 in the memory device 800. This may provide a greater localized electric field between the top and bottom electrodes 108, 104 in the memory device 1400, hence allowing stronger conducting filaments 180 to be formed between the electrodes 108, 104. For example, a ratio of the overlap area $A_{1400}$ to the overlap area $A_{800}$ may range from about two to about four, and may in one non-limiting embodiment, be about three. In various non-limiting embodiments, the overlap area $A_{800}$ may range from about 25 nm$^2$ to about 400 nm$^2$; whereas, the overlap area $A_{1400}$ may range from about 75 nm$^2$ to about 1200 nm$^2$.

In the memory device 1400, the top electrode 108 may be sized and positioned such that the left surface 104c of the bottom electrode 104 and the left surface 108c of the top electrode 108 may at least partially extend along different vertical planes 1406, 1408, and the right surface 108d of the top electrode 108 and the first right surface 104d1 of the bottom electrode 104 may at least partially extend along different vertical planes 1410, 1412. The vertical planes 1406, 1408, 1410, 1412 may be substantially parallel to and laterally spaced apart from one another. However, the top electrode 108 may alternatively be sized and positioned differently.

Figure 15:
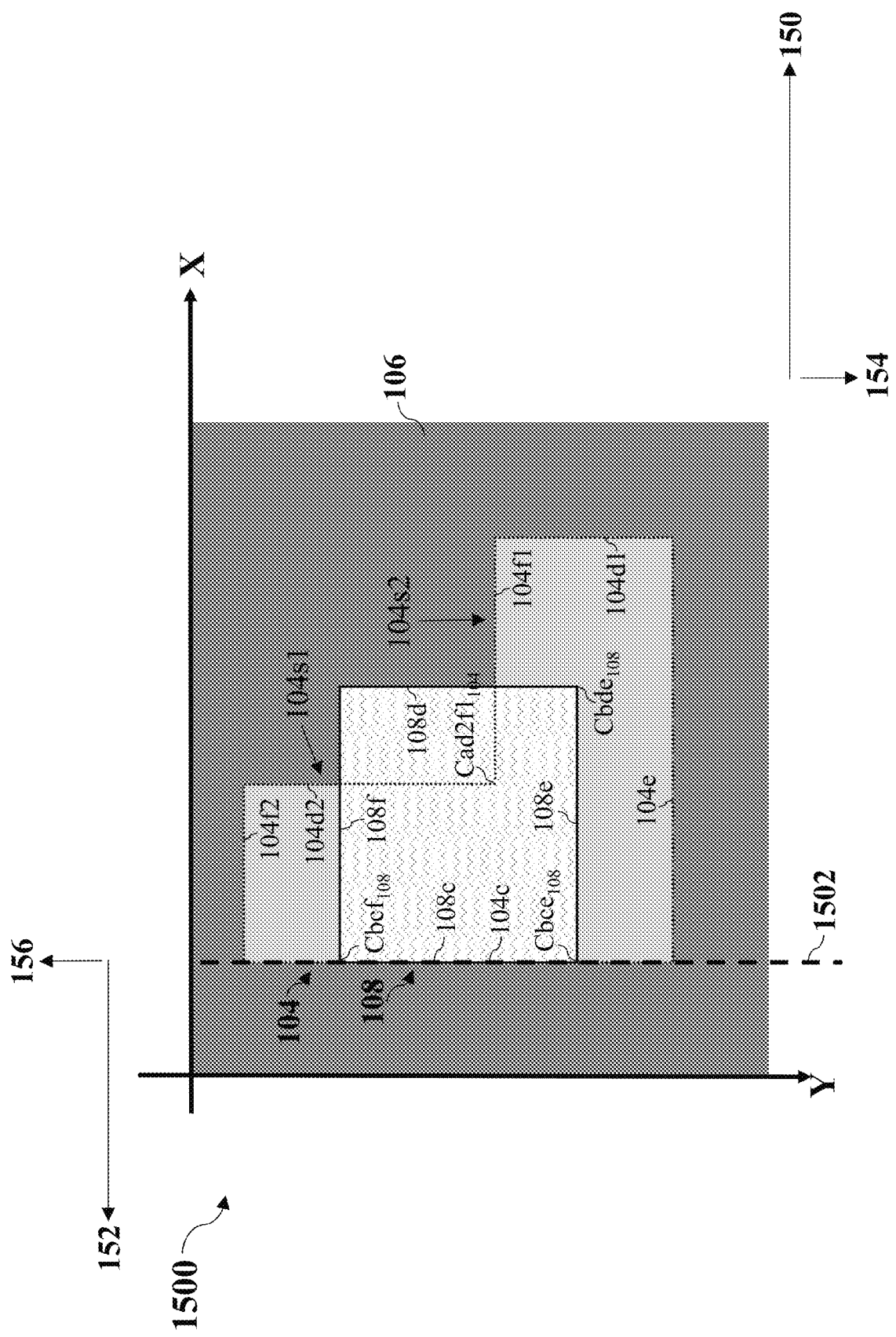
FIG. 15 shows a simplified top view of a memory device according to alternative non-limiting embodiments.

FIG. 15 shows a simplified top view of a memory device 1500 according to alternative non-limiting embodiments. The memory device 1500 is similar to the memory device 1400, and thus, the common features are labelled with the same reference numerals and need not be discussed.

As shown in FIG. 15, in the memory device 1500, the top electrode 108 may be sized and positioned relative to the bottom electrode 104, such that the left surface 108c of the top electrode 108 and the left surface 104c of the bottom electrode 104 may at least partially extend along a same vertical plane 1502. Similar to the memory device 1400, the top surface 104a of the bottom electrode 104 may overlap with multiple corners $Cbce_{108}$, $Cbcf_{108}$, $Cbde_{108}$ of the top electrode 108, and the bottom surface 108b of the top electrode 108 may overlap with a corner $Cad2f1_{104}$ of the bottom electrode 104. However, in the memory device 1500, the corner $Cbde_{108}$ (instead of the corner $Cbce_{108}$) of the top electrode 108 may be nearest to the corner $Cad2f1_{104}$ of the bottom electrode 104. Accordingly, when a sufficiently large potential difference is applied between the electrodes 104, 108 of the memory device 1500, conducting filaments may be formed between the corner $Cbde_{108}$ of the top electrode 108 and the corner $Cad2f1_{104}$ of the bottom electrode 104.

Figure 16:
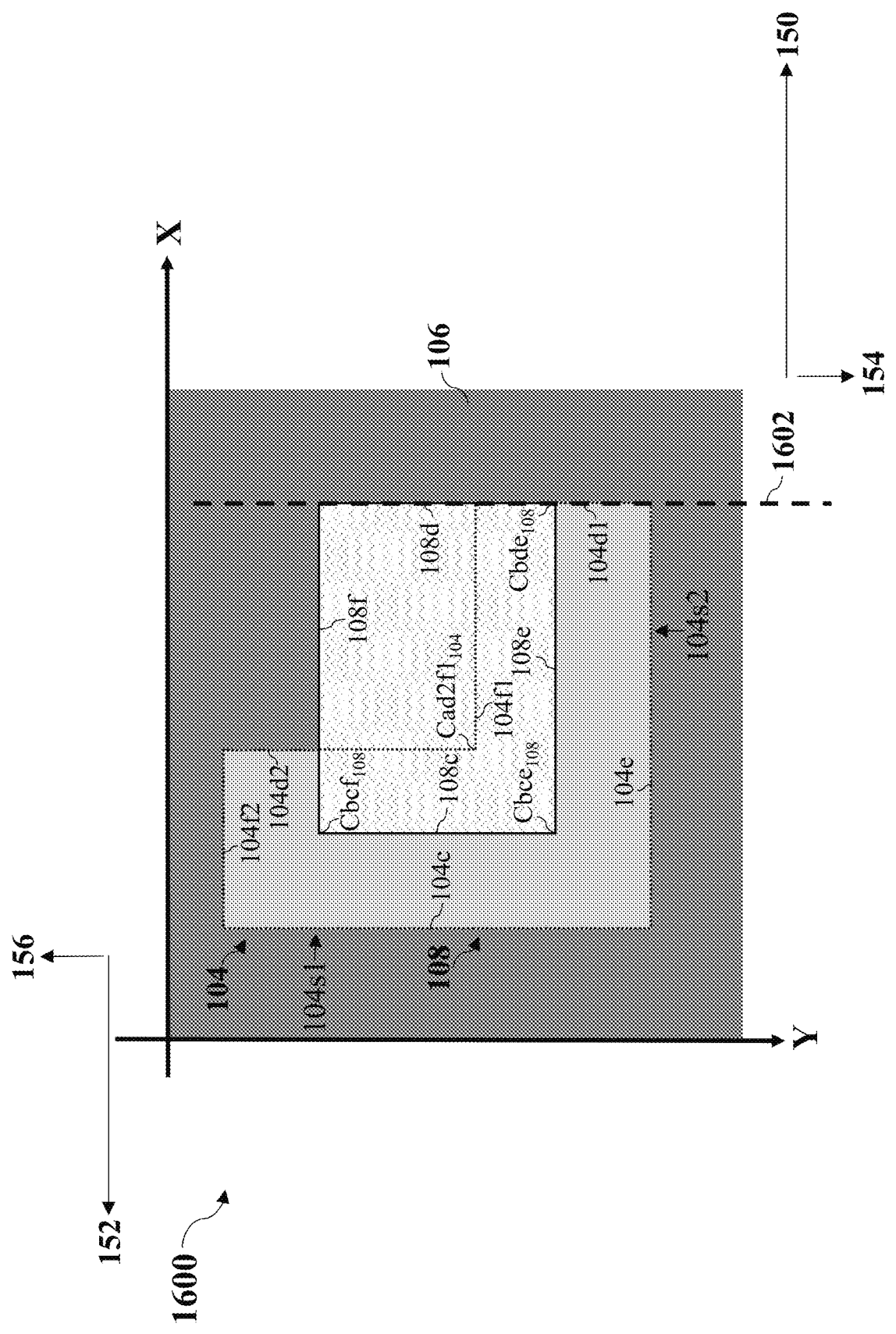
FIG. 16 shows a simplified top view of a memory device according to alternative non-limiting embodiments.

FIG. 16 shows a simplified top view of a memory device 1600 according to alternative non-limiting embodiments. The memory device 1600 is similar to the memory device 1400, and thus, the common features are labelled with the same reference numerals and need not be discussed.

As shown in FIG. 16, in the memory device 1600, the top electrode 108 may be sized and positioned relative to the bottom electrode 104, such that the right surface 108d of the top electrode 108 and the first right surface 104d1 of the bottom electrode 104 may extend at least partially along a same vertical plane 1602. Similar to the memory device 1400, the top surface 104a of the bottom electrode 104 may overlap with multiple corners $Cbce_{108}$, $Cbcf_{108}$, $Cbde_{108}$ of the top electrode 108, and the bottom surface 108b of the top electrode 108 may overlap with a corner $Cad2f1_{104}$ of the bottom electrode 104. The corner $Cbce_{108}$ of the top electrode 108 may similarly be nearest to the corner $Cad2f1_{104}$ of the bottom electrode 104. Accordingly, when a sufficiently large potential difference is applied between the electrodes 104, 108 of the memory device 1600, conducting filaments may be formed between the corner $Cbce_{108}$ of the top electrode 108 and the corner $Cad2f1_{104}$ of the bottom electrode 104.

Figure 17:
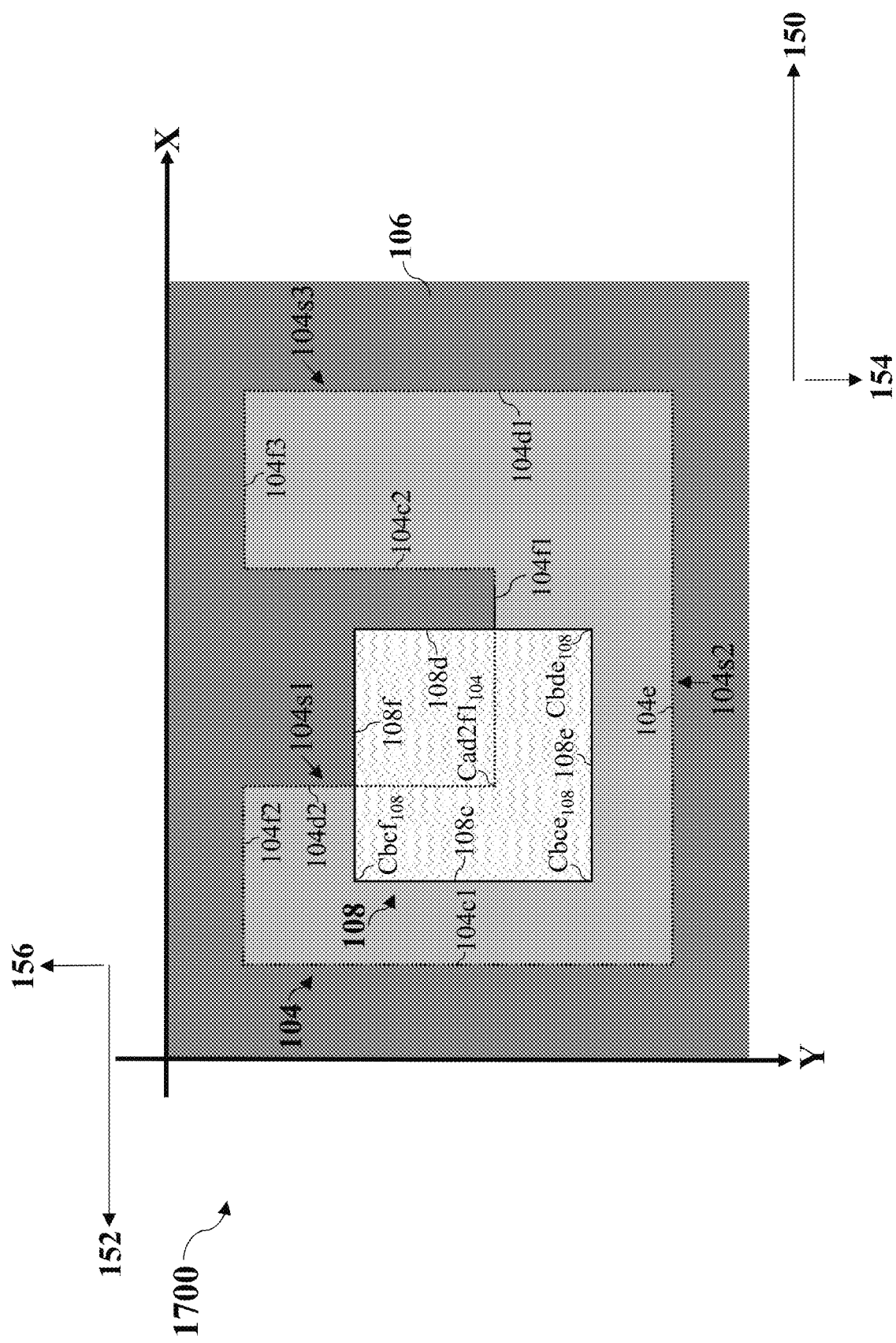
FIG. 17 shows a simplified top view of a memory device according to alternative non-limiting embodiments.

FIG. 17 shows a simplified top view of a memory device 1700 according to alternative non-limiting embodiments. The memory device 1700 is similar to the memory device 1400, and thus, the common features are labelled with the same reference numerals and need not be discussed.

As compared to the memory device 1400, in the memory device 1700, the bottom electrode 104 may not only include a first segment 104s1 and a second segment 104s2 substantially perpendicular to each other, but may also include a third segment 104s3 substantially perpendicular to the second segment 104s2 and substantially parallel to the first segment 104s1. In particular, the top and bottom surfaces 104a, 104b of the bottom electrode 104 may be U-shaped instead of L-shaped. The bottom electrode 104 of the memory device 1700 may also include a front surface 104e, first, second and third back surfaces 104f1, 104f2, 104f3, first and second left surfaces 104c1, 104c2, and first and second right surfaces 104d1, 104d2. The second and third back surfaces 104f2, 104f3 may be laterally aligned and may be further back as compared to the first back surface 104f1. Further, the first left surface 104c1 may be further left than the second left surface 104c2, and the first right surface 104d1 may be further right than the second right surface 104d2. As shown in FIG. 17, the bottom surface 108b of the top electrode 108 may similarly overlap with a corner $Cad2f1_{104}$ of the bottom electrode 104; and the top surface 104a of the bottom electrode 104 may similarly overlap with multiple corners $Cbcf_{108}$, $Cbce_{108}$, $Cbde_{108}$ of the top electrode 108, among which the corner $Cbce_{108}$ of the top electrode 108 may be nearest to the corner $Cad2f1_{104}$ of the bottom electrode 104.

Figure 18B:
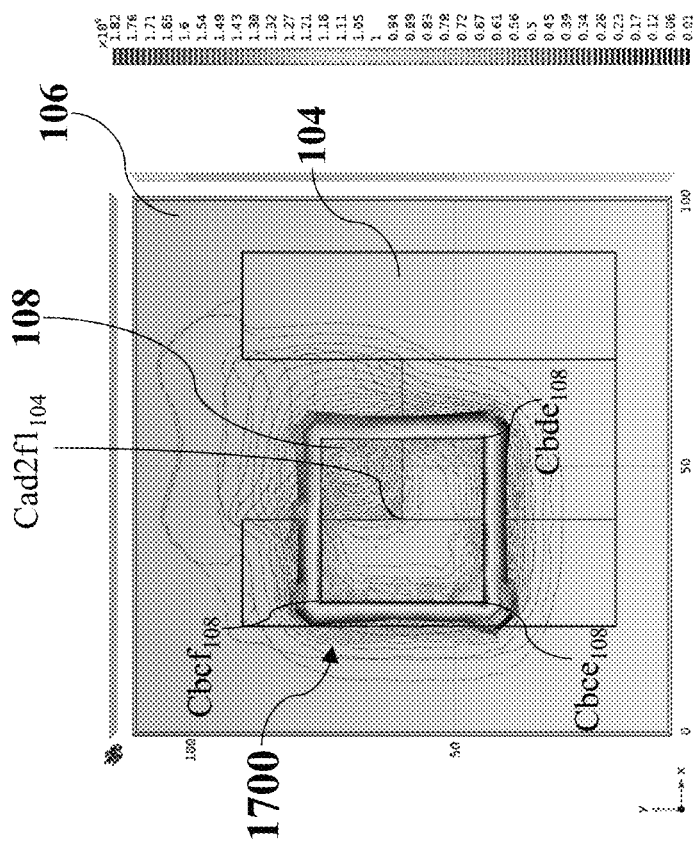
FIGS. 18A and 18B show simulated electric fields in the memory device of FIG. 17.
Figure 18A:
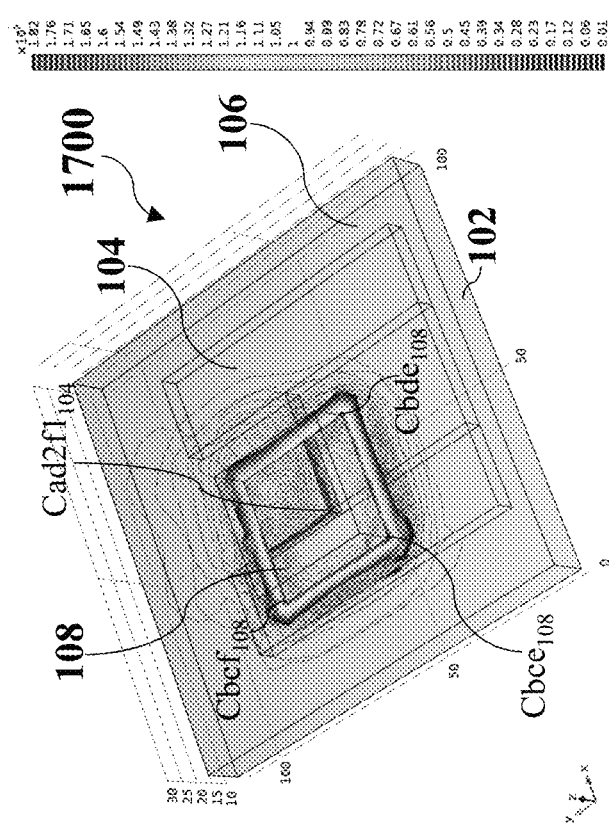

FIGS. 18A and 18B respectively show a perspective view and a top view of the memory device 1700 with simulated electric fields formed therein, when a sufficiently large potential difference is applied between the electrodes 104, 108. For clarity of illustration, some reference numerals are omitted from FIGS. 18A and 18B.

As shown in FIGS. 18A and 18B, the simulated electric field strength at the corner $Cbce_{108}$ of the top electrode 108 is higher than that at other parts of the top electrode 108. In particular, the simulated electric field strength at the corner $Cbce_{108}$ of the top electrode 108 is $4.542 \times 10^8$ V/m; whereas, the simulated electric field strengths at the corner $Cbcf_{108}$ and the corner $Cbde_{108}$ are $4.111 \times 10^8$ V/m and $3.549 \times 10^8$ V/m respectively. Further, the simulated electric field strength at the corner $Cad2f1_{104}$ of the bottom electrode 104 is $1.982 \times 10^8$ V/m. Therefore, conducting filaments may be formed between the corner $Cbce_{108}$ of the top electrode 108 and the corner $Cad2f1_{104}$ of the bottom electrode 104, where the electric field strengths may be the highest.

Figure 19:
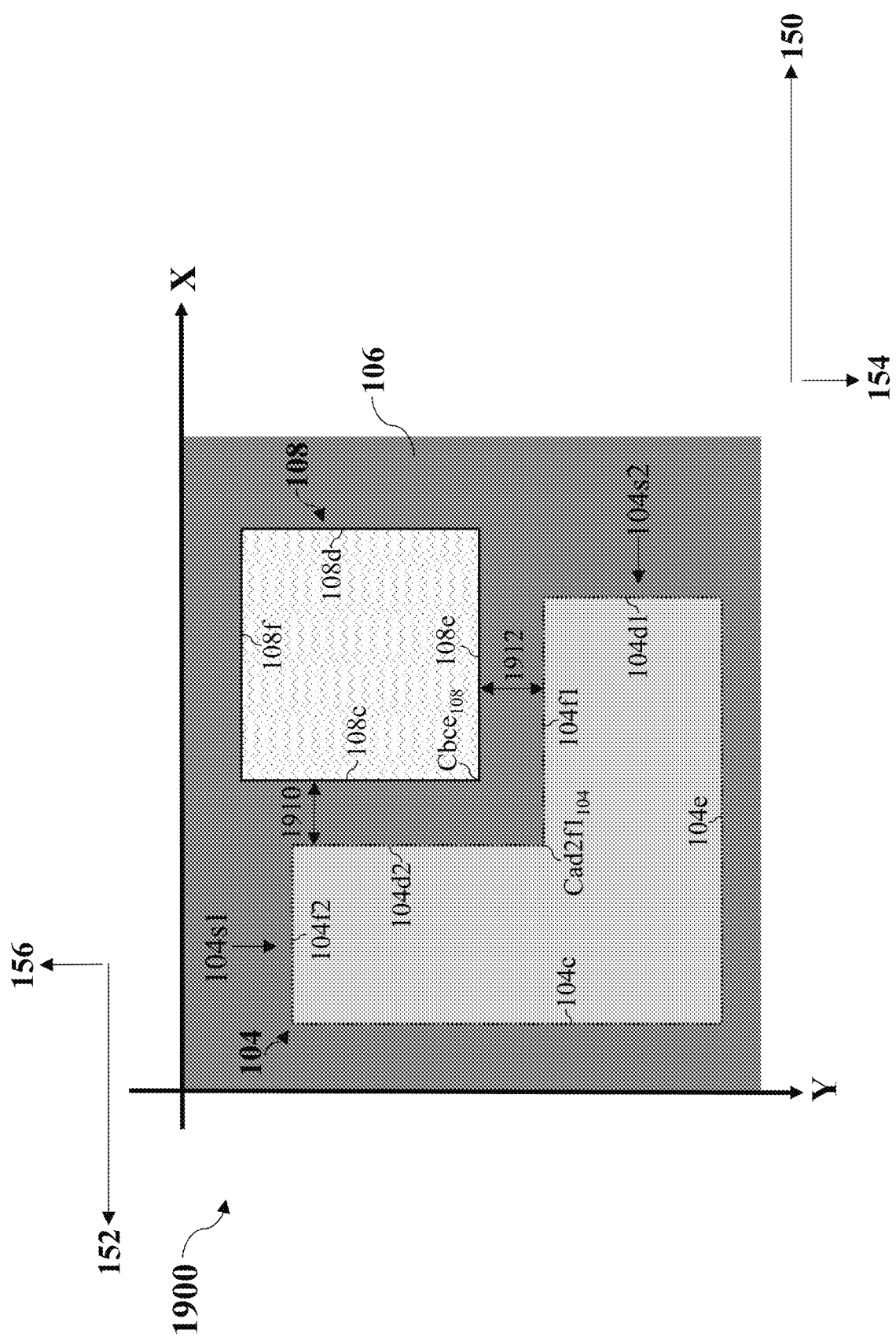
FIG. 19 shows a simplified top view of a memory device according to alternative non-limiting embodiments.

FIG. 19 shows a simplified top view of a memory device 1900 according to alternative non-limiting embodiments. The memory device 1900 is similar to the memory device 1400, and thus, the common features are labelled with the same reference numerals and need not be discussed.

As shown in FIG. 19, the top electrode 108 of the memory device 1900 may have a same shape as the top electrode 108 of the memory device 1400, and the bottom electrode 104 of the memory device 1900 may have a same shape as the bottom electrode 104 of the memory device 1400. However, the bottom surface 108b of the top electrode 108 may be spaced apart from the top surface 104a of the bottom electrode 104 along both the X-axis and the Y-axis, by a first spacing 1910 parallel to the X-axis and a second spacing 1912 parallel to the Y-axis (similar to the memory device 1100 as described above). Each of these spacings 1910, 1912 may be less than or equal to 30 nm. Further, these spacings 1910, 1912 may be substantially the same as each other or may alternatively be different from each other. A corner $Cbce_{108}$ of the top electrode 108 may be nearer to the bottom electrode 104 as compared to the other corners of the top electrode 108. A corner $Cad2f1_{104}$ lying between the first segment 104s1 and the second segment 104s2 of the bottom electrode 104 may be nearer to the corner $Cbce_{108}$ of the top electrode 108, as compared to the other corners of the bottom electrode 104. Accordingly, when a sufficiently large potential difference is applied between the electrodes 104, 108 of the memory device 1900, electric field strengths at the corners $Cad2f1_{104}$, $Cbce_{108}$ may be higher than at other parts of the memory device 1900 and thus, conducting filaments may be formed between the corners $Cad2f1_{104}$, $Cbce_{108}$ of the respective electrodes 104, 108.

In each of the memory devices 100-1900 described above, the top electrode 108 is depicted as a cuboid having surfaces 108a-108f. However, the top electrode 108 may be in a different shape. Similarly, the bottom electrode 104 may also be differently shaped from those in the memory devices 100-1900. For example, the bottom electrode 104 of the memory device 1900 may instead be of a same shape as the bottom electrode 104 of the memory device 1700. For example, the bottom electrode 104 of the memory device 400 may instead be of a same shape as the bottom electrode 104 of the memory device 1900, and the corners $Cad2f1_{104}$, $Cbce_{108}$ may be aligned along a same vertical axis. Further, in FIGS. 1A-19, the electrodes 104, 108 are depicted with their surfaces entirely parallel to the X or Y axis. For example, the surface 108c of the memory device 100 is depicted as entirely parallel to the X axis and hence, entirely extending along the plane 158. However, the electrodes 104, 108 may instead have rounded edges or corners. For example, the surface 108c of the memory device 100 may have rounded edges and hence, may be only partially extending along the plane 158. This may be due to the limitations in the fabrication of the electrodes 104, 108, although, certain techniques may be implemented to increase the sharpness of the edges and corners of the electrodes 104, 108, so as to improve filament confinement. For example, using serifs on the photoresist masks for forming the electrodes 104, 108 may increase the sharpness of the edges and corners (e.g. from a 5.2 nm corner pullback to a 2.9 nm corner pullback).

As described above, the memory devices 100-1900 may include a single bottom electrode 104 and a single top electrode 108. These memory devices 100-1900 may be referred to as one transistor one resistor (1T1R) devices. In alternative non-limiting embodiments, the memory device may include at least one additional top electrode arranged over the switching layer 106 in a laterally offset position relative to the bottom electrode 104. These memory devices may be referred to as one transistor N resistors (1TNR)

memory devices, where N may be the total number of top electrodes. In these memory devices, each of the at least one additional top electrode may be substantially planar. Further, for each of the at least one additional top electrode, at most a part of a bottom surface of the additional top electrode may overlap the top surface 104a of the bottom electrode 104, and at most a part of the top surface 104a of the bottom electrode 104 may overlap the bottom surface of the additional top electrode. Each additional top electrode may be arranged relative to the bottom electrode 104 in a manner similar to the arrangement between the top electrode 108 and the bottom electrode 104 in any of the above-described memory devices 100-1900. Within a same memory device, the arrangement between each top electrode and the bottom electrode 104 may be the same as or different from that of another top electrode and the bottom electrode 104. Further, the top and bottom electrodes of the memory device may be of any shape, and the electrodes within a same memory device may have the same shapes or different shapes.

Figure 20A:
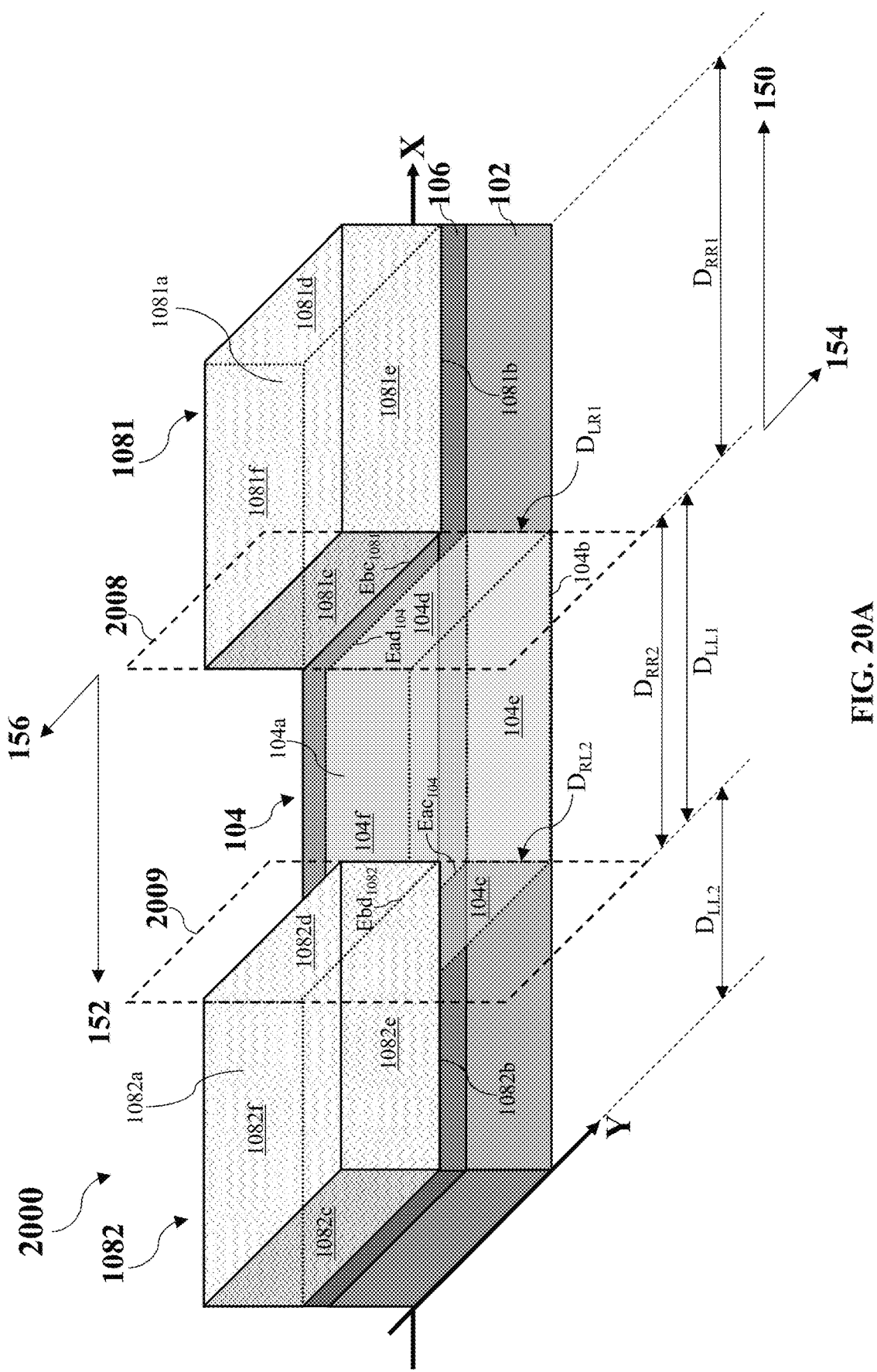
FIGS. 20A, 20B and 20C respectively show a simplified perspective view, a simplified top view and a simplified cross-sectional view of a memory device according to alternative non-limiting embodiments.
Figure 20B:
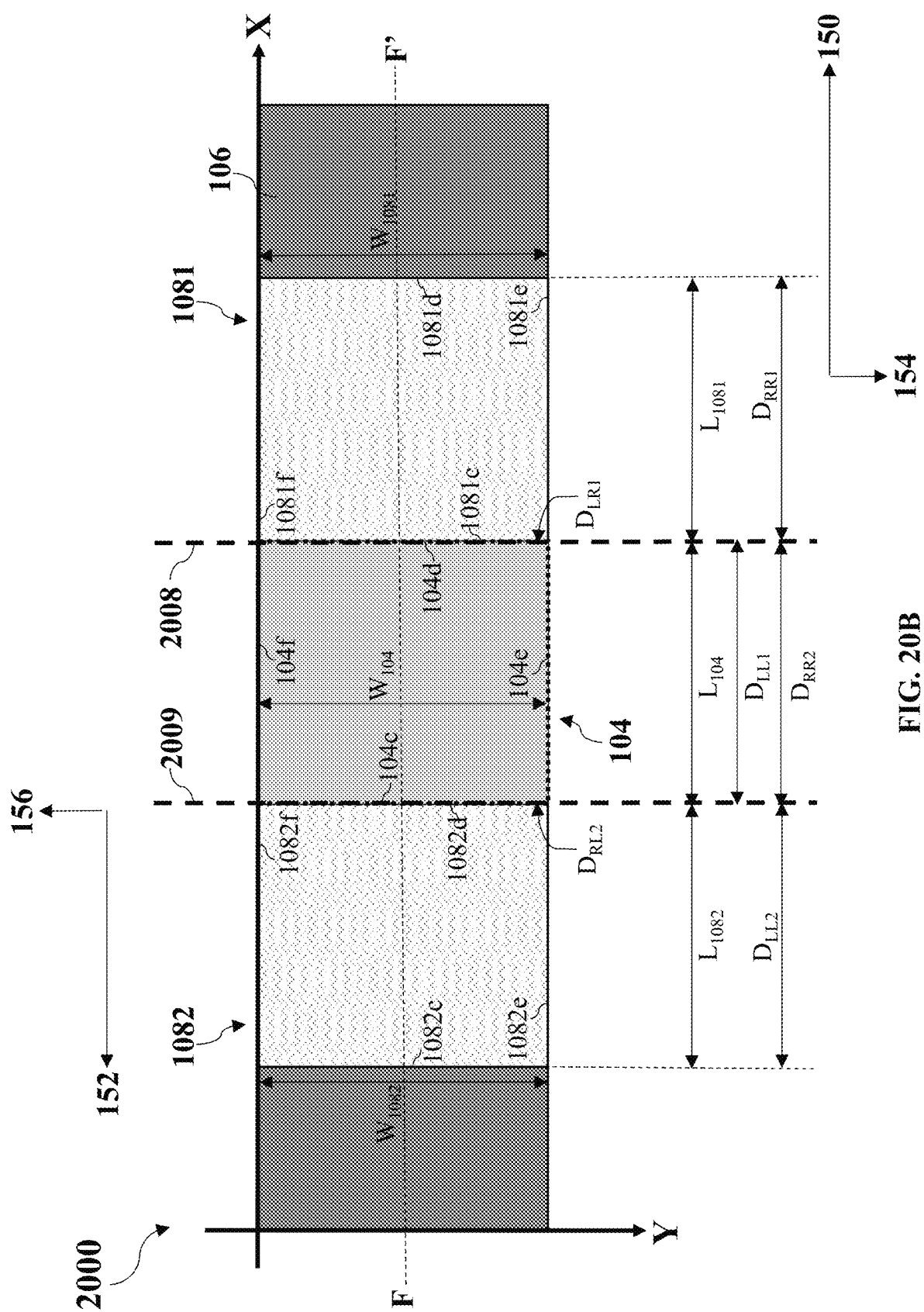
Figure 20C:
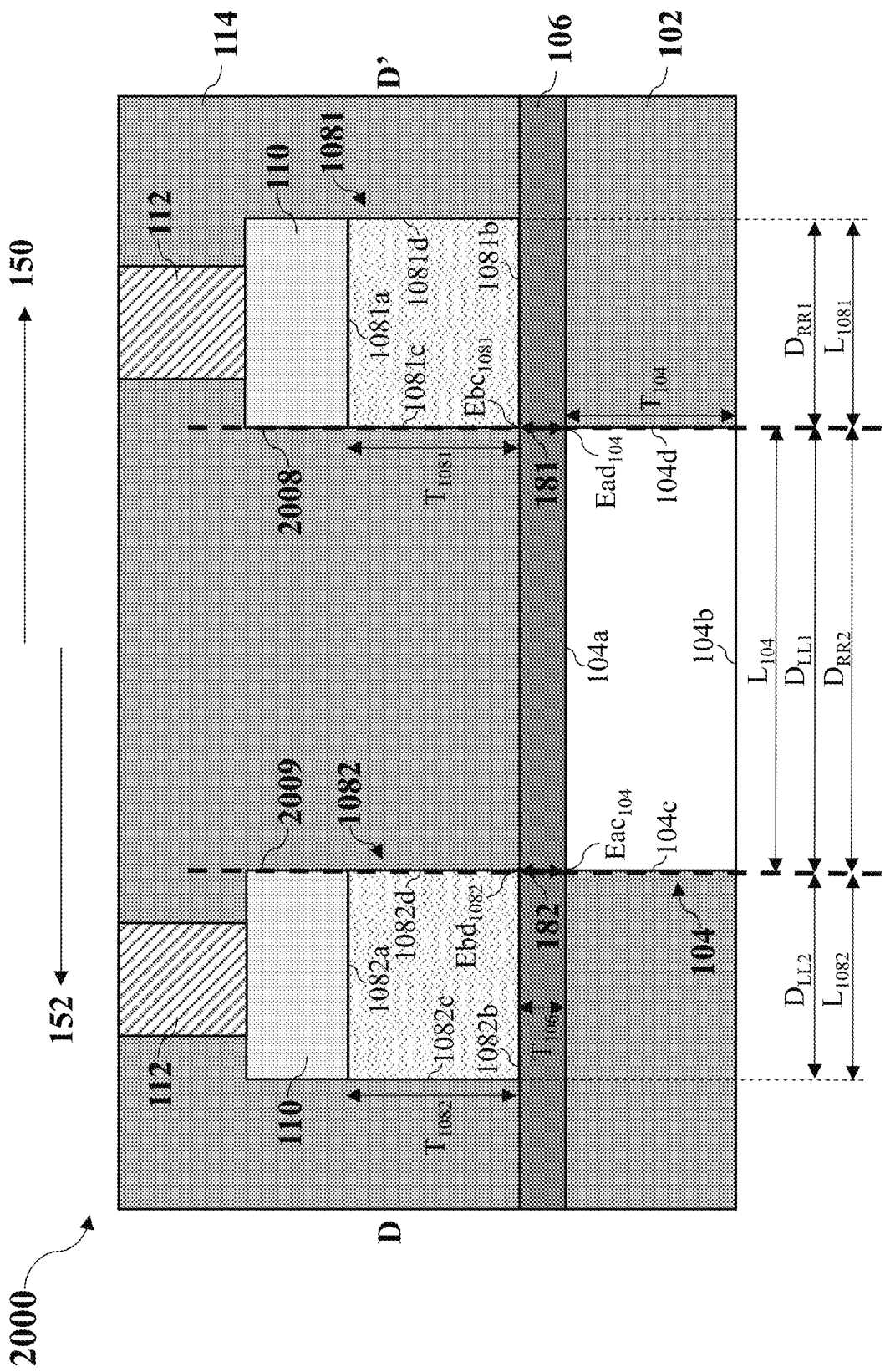

FIG. 20A shows a simplified perspective view of a memory device 2000 according to alternative non-limiting embodiments. FIG. 20B shows a simplified top view of the memory device 2000 and FIG. 20C shows a simplified cross-sectional view of the memory device 2000 along the line F-F' of FIG. 20B. The memory device 2000 may be a 1T2R memory device.

As shown in FIGS. 20A to 20C, the memory device 2000 may include a first substantially planar top electrode 1081 and a second substantially planar top electrode 1082. Each top electrode 1081, 1082 may include surfaces 1081a-1081f, 1082a-1082f similar to those of the top electrode 108 of the memory device 100 as described above. The dimensions $W_{1081}$, $L_{1081}$, $T_{1081}$, $W_{1082}$, $L_{1082}$, $T_{1082}$ of the top electrodes 1081, 1082 of the memory device 2000 may also be similar to those of the top electrode 108 of the memory device 100. As shown in FIGS. 20A to 20C, the first and second top electrodes 1081, 1082 may be arranged relative to the bottom electrode 104 in a manner similar to the arrangement between the top electrode 108 and the bottom electrode 104 of the memory device 100. In particular, the edge $Ebc_{1081}$ of the first top electrode 1081 and the edge $Ead_{104}$ of the bottom electrode 104 may at least partially extend along a same first vertical plane 2008; whereas, the edge $Ebd_{1082}$ of the second top electrode 1082 and the edge $Eac_{104}$ of the bottom electrode 104 may at least partially extend along a same second vertical plane 2009 substantially parallel to and laterally spaced apart from the first vertical plane 2008. A distance $D_{LR1}$ between the left surface 1081c of the first top electrode 1081 and the right surface 104d of the bottom electrode 104 may be smaller than a distance $D_{LL1}$ between the left surfaces 1081c, 104c of the first top electrode 1081 and the bottom electrode 104, and a distance $D_{RR1}$ between the right surfaces 1081d, 104d of the first top electrode 1081 and the bottom electrode 104. Similarly, a distance $D_{RL2}$ between the right surface 1082d of the second top electrode 1082 and the left surface 104c of the bottom electrode 104 may be smaller than a distance $D_{RR2}$ between the right surfaces 1082d, 104d of the second top electrode 1082 and the bottom electrode 104, and a distance $D_{LL2}$ between the left surfaces 1082c, 104c of the second top electrode 1082 and the bottom electrode 104. The distances $D_{LR1}$, $D_{LL1}$, $D_{RR1}$, $D_{RL2}$, $D_{LL2}$, $D_{RR2}$ are parallel to the X-axis.

As shown in FIG. 20C, upon application of a sufficiently large potential difference between the first top electrode 1081 and the bottom electrode 104 of the memory device 2000, first conducting filaments 181 may be formed between these electrodes 104, 1081; whereas, upon application of a sufficiently large potential difference between the second top electrode 1082 and the bottom electrode 104 of the memory device 2000, second conducting filaments 182 may be formed between these electrodes 104, 1082. The first conducting filaments 181 may be formed and confined between the edge $Ead_{104}$ of the bottom electrode 104 and the edge $Ebc_{1081}$ of the first top electrode 1081. Similarly, the second conducting filaments 182 may be formed and confined between the edge $Eac_{104}$ of the bottom electrode 104 and the edge $Ebd_{1082}$ of the second top electrode 1082.

Figure 21:
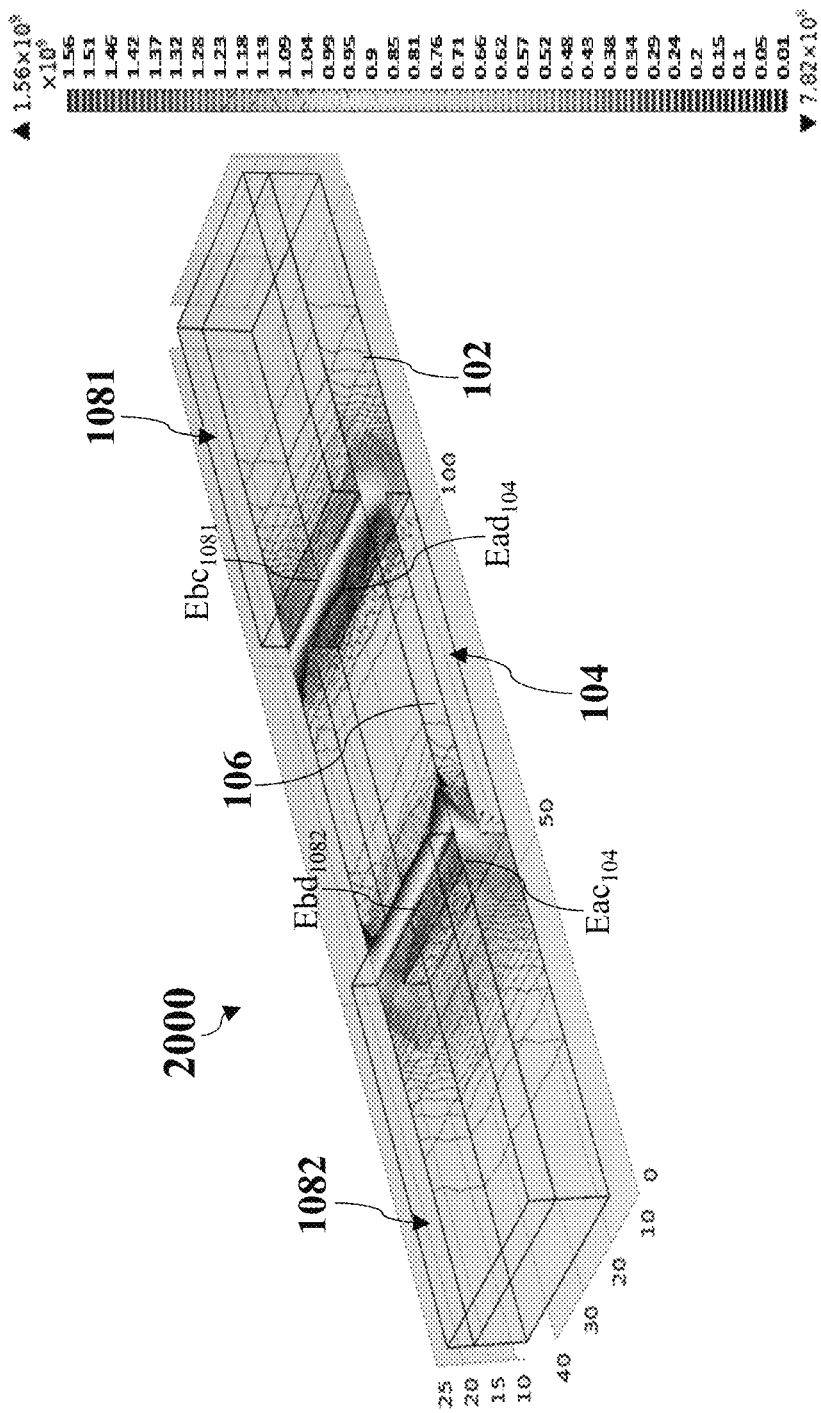
FIG. 21 shows simulated electric fields in the memory device of FIGS. 20A to 20C.

FIG. 21 shows simulated electric fields formed in the memory device 2000 when sufficiently large potential differences are applied between the first top electrode 1081 and the bottom electrode 104, and between the second top electrode 1082 and the bottom electrode 104. For clarity of illustration, some reference numerals are omitted from FIG. 21. As shown in FIG. 21, the electric field strengths at the edge $Ead_{104}$ of the bottom electrode 104, at the edge $Ebc_{1081}$ of the first top electrode 1081, at the edge $Eac_{104}$ of the bottom electrode 104, and at the edge $Ebd_{1082}$ of the second top electrode 1082 are higher than the electric field strengths at other parts of the memory device 2000. Accordingly, formation of the conducting filaments (e.g. conducting filaments 181, 182 of FIG. 20C) may be confined between the edges $Ebc_{1081}$, $Ead_{104}$ and between the edges $Ebd_{1082}$, $Eac_{104}$ where the strengths of the electric fields are the highest.

Figure 22:
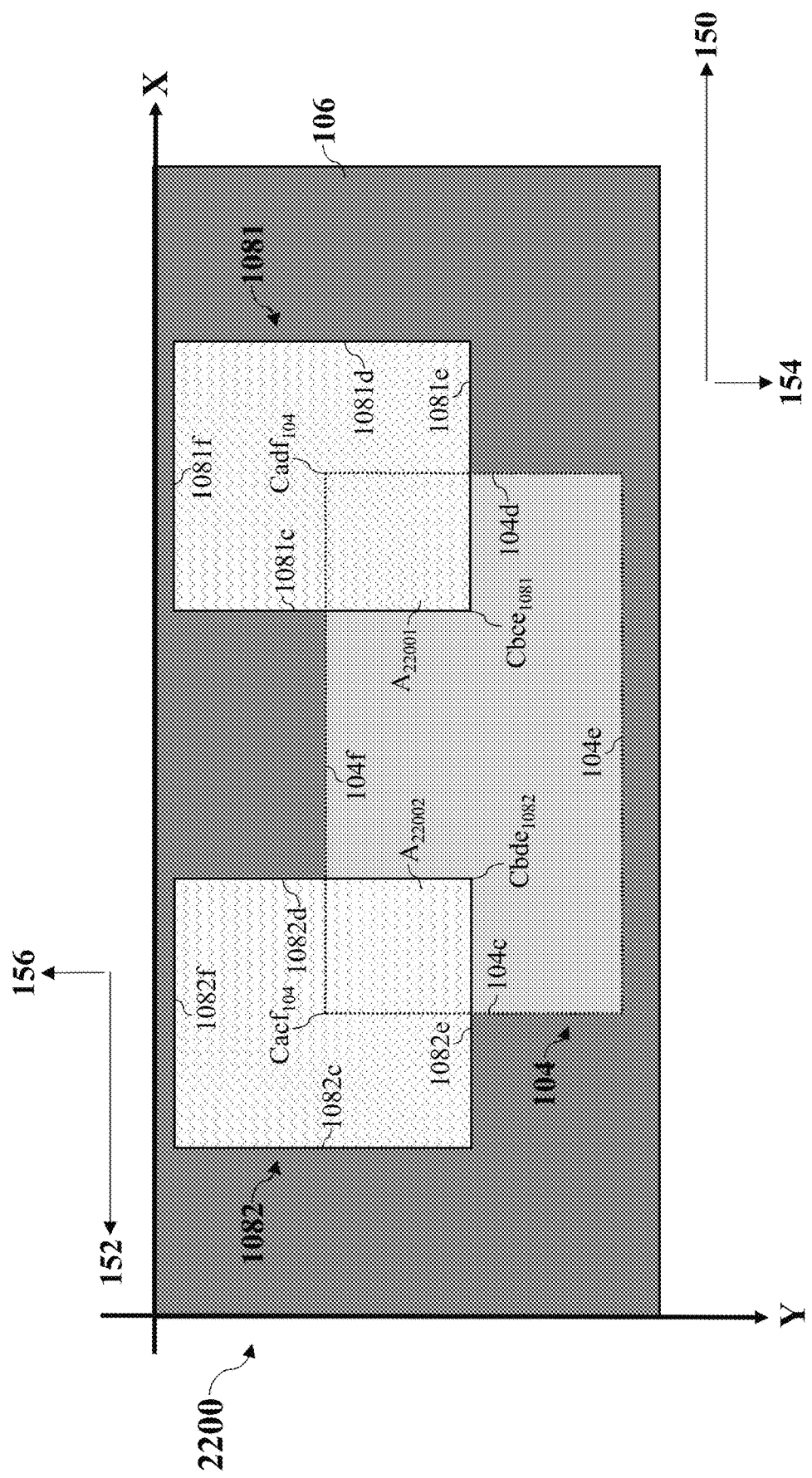
FIG. 22 shows a simplified top view of a memory device according to alternative non-limiting embodiments.

FIG. 22 shows a simplified top view of a memory device 2200 according to alternative non-limiting embodiments. The memory device 2200 is similar to the memory device 2000, and thus, the common features are labelled with the same reference numerals and need not be discussed. The memory device 2200 may be a 1T2R memory device.

In the memory device 2200, the arrangement between each top electrode 1081, 1082 and the bottom electrode 104 may be similar to the arrangement between the top electrodes 108 and the bottom electrodes 104 of the memory devices 800, 1200. In particular, the top surface 104a of the bottom electrode 104 may partially overlap with both the bottom surfaces 1081b, 1082b of the top electrodes 1081, 1082, such that it may overlap with a corner $Cbce_{1081}$ of the first top electrode 1081 and with a corner $Cbde_{1082}$ of the second top electrode 1082. The bottom surface 1081b of the first top electrode 1081 may overlap with a first corner $Cadf_{104}$ of the bottom electrode 104; whereas the bottom surface 1082b of the second top electrode 1082 may overlap with a second corner $Cacf_{104}$ of the bottom electrode 104. When a sufficiently large potential difference is applied between the first top electrode 1081 and the bottom electrode 104, conducting filaments may be formed and confined between the corners $Cadf_{104}$, $Cbce_{1081}$ of the respective electrodes 104, 1081. Similarly, when a sufficiently large potential difference is applied between the second top electrode 1082 and the bottom electrode 104, conducting filaments may be formed and confined between the corners $Cacf_{104}$, $Cbde_{1082}$ of the respective electrodes 104, 1082.

Figure 23:
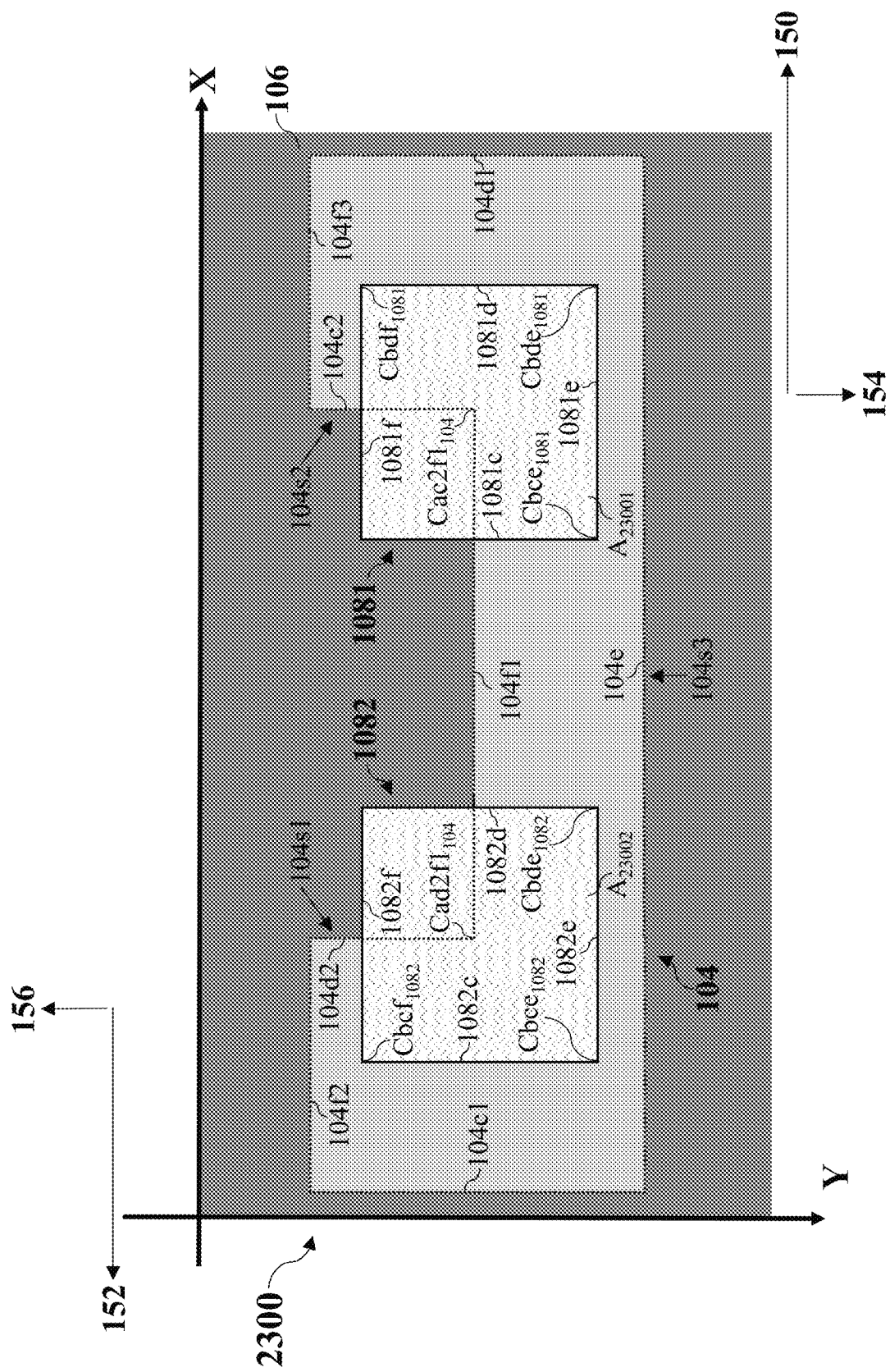
FIG. 23 shows a simplified top view of a memory device according to alternative non-limiting embodiments.

FIG. 23 shows a simplified top view of a memory device 2300 according to alternative non-limiting embodiments. The memory device 2300 is similar to the memory device 2200, and thus, the common features are labelled with the same reference numerals and need not be discussed. The memory device 2300 may be a 1T2R memory device.

As compared to the memory device 2200, the bottom electrode 104 in the memory device 2300 may be of a different shape. In particular, the bottom electrode 104 of the memory device 2300 may be similar in shape as that in the memory device 1700, with similar first to third segments 104s1, 104s2, 104s3, and surfaces including a front surface 104e, first, second and third back surfaces 104f1, 104f2, 104f3, first and second left surfaces 104c1, 104c2, and first and second right surfaces 104d1, 104d2.

In the memory device 2300, the bottom surface 1081b of the first top electrode 1081 may overlap with a first corner $Cac2f1_{104}$ of the bottom electrode 104 and the bottom surface 1082b of the second top electrode 1082 may overlap with a second corner $Cad2f1_{104}$ of the bottom electrode 104. The first corner $Cac2f1_{104}$ of the bottom electrode 104 may lie between the second and third segments 104s2, 104s3, and the second corner $Cad2f1_{104}$ of the bottom electrode 104 may lie between the first and second segments 104s1, 104s2. In addition, the top surface 104a of the bottom electrode 104 may overlap with multiple corners $Cbdf_{1081}$, $Cbde_{1081}$, $Cbce_{1081}$ of the first top electrode 1081, among which the corner $Cbde_{1081}$ may be nearest to the first corner $Cac2f1_{104}$ of the bottom electrode 104. Similarly, the top surface 104a of the bottom electrode 104 may also overlap with multiple corners $Cbcf_{1082}$, $Cbce_{1082}$, $Cbde_{1082}$ of the second top electrode 1082, among which the corner $Cbce_{1082}$ may be nearest to the second corner $Cad2f1_{104}$ of the bottom electrode 104.

Accordingly, when a sufficiently large potential difference is applied between the first top electrode 1081 and the bottom electrode 104, conducting filaments may be formed and confined between the corners $Cbde_{1081}$, $Cac2f1_{104}$ of the respective electrodes 1081, 104. Similarly, when a sufficiently large potential difference is applied between the second top electrode 1082 and the bottom electrode 104, conducting filaments may be formed and confined between the corners $Cbce_{1082}$, $Cad2f1_{104}$ of the respective electrodes 1082, 104. As compared to the overlap area $A_{22001}$, $A_{22002}$ between each top electrode 1081, 1082 and the bottom electrode 104 in the memory device 2200, the overlap area $A_{23001}$, $A_{23002}$ between each top electrode 1081, 1082 and the bottom electrode 104 in the memory device 2300 may be greater. Hence, the electric field strengths between the corners $Cbde_{1081}$, $Cac2f1_{104}$, and between the corners $Cbce_{1082}$, $Cad2f1_{104}$ may be higher and in turn, stronger conducting filaments may be formed between the bottom electrode 104 and each top electrode 1081, 1082.

Figure 24A:
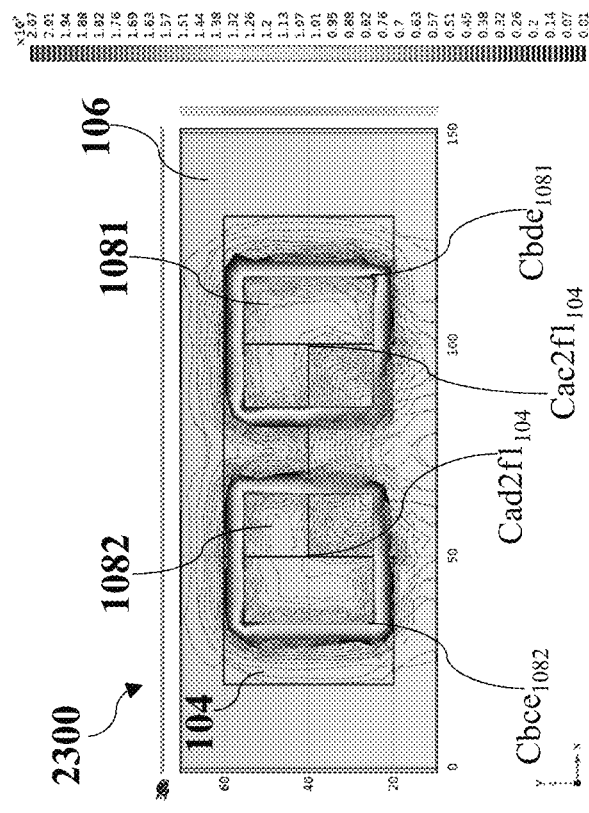
FIGS. 24A and 24B show simulated electric fields in the memory device of FIG. 23.
Figure 24B:
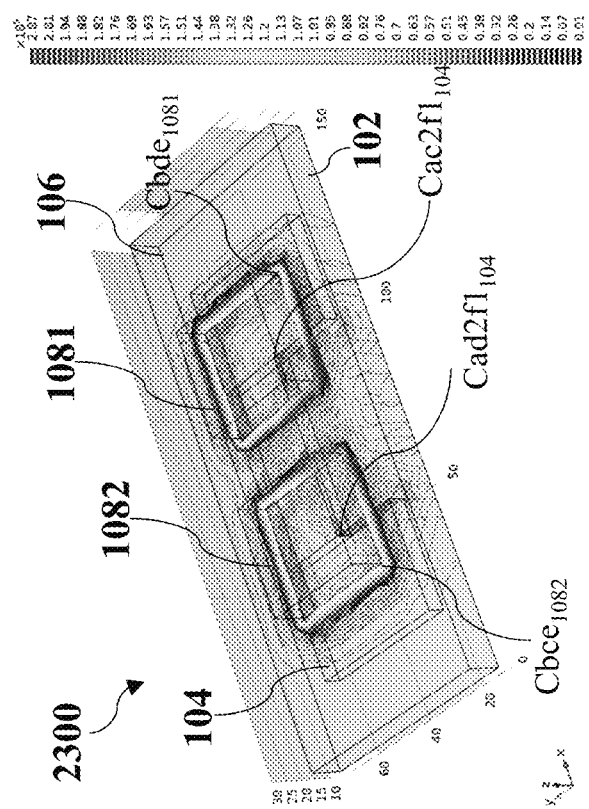

FIGS. 24A and 24B respectively show a perspective view and a top view of the memory device 2300 with simulated electric fields formed therein, when a sufficiently large potential difference is applied between the first top electrode 1081 and the bottom electrode 104, and between the second top electrode 1082 and the bottom electrode 104. For clarity of illustration, some reference numerals are omitted from FIGS. 24A and 24B.

As shown in FIGS. 24A and 24B, the electric field strengths at the corner $Cbde_{1081}$ of the first top electrode 1081 may be higher than that at other parts of the first top electrode 1081. Similarly, the electric field strength at the corner $Cbce_{1082}$ of the second top electrode 1082 may be higher than that at other parts of the second top electrode 1082. Therefore, conducting filaments may be formed and confined between the corner $Cbde_{1081}$ of the first top electrode 1081 and the first corner $Cac2f1_{104}$ of the bottom electrode 104, and between the corner $Cbce_{1082}$ of the second top electrode 1082 and the second corner $Cad2f1_{104}$ of the bottom electrode 104.

Figure 25:
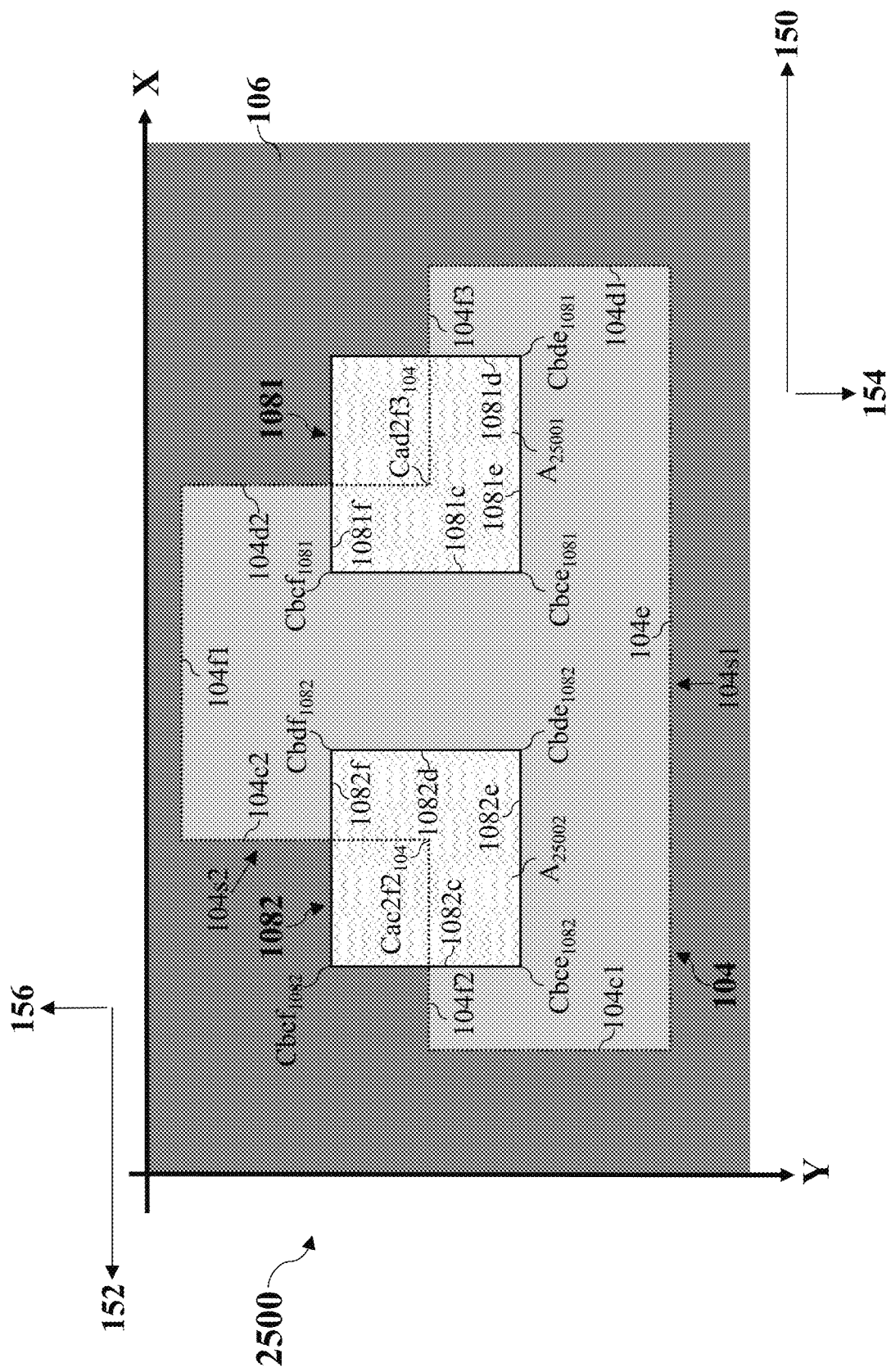
FIG. 25 shows a simplified top view of a memory device according to alternative non-limiting embodiments.

FIG. 25 shows a simplified top view of a memory device 2500 according to alternative non-limiting embodiments. The memory device 2500 is similar to the memory device 2200, and thus, the common features are labelled with the same reference numerals and need not be discussed. The memory device 2500 may be a 1T2R memory device.

As compared to the memory device 2200, the bottom electrode 104 in the memory device 2500 may be of a different shape. In particular, the bottom electrode 104 may include a first segment 104s1 and a second segment 104s2 substantially perpendicular to and approximately in the middle of the first segment 104s1. In other words, the bottom electrode 104 may have T-shaped top and bottom surfaces 104a, 104b. As shown in FIG. 25, the bottom electrode 104 may also include a front surface 104e, first and second left surfaces 104c1, 104c2, first and second right surfaces 104d1, 104d2 and first, second and third back surfaces 104f1, 104f2, 104f3.

As shown in FIG. 25, the bottom surface 1081b of the first top electrode 1081 may overlap with a first corner $Cad2f3_{104}$ of the bottom electrode 104, and the bottom surface 1082b of the second top electrode 1082 may overlap with a second corner $Cac2f2_{104}$ of the bottom electrode 104. The first and second corners $Cad2f3_{104}$, $Cac2f2_{104}$ of the bottom electrode 104 may both lie between the first and second segments 104s1, 104s2 but on opposite sides of the second segment 104s2. The top surface 104a of the bottom electrode 104 may overlap with multiple corners $Cbcf_{1081}$, $Cbce_{1081}$, $Cbde_{1081}$ of the first top electrode 1081, among which the corner $Cbce_{1081}$ may be nearest to the first corner $Cad2f3_{104}$ of the bottom electrode 104. The top surface 104a of the bottom electrode 104 may also overlap with multiple corners $Cbdf_{1082}$, $Cbde_{1082}$, $Cbce_{1082}$ of the second top electrode 1082, among which the corner $Cbde_{1082}$ may be nearest to the second corner $Cac2f2_{104}$ of the bottom electrode 104.

Accordingly, when a sufficiently large potential difference is applied between the first top electrode 1081 and the bottom electrode 104, conducting filaments may be formed and confined between the corners $Cbce_{1081}$, $Cad2f3_{104}$ of the respective electrodes 1081, 104. Similarly, when a sufficiently large potential difference is applied between the second top electrode 1082 and the bottom electrode 104, conducting filaments may be formed and confined between the corners $Cbde_{1082}$, $Cac2f2_{104}$ of the respective electrodes 1082, 104. As compared to the overlap area $A_{22001}$, $A_{22002}$ between each top electrode 1081, 1082 and the bottom electrode 104 in the memory device 2200, the overlap area $A_{25001}$, $A_{25002}$ between each top electrode 1081, 1082 and the bottom electrode 104 in the memory device 2500 may be greater. Hence, the electric field strengths between the corners $Cbce_{1081}$, $Cad2f3_{104}$, and between the corners $Cbde_{1082}$, $Cac2f2_{104}$ may be higher and in turn, stronger conducting filaments may be formed between the bottom electrode 104 and each top electrode 1081, 1082.

Figure 26B:
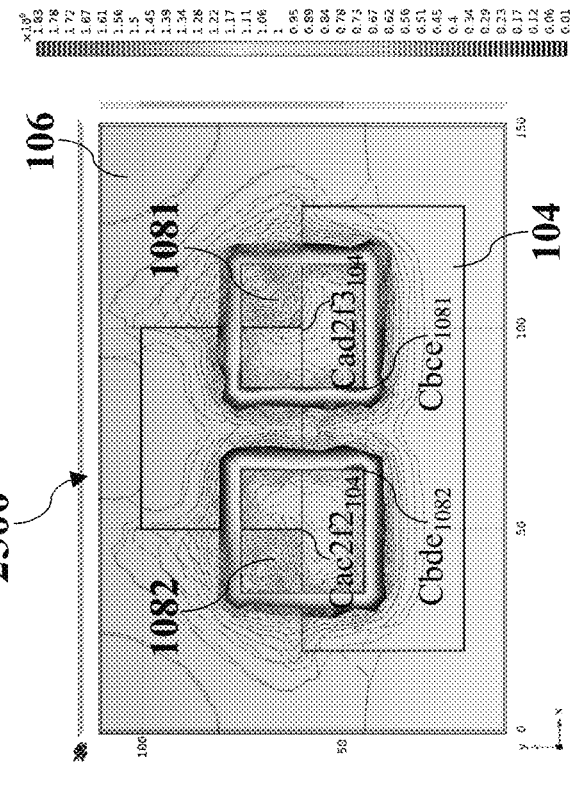
FIGS. 26A and 26B show simulated electric fields in the memory device of FIG. 25.
Figure 26A:
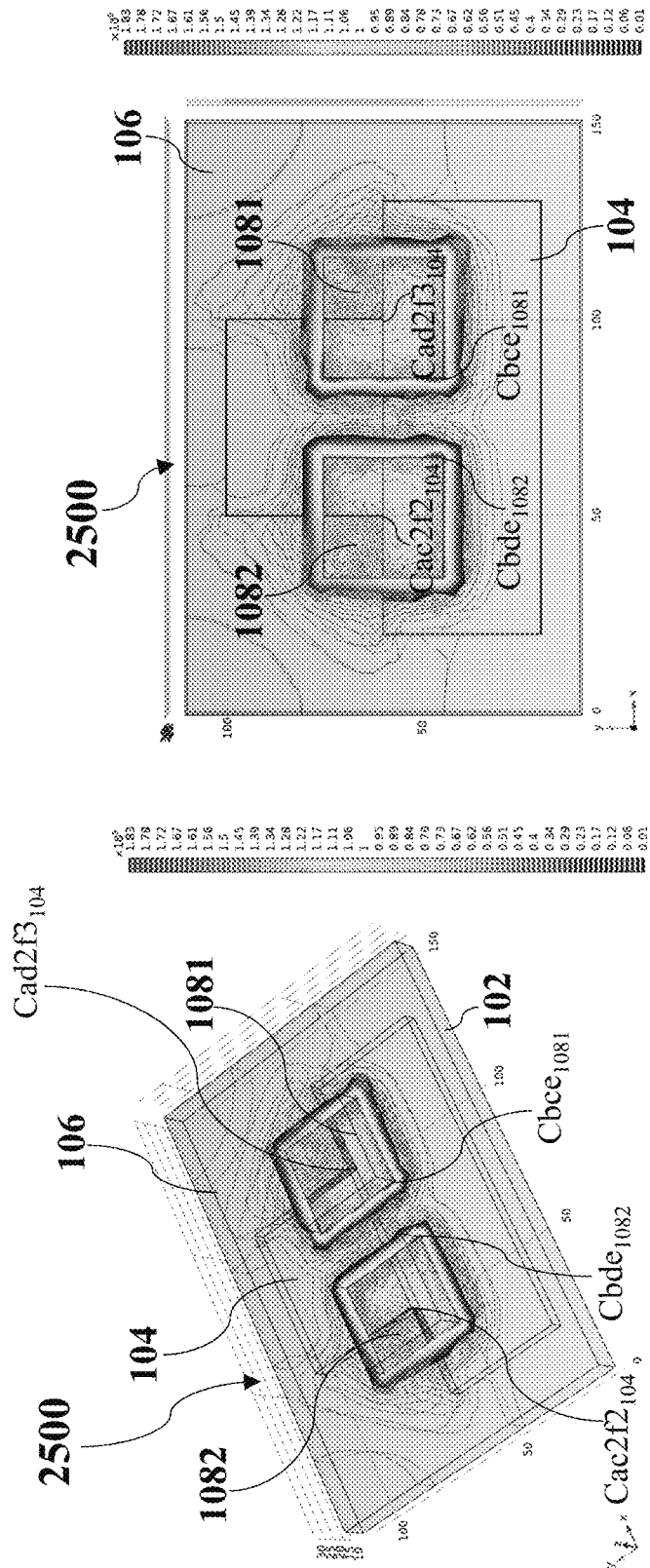

FIGS. 26A and 26B respectively show a perspective view and a top view of the memory device 2500 with simulated electric fields formed therein, when a sufficiently large potential difference is applied between the first top electrode 1081 and the bottom electrode 104, and between the second top electrode 1082 and the bottom electrode 104. For clarity of illustration, some reference numerals are omitted from FIGS. 26A and 26B.

As shown in FIGS. 26A and 26B, the electric field strengths at the corner $Cbce_{1081}$ of the first top electrode 1081 may be higher than that at other parts of the first top electrode 1081. Similarly, the electric field strength at the corner $Cbde_{1082}$ of the second top electrode 1082 may be higher than that at other parts of the second top electrode 1082. Therefore, conducting filaments may be formed and confined between the corner $Cbce_{1081}$ of the first top electrode 1081 and the first corner $Cad2f3_{104}$ of the bottom electrode 104, and between the corner $Cbde_{1082}$ of the second top electrode 1082 and the second corner $Cac2f2_{104}$ of the bottom electrode 104.

Figure 27:
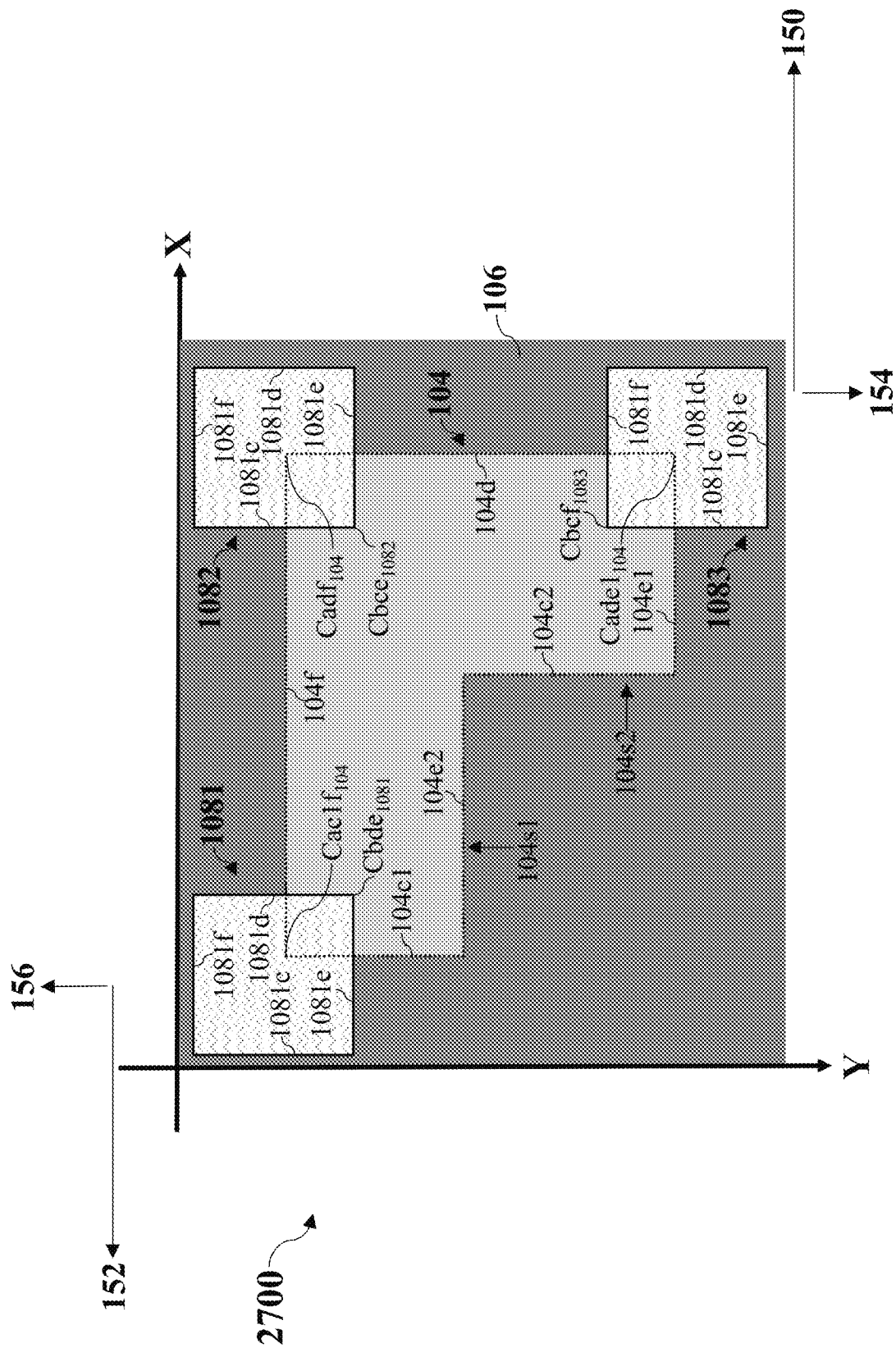
FIG. 27 shows a simplified top view of a memory device according to alternative non-limiting embodiments.
Figure 28:
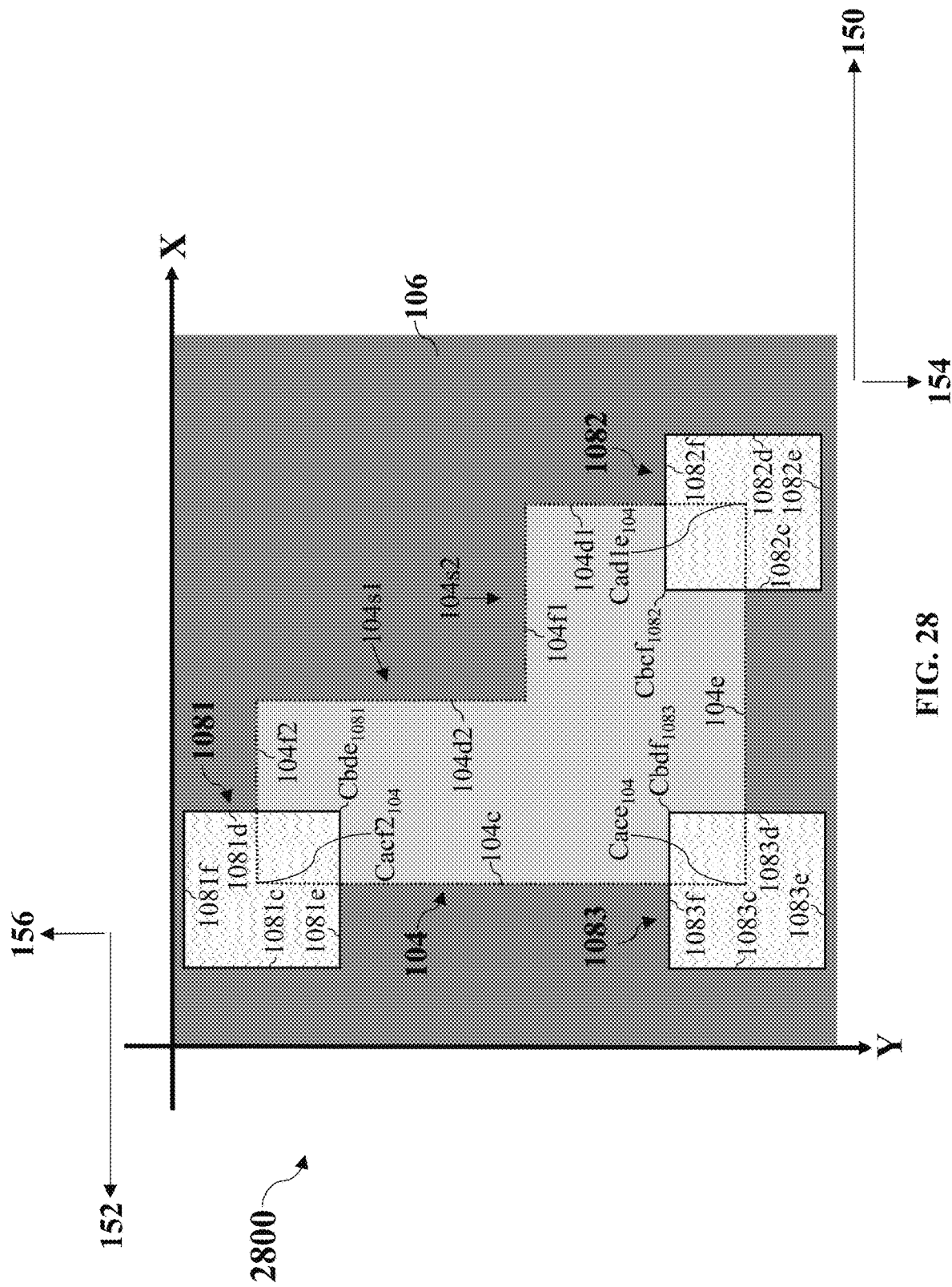
FIG. 28 shows a simplified top view of a memory device according to alternative non-limiting embodiments.

FIGS. 27 and 28 respectively show simplified top views of a memory device 2700 and a memory device 2800 according to alternative non-limiting embodiments. The memory devices 2700, 2800 may be 1T3R memory devices.

As shown in FIGS. 27 and 28, each memory device 2700, 2800 may include a bottom electrode 104 having a first segment 104s1 and a second segment 104s2 substantially perpendicular to each other. Accordingly, the bottom electrode 104 of each memory device 2700, 2800 may have L-shaped top and bottom surfaces 104a, 104b. However, the bottom electrodes 104 of the memory devices 2700, 2800 may be oriented differently. Therefore, while the bottom electrode 104 of the memory device 2700 may include first and second front surfaces 104e1, 104e2, first and second left surfaces 104c1, 104c2, a right surface 104d and a back surface 104f, the bottom electrode 104 of the memory device 2800 may include a front surface 104e, a left surface 104c, first and second right surfaces 104d1, 104d2, and first and second back surfaces 104f1, 104f2.

Referring to FIGS. 27 and 28, each memory device 2700, 2800 may further include three top electrodes including first, second and third top electrodes 1081, 1082, 1083. In each memory device 2700, 2800, the top surface 104a of the bottom electrode 104 may overlap with a corner of each of the top electrodes 1081, 1082, 1083. In particular, in the memory device 2700, the top surface 104a of the bottom electrode 104 may overlap with corners $Cbde_{1081}$, $Cbce_{1082}$ and $Cbcf_{1083}$ of the first, second and third top electrodes 1081, 1082, 1083, respectively; whereas, in the memory device 2800, the top surface 104a of the bottom electrode 104 may overlap with corners $Cbde_{1081}$, $Cbcf_{1082}$ and $Cbdf_{1083}$ of the first, second and third top electrodes 1081, 1082, 1083, respectively. Further, the bottom surface 1081b, 1082b, 1083b of each top electrode 1081, 1082, 1083 may overlap with a corner of the bottom electrode 104. In particular, in the memory device 2700, the bottom surfaces 1081b, 1082b, 1083b of the first, second and third top electrodes 1081, 1082, 1083 may overlap with the corners $Cac1f_{104}$, $Cadf_{104}$ and $Cade1_{104}$ of the bottom electrode 104, respectively. Whereas, in the memory device 2800, the bottom surfaces 1081b, 1082b, 1083b of the first, second and third top electrodes 1081, 1082, 1083 may overlap with the corners $Cacf2_{104}$, $Cad1e_{104}$ and $Cace_{104}$ of the bottom electrode 104, respectively.

In each memory device 2700, 2800, when a sufficiently large potential difference is applied between one of the top electrodes 1081/1082/1083 and the bottom electrode 104, conducting filaments may be formed and confined between the corner of the top electrode 1081/1082/1083 overlapping the top surface 104a of the bottom electrode 104, and the corner of the bottom electrode 104 overlapping the bottom surface 1081b/1082b/1083b of the top electrode 1081/1082/1083. For example, in the memory device 2700, conducting filaments may be formed and confined between the corners $Cbde_{1081}$ and $Cac1f_{104}$, the corners $Cbce_{1082}$ and $Cadf_{104}$, and/or the corners $Cbcf_{1083}$ and $Cade1_{104}$; whereas, in the memory device 2800, conducting filaments may be formed and confined between the corners $Cbde_{1081}$ and $Cacf2_{104}$, the corners $Cbcf_{1082}$ and $Cad1e_{104}$, and the corners $Cbdf_{1083}$ and $Cace_{104}$.

FIGS. 29, 31, 32 and 34 respectively show simplified top views of memory devices 2900, 3100, 3200, 3400 according to alternative non-limiting embodiments. FIGS. 30A and 30B respectively show a perspective view and a top view of the memory device 2900 with simulated electric fields formed therein. FIGS. 33A and 33B respectively show a perspective view and a top view of the memory device 3200 with simulated electric fields formed therein. FIGS. 35A and 35B respectively show a perspective view and a top view of the memory device 3400 with simulated electric fields formed therein. The memory devices 2900, 3100, 3200, 3400 may be 1T4R memory devices.

As shown in FIGS. 29-34, the memory devices 2900, 3100, 3200, 3400 may be similar to one another. In particular, each memory device 2900, 3100, 3200, 3400 may include a single bottom electrode 104 and four top electrodes including a first top electrode 1081, a second top electrode 1082, a third top electrode 1083 and a fourth top electrode 1084. The top electrodes 1081-1084 of each memory device 2900, 3100, 3200, 3400 may each be a cuboid having surfaces 1081a-1081f, 1082a-1082f, 1083a-1083f and 1084a-1084f similar to the top electrode 108 of the memory device 100.

Comparing the memory device 2900 with the memory device 3100, the bottom electrode 104 of each of these memory devices 2900, 3100 may also be a cuboid having surfaces 104a-104f, where the bottom electrode 104 may be larger than each top electrode 1081-1084. However, the relative arrangement between the top electrodes 1081-1084 and the bottom electrode 104 in the memory device 2900 may be different from that in the memory device 3100.

Figure 29:
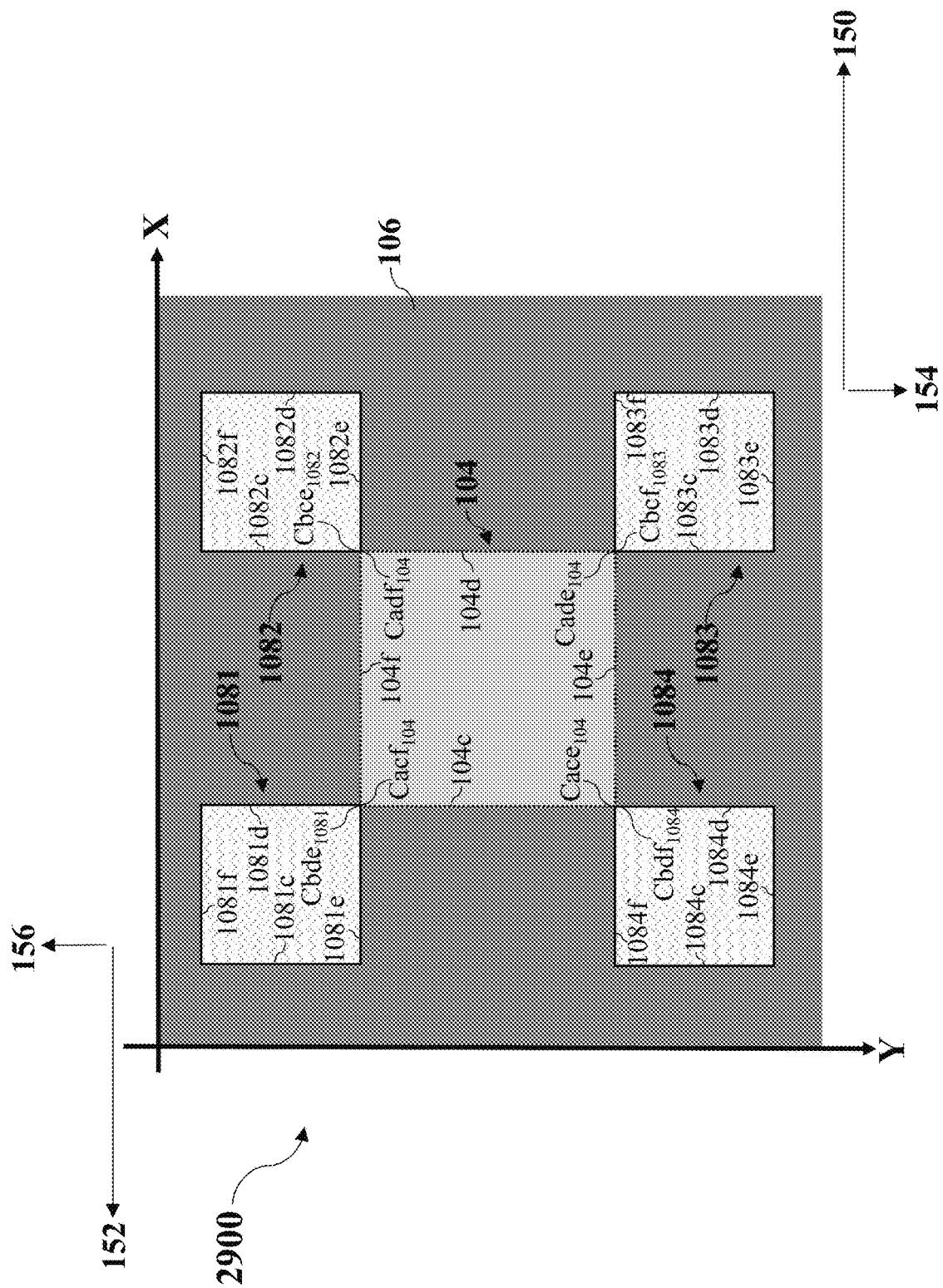
FIG. 29 shows a simplified top view of a memory device according to alternative non-limiting embodiments.
Figure 30B:
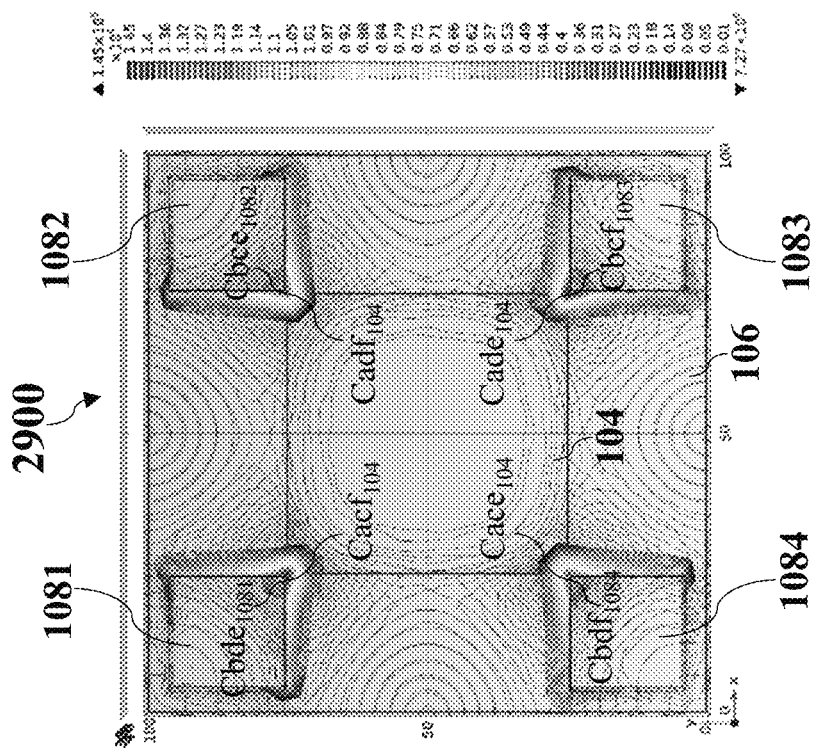
FIGS. 30A and 30B show simulated electric fields in the memory device of FIG. 29.
Figure 30A:
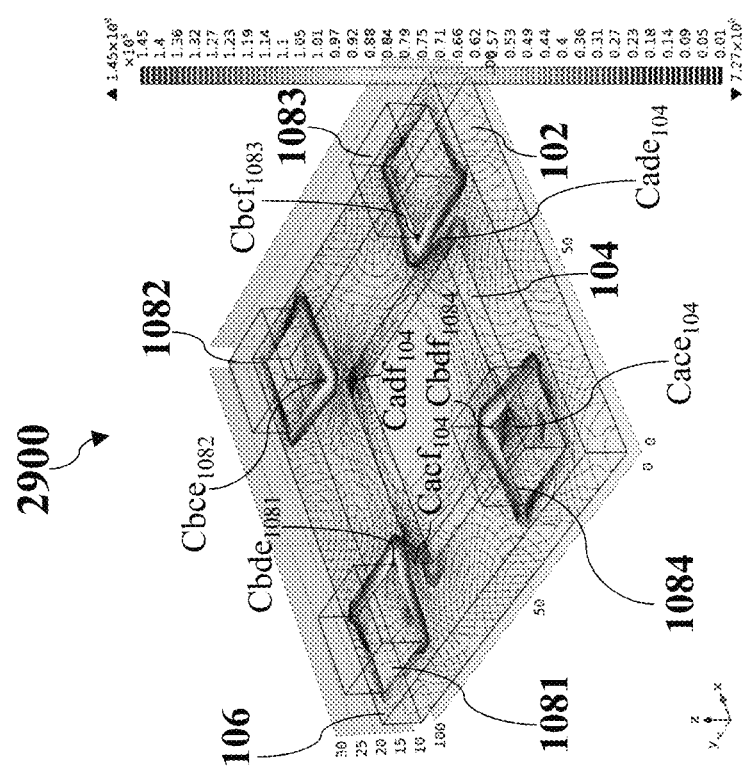

In particular, referring to FIG. 29, in the memory device 2900, each top electrode 1081-1084 may be arranged relative to the bottom electrode 104 in a manner similar to that in the memory device 400. Accordingly, the corners $Cbde_{1081}$, $Cbce_{1082}$, $Cbcf_{1083}$, $Cbdf_{1084}$ of the first, second, third and fourth top electrodes 1081-1084 may be vertically aligned with the corners $Cacf_{104}$, $Cadf_{104}$, $Cade_{104}$, $Cace_{104}$ of the bottom electrode 104. As shown in FIGS. 30A and 30B, the electric field strengths between the corners $Cbde_{1081}$, $Cbce_{1082}$, $Cbcf_{1083}$, $Cbdf_{1084}$ of the top electrodes 1081-1084 and the respective vertically aligned corners $Cacf_{104}$, $Cadf_{104}$, $Cade_{104}$, $Cace_{104}$ of the bottom electrode 104 may be higher than that at other parts of the memory device 2900. Conducting filaments may thus be formed and confined between the corners $Cbde_{1081}$, $Cbce_{1082}$, $Cbcf_{1083}$, $Cbdf_{1084}$ of the top electrodes 1081-1084 and the corners $Cacf_{104}$, $Cadf_{104}$, $Cade_{104}$, $Cace_{104}$ of the bottom electrode 104, respectively.

Figure 31:
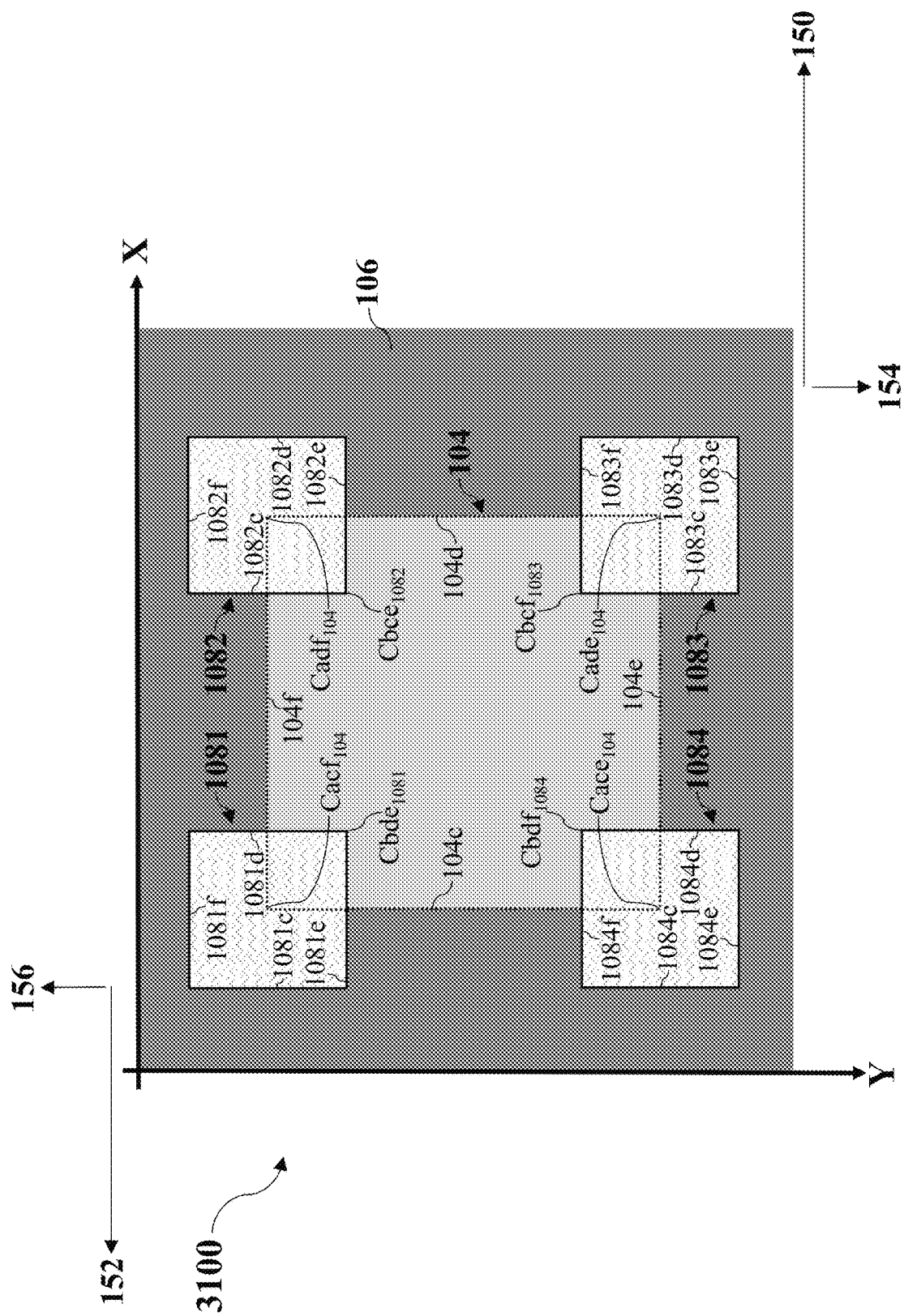
FIG. 31 shows a simplified top view of a memory device according to alternative non-limiting embodiments.

On the other hand, referring to FIG. 31, in the memory device 3100, each top electrode 1081-1084 may be arranged relative to the bottom electrode 104 in a manner similar to that in the memory device 800. Accordingly, the top surface 104a of the bottom electrode 104 may overlap with a corner $Cbde_{1081}$ of the first top electrode 1081, a corner $Cbce_{1082}$ of the second top electrode 1082, a corner $Cbcf_{1083}$ of the third top electrode 1083 and a corner $Cbdf_{1084}$ of the fourth top electrode 1084. The bottom surfaces 1081b, 1082b, 1083b, 1084b of the first, second, third and fourth top electrodes 1081-1084 may overlap with corners $Cacf_{104}$, $Cadf_{104}$, $Cade_{104}$ and $Cace_{104}$ of the bottom electrode 104, respectively. Conducting filaments may thus be formed and confined between the corners $Cbde_{1081}$, $Cbce_{1082}$, $Cbcf_{1083}$, $Cbdf_{1084}$ of the top electrodes 1081-1084 and the corners $Cacf_{104}$, $Cadf_{104}$, $Cade_{104}$ and $Cace_{104}$ of the bottom electrode 104, respectively.

Similar to the memory device 3100, in the memory devices 3200, 3400, the bottom surfaces 1081b-1084b of each top electrode 1081-1084 may partially overlap with the top surface 104a of the bottom electrode 104. However, the bottom electrodes 104 of the memory devices 3200, 3400 may have a different shape as compared to the bottom electrode 104 of the memory device 3100.

Figure 32:
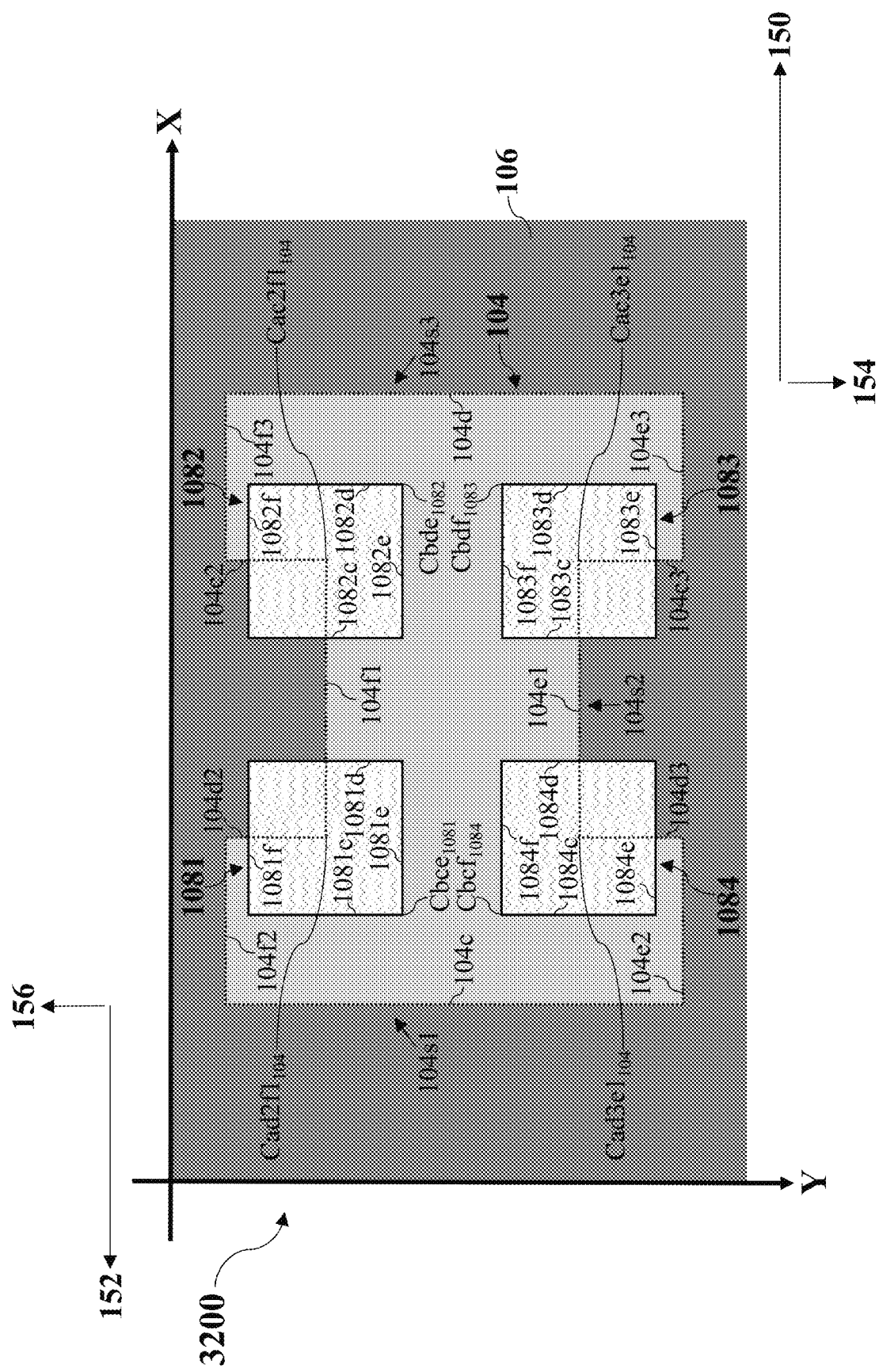
FIG. 32 shows a simplified top view of a memory device according to alternative non-limiting embodiments.
Figures 33A, 33B:
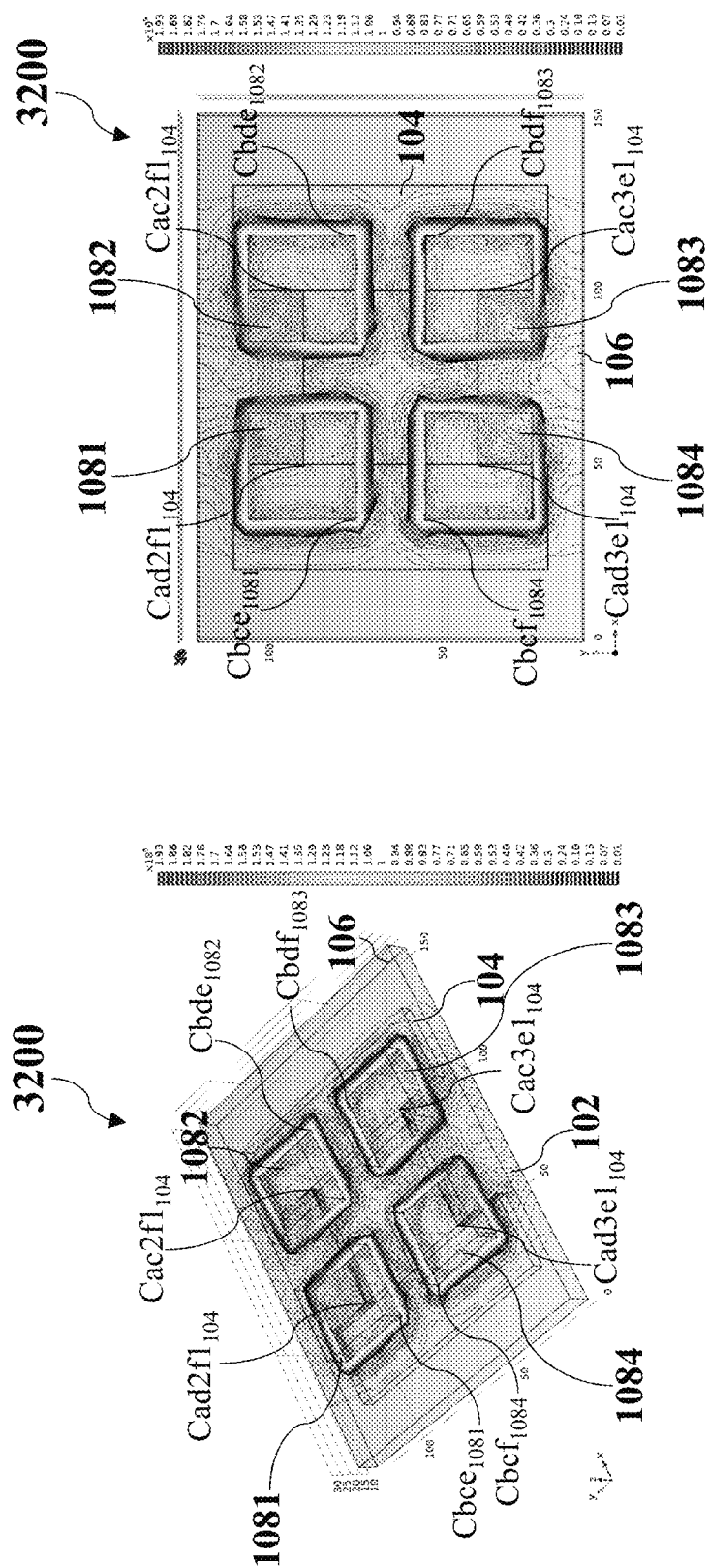
FIGS. 33A and 33B show simulated electric fields in the memory device of FIG. 32.

In particular, referring to FIG. 32, the memory device 3200 may include a bottom electrode 104 having H-shaped top and bottom surfaces 104a, 104b. In other words, the bottom electrode 104 may include a first segment 104s1, a second segment 104s2 and a third segment 104s3, where the first and third segments 104s1, 104s3 may extend substantially parallel to each other and the second segment 104s2 may extend substantially perpendicular to the first and third segments 104s1, 104s3 between these segments 104s1, 104s3. The bottom electrode 104 may thus further include a left surface 104c, a right surface 104d, first, second and third front surfaces 104e1, 104e2, 104e3, and first, second and third back surfaces 104f1, 104f2, 104f3. The bottom surfaces 1081b, 1084b of the first and fourth top electrodes 1081, 1084 may overlap with corners $Cad2f1_{104}$ and $Cad3e1_{104}$ of the bottom electrode 104 respectively, where these corners $Cad2f1_{104}$, $Cad3e1_{104}$ may lie between the first and second segments 104s1, 104s2 of the bottom electrode 104. Further, the bottom surfaces 1082b, 1083b of the second and third top electrodes 1082, 1083 may overlap with corners $Cac2f1_{104}$ and $Cac3e1_{104}$ of the bottom electrode 104 respectively, where these corners $Cac2f1_{104}$, $Cac3e1_{104}$ may lie between the second and third segments 104s2, 104s3 of the bottom electrode 104. The top surface 104a of the bottom electrode 104 may overlap with multiple corners of each top electrode 1081-1084, among which the corner $Cbce_{1081}$ of the first top electrode 1081, the corner $Cbde_{1082}$ of the second top electrode 1082, the corner $Cbdf_{1083}$ of the third top electrode 1083 and the corner $Cbcf_{1084}$ of the fourth top electrode 1084 may be respectively nearest to the corners $Cad2f1_{104}$, $Cac2f1_{104}$, $Cac3e1_{104}$, $Cad3e1_{104}$ of the bottom electrode 104.

Accordingly, as shown in FIGS. 33A and 33B, electric field strengths may be higher between the corners $Cbce_{1081}$, $Cbde_{1082}$, $Cbdf_{1083}$, $Cbcf_{1084}$ of the first, second, third and fourth top electrodes 1081-1084 and the respective corners $Cad2f1_{104}$, $Cac2f1_{104}$, $Cac3e1_{104}$, $Cad3e1_{104}$ of the bottom electrode 104 as compared to at other parts of the memory device 3200. Conducting filaments may thus be formed and confined between the corners $Cbce_{1081}$, $Cbde_{1082}$, $Cbdf_{1083}$, $Cbcf_{1084}$ of the first, second, third and fourth top electrodes 1081-1084 and the corners $Cad2f1_{104}$, $Cac2f1_{104}$, $Cac3e1_{104}$, $Cad3e1_{104}$ of the bottom electrode 104 respectively.

Figure 34:
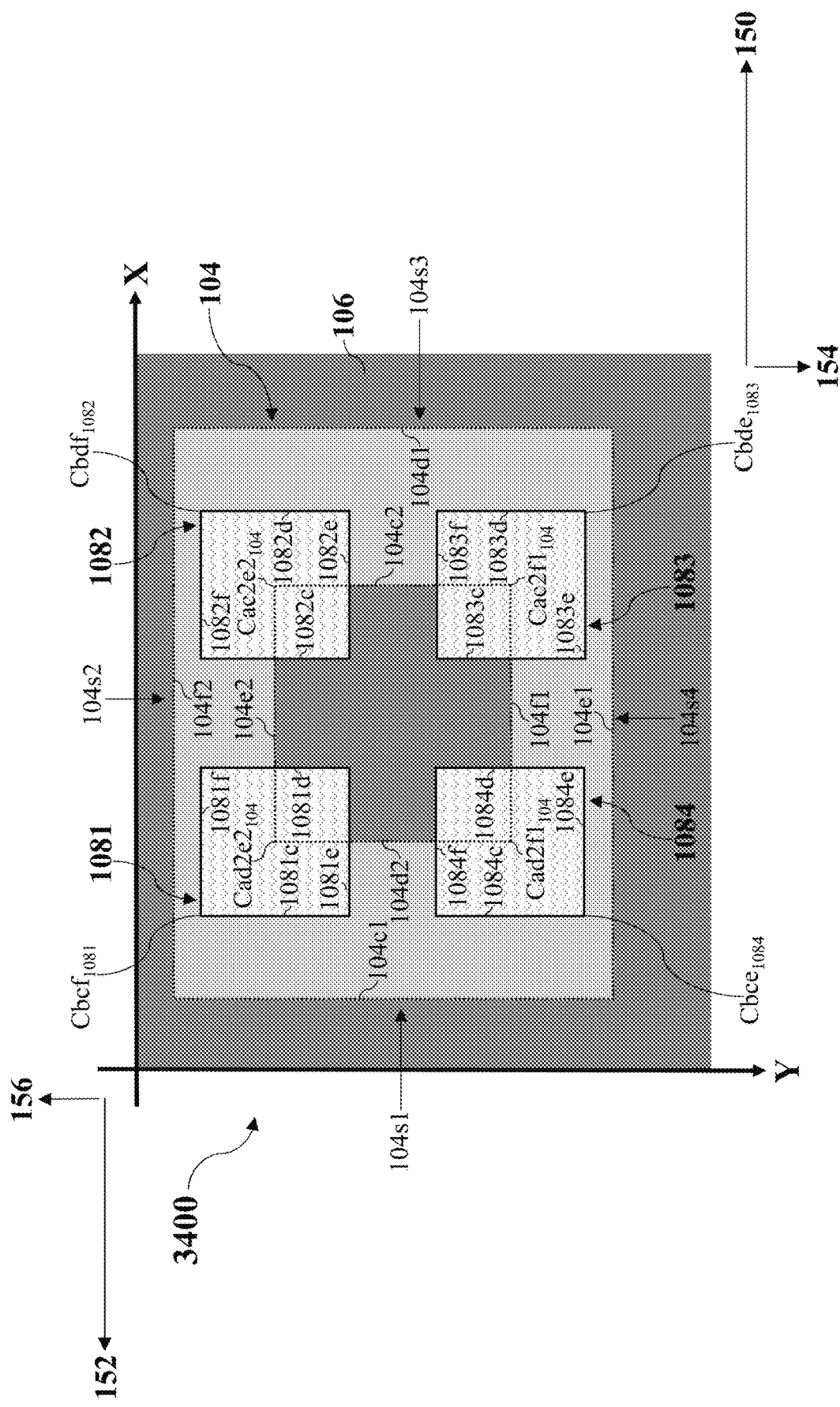
FIG. 34 shows a simplified top view of a memory device according to alternative non-limiting embodiments.
Figures 35A, 35B:
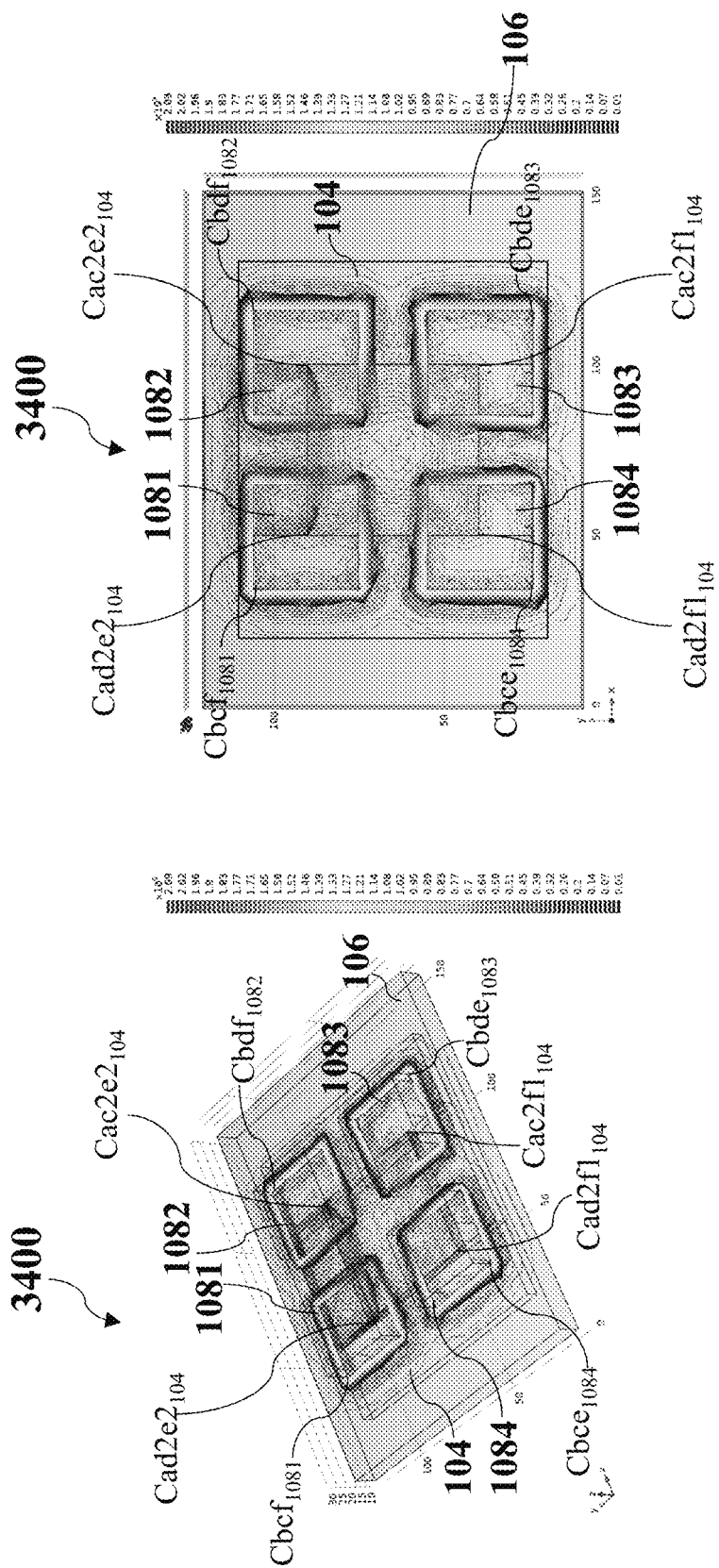
FIGS. 35A and 35B show simulated electric fields in the memory device of FIG. 34.

Referring to FIG. 34, the memory device 3400 may include a bottom electrode 104 that may be a cuboid having an elongate cuboidal hole therethrough. In particular, the bottom electrode 104 may include first, second, third and fourth segments 104s1, 104s2, 104s3, 104s4, where the first and third segments 104s1, 104s3 may be substantially parallel to each other. The second and fourth segments 104s2, 104s4 may lie between the first and third segments 104s1, 104s3, and may be substantially parallel to each other and substantially perpendicular to the first and third segments 104s1, 104s3. The bottom electrode 104 may thus further include first and second left surfaces 104c1, 104c2, first and second right surfaces 104d1, 104d2, first and second front surfaces 104e1, 104e2, and first and second back surfaces 104f1, 104f2. The bottom surfaces 1081b, 1082b, 1083b, 1084b of the first, second, third and fourth top electrodes 1081-1084 may overlap with corners $Cad2e2_{104}$, $Cac2e2_{104}$, $Cac2f1_{104}$, $Cad2f1_{104}$ of the bottom electrode 104, respectively. The corner $Cad2e2_{104}$ may lie between the first and second segments 104s1, 104s2, the corner $Cac2e2_{104}$ may lie between the second and third segments 104s2, 104s3, the corner $Cac2f1_{104}$ may lie between the third and fourth segments 104s3, 104s4 and the corner $Cad2f1_{104}$ may lie between the first and fourth segments 104s1, 104s4. The top surface 104a of the bottom electrode 104 may overlap with multiple corners of each top electrode 1081-1084. Out of these corners, the corner $Cbcf_{1081}$ of the first top electrode 1081, the corner $Cbdf_{1082}$ of the second top electrode 1082, the corner $Cbde_{1083}$ of the third top electrode 1083 and the corner $Cbce_{1084}$ of the fourth top electrode 1084 may be nearest to the corners $Cad2e2_{104}$, $Cac2e2_{104}$, $Cac2f1_{104}$ and $Cad2f1_{104}$ of the bottom electrode 104, respectively.

Accordingly, as shown in FIGS. 35A and 35B, electric field strengths may be higher between the corners $Cbcf_{1081}$, $Cbdf_{1082}$, $Cbde_{1083}$, $Cbce_{1084}$ of the first, second, third and fourth top electrodes 1081-1084 and the respective corners $Cad2e2_{104}$, $Cac2e2_{104}$, $Cac2f1_{104}$, $Cad2f1_{104}$ of the bottom electrode 104 as compared to at other parts of the memory device 3400. Conducting filaments may thus be formed and confined between the corners $Cbcf_{1081}$, $Cbdf_{1082}$, $Cbde_{1083}$, $Cbce_{1084}$ of the first, second, third and fourth top electrodes 1081-1084 and the corners $Cad2e2_{104}$, $Cac2e2_{104}$, $Cac2f1_{104}$, $Cad2f1_{104}$ of the bottom electrode 104, respectively.

Figure 36:
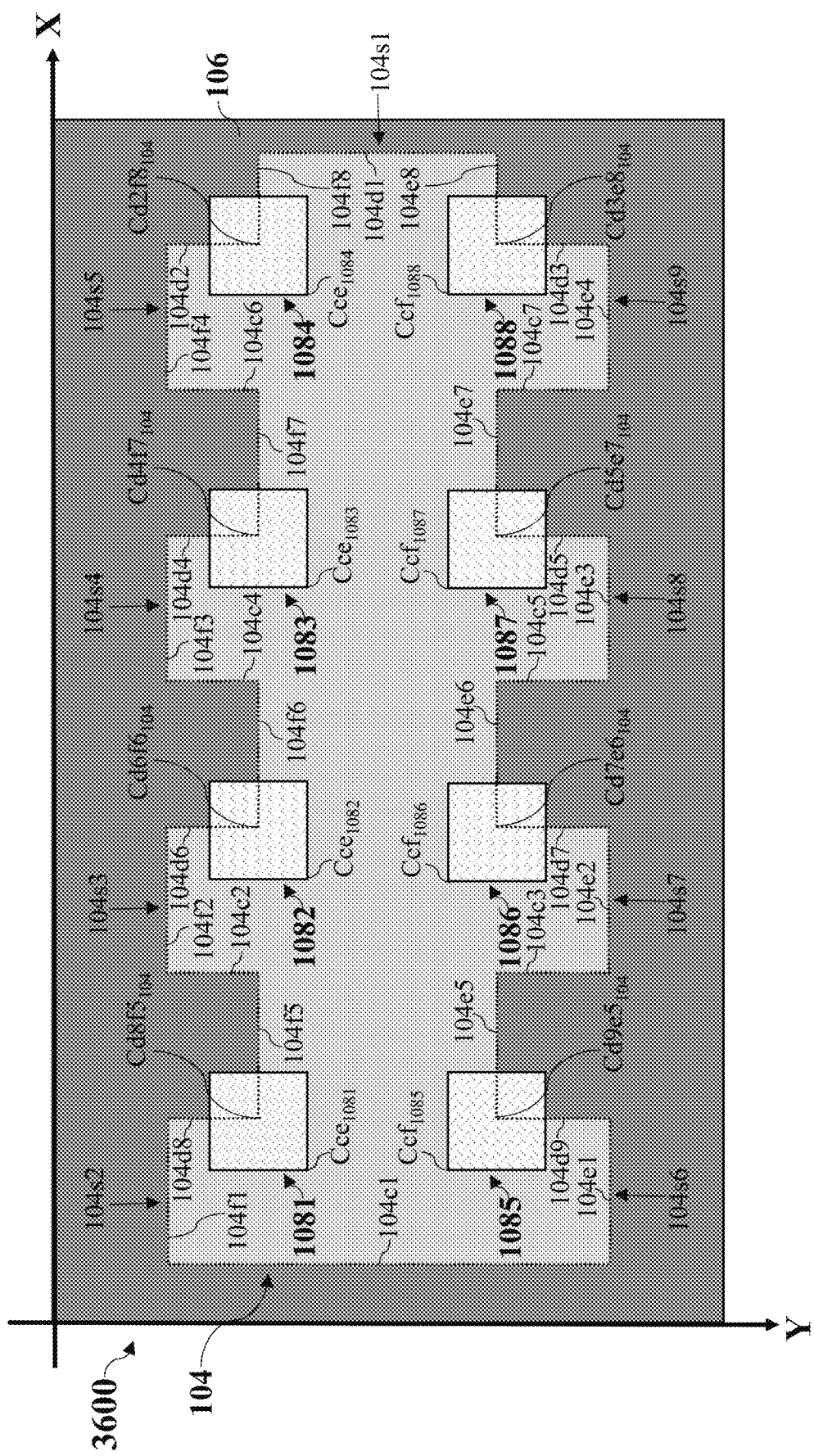
FIG. 36 shows a simplified top view of a memory device according to alternative non-limiting embodiments.
Figure 37:
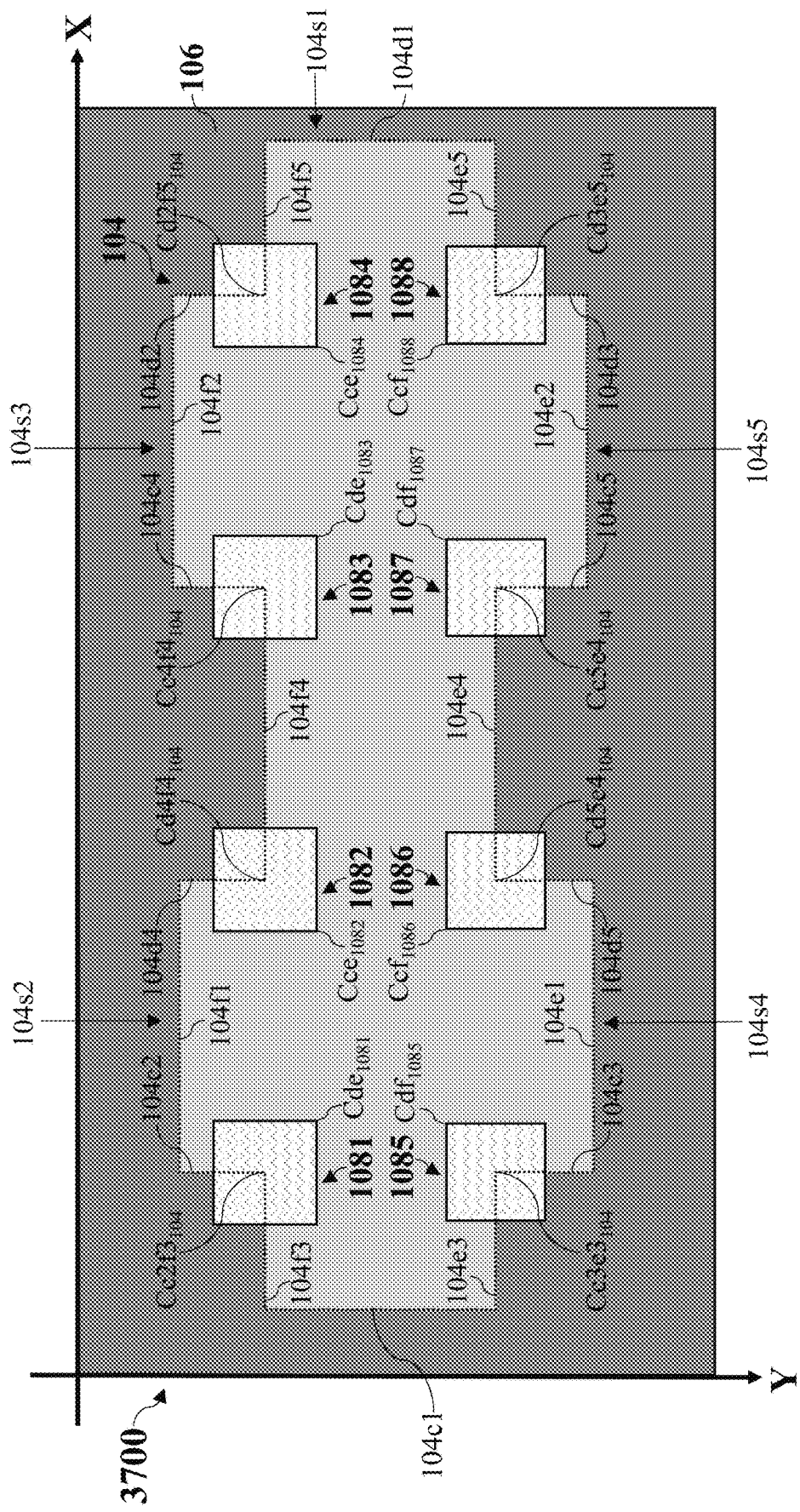
FIG. 37 shows a simplified top view of a memory device according to alternative non-limiting embodiments.

FIG. 36 and FIG. 37 respectively show simplified top views of memory devices 3600, 3700 according to alternative non-limiting embodiments. The memory devices 3600, 3700 may be 1T8R memory devices.

As shown in FIGS. 36-37, both the memory devices 3600, 3700 may include a single bottom electrode 104 and eight top electrodes 1081-1088 over the bottom electrode 104. Each top electrode 1081-1088 may be a cuboid having surfaces similar to the surfaces 108a-108f of the top electrode 108 of the memory device 100. For clarity of illustration, the surfaces of each top electrode 1081-1088 are not labelled in FIGS. 36 and 37. The bottom electrodes 104 of the memory devices 3600, 3700 may be of different shapes.

Referring to FIG. 36, the bottom electrode 104 of the memory device 3600 may include first to ninth segments 104s1-104s9. The first segment 104s1 may be a rectangular segment, and the second to ninth segments 104s2-104s9 may be side segments arranged perpendicular to and along a length of the first segment 104s1. In particular, the second to fifth segments 104s2-104s5 and the sixth to ninth segments 104s6-104s9 may be on opposite sides of the width of the first segment 104s1. Accordingly, as shown in FIG. 36, the bottom electrode 104 may include first to eighth front surfaces 104e1-104e8, first to eighth back surfaces 104f1-104f8, a left surface 104c and a right surface 104d.

As shown in FIG. 36, the bottom surfaces 1081b-1088b of the top electrodes 1081-1088 may overlap with the corners $Cd8f5_{104}$, $Cd6f6_{104}$, $Cd4f7_{104}$, $Cd2f8_{104}$, $Cd9e5_{104}$, $Cd7e6_{104}$, $Cd5e7_{104}$, $Cd3e8_{104}$ of the bottom electrode 104, respectively. In other words, each top electrode 1081-1084 may be arranged over a corner $Cd8f5_{104}$, $Cd6f6_{104}$, $Cd4f7_{104}$, $Cd2f8_{104}$, $Cd9e5_{104}$, $Cd7e6_{104}$, $Cd5e7_{104}$, $Cd3e8_{104}$ between two adjacent segments 104s1-104s9 of the bottom electrode 104. Further, the top surface 104a of the bottom electrode 104 may overlap with multiple corners of each top electrode 1081-1088, among which the corners $Cce_{1081}$, $Cce_{1082}$, $Cce_{1083}$, $Cce_{1084}$, $Ccf_{1085}$, $Ccf_{1086}$, $Ccf_{1087}$, $Ccf_{1088}$ of the first to eighth top electrodes 1081-1088 may be nearest to the corners $Cd8f5_{104}$, $Cd6f6_{104}$, $Cd4f7_{104}$, $Cd2f8_{104}$, $Cd9e5_{104}$, $Cd7e6_{104}$, $Cd5e7_{104}$, $Cd3e8_{104}$ of the bottom electrode 104 respectively. Accordingly, conducting filaments may be formed and confined between the corners $Cce_{1081}$, $Cce_{1082}$, $Cce_{1083}$, $Cce_{1084}$, $Ccf_{1085}$, $Ccf_{1086}$, $Ccf_{1087}$, $Ccf_{1088}$ of the first to eight top electrodes 1081-1088 and the corners Cd8/5$_{104}$, Cd6/6$_{104}$, Cd4/7$_{104}$, Cd2/8$_{104}$, Cd9e5$_{104}$, Cd7e6$_{104}$, Cd5e7$_{104}$, Cd3e8$_{104}$ of the bottom electrode 104, respectively.

Referring to FIG. 37, the bottom electrode 104 of the memory device 3700 may include first to fifth segments 104s1-104s5. The first segment 104s1 may be a rectangular segment, and the second to fifth segments 104s2-104s5 may be arranged substantially perpendicular to and along a length of the first segment 104s1. The second to third segments 104s2, 104s3 and the fourth to fifth segments 104s4, 104s5 may be arranged on opposite sides of the width of the first segment 104s1. As shown in FIG. 37, the bottom surfaces 1081b-1088b of the top electrodes 1081-1088 may overlap with the corners Cc2f3$_{104}$, Cd4f4$_{104}$, Cc4f4$_{104}$, Cd2f5$_{104}$, Cc3e3$_{104}$, Cd5e4$_{104}$, Cc5e4$_{104}$, Cd3e5$_{104}$ of the bottom electrode 104, respectively. In other words, each top electrode 1081-1084 may be arranged over a corner Cc2f3$_{104}$, Cd4f4$_{104}$, Cc4f4$_{104}$, Cd2f5$_{104}$, Cc3e3$_{104}$, Cd5e4$_{104}$, Cc5e4$_{104}$, Cd3e5$_{104}$ between two adjacent segments 104s1-104s5 of the bottom electrode 104. Further, the top surface 104a of the bottom electrode 104 may overlap with multiple corners of each top electrode 1081-1088, among which the corners Cde$_{1081}$, Cce$_{1082}$, Cde$_{1083}$, Cce$_{1084}$, Cdf$_{1085}$, Ccf$_{1086}$, Cdf$_{1087}$, Ccf$_{1088}$ of the first to eighth top electrodes 1081-1088 may be nearest to the corners Cc2f3$_{104}$, Cd4f4$_{104}$, Cc4f4$_{104}$, Cd2f5$_{104}$, Cc3e3$_{104}$, Cd5e4$_{104}$, Cc5e4$_{104}$, Cd3e5$_{104}$ of the bottom electrode 104, respectively. Accordingly, conducting filaments may be formed and confined between the corners Cde$_{1081}$, Cce$_{1082}$, Cde$_{1083}$, Cce$_{1084}$, Cdf$_{1085}$, Ccf$_{1086}$, Cdf$_{1087}$, Ccf$_{1088}$ of the first to eighth top electrodes 1081-1088 and the corners Cc2f3$_{104}$, Cd4f4$_{104}$, Cc4f4$_{104}$, Cd2f5$_{104}$, Cc3e3$_{104}$, Cd5e4$_{104}$, Cc5e4$_{104}$, Cd3e5$_{104}$ of the bottom electrode 104, respectively.

Figure 38B:
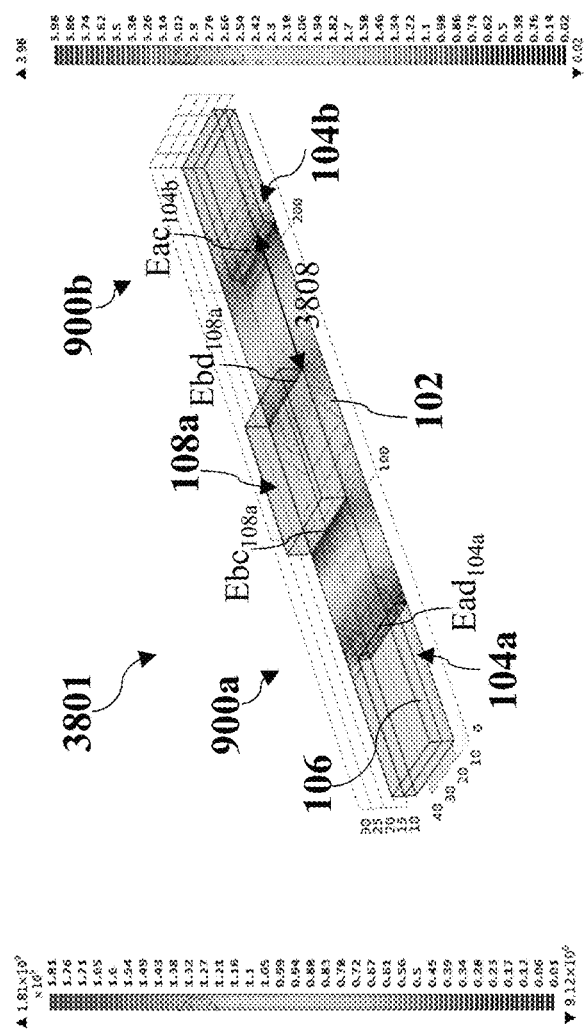
FIGS. 38A and 38B respectively show simulated electric fields in a memory structure including the memory devices of FIGS. 6A to 6C and a memory structure including the memory devices of FIGS. 9A to 9B.
Figure 38A:
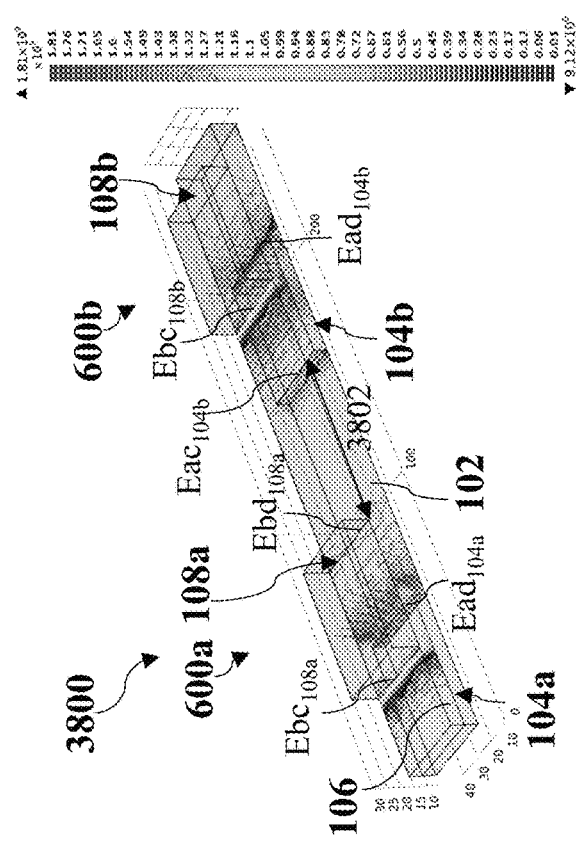

FIG. 38A shows a memory structure 3800 (or memory array 3800) including a plurality of memory devices 600a, 600b substantially similar to the memory device 600 described with reference to FIGS. 6A to 6C (with substantially similar top and bottom electrodes 104a, 104b, 108a, 108b), and FIG. 38B shows a memory structure 3801 (or memory array 3801) including a plurality of memory devices 900a, 900b substantially similar to the memory device 900 described with reference to FIGS. 9A to 9C (with substantially similar top and bottom electrodes 104a, 104b, 108a, 108b).

In the memory structure 3800, a separation 3802 between a top electrode 108a of a first memory device 600a and a bottom electrode 104b of a second memory device 600b (adjacent to the first memory device 600a) may be configured to be sufficiently large so as to prevent formation of conducting filaments between the electrodes 108a, 104b of the adjacent memory devices 600a, 600b. Similarly, in the memory structure 3801, a separation 3808 between a top electrode 108a of a first memory device 900a and a bottom electrode 104b of a second memory device 900b (adjacent to the first memory device 900a) may be configured to be sufficiently large so as to prevent formation of conducting filaments between the electrodes 108a, 104b of the adjacent memory devices 900a, 900b. For example, the separations 3802, 3808 may be greater than 50 nm.

FIG. 38A further shows simulated electric fields formed in the memory structure 3800 when the separation 3802 is greater than 50 nm. In particular, the simulated electric field strength at the edge Ebc$_{108}$a, Ebc$_{108}$b of the top electrode 108a, 108b of each memory device 600a, 600b is about 5.93×10$^8$V/m, and the simulated electric field strength at the edge Ead$_{104a}$, Ead$_{104b}$ of the bottom electrode 104a, 104b of each memory device 600a, 600b is about 2.51×10$^8$V/m. As shown in FIG. 38A, the edge Ebd$_{108a}$ of the top electrode 108a of the first memory device 600a is nearest to the second memory device 600b, and the edge Eac$_{104b}$ of the bottom electrode 104b of the second memory device 600b is nearest to the first memory device 600a. The simulated electric field strength at the edge Ebd$_{108a}$ is about 4.60× 10$^7$V/m and the simulated electric field strength at the edge Eac$_{104b}$ is about 4.50×10$^7$V/m. With these electric field strengths as compared to the electric field strengths at the edges Ebc$_{108a}$, Ebc$_{108b}$, Ead$_{104a}$, Ead$_{104b}$ in the memory devices 600a, 600b, formation of conducting filaments between the edges Ebd$_{108a}$, Eac$_{104b}$ of the adjacent memory devices 600a, 600b may be unlikely.

FIG. 38B further shows simulated electric fields formed in the memory structure 3801 when the separation 3808 is greater than 50 nm. As shown in FIG. 38B, the edge Ebd$_{108a}$ of the top electrode 108a of the first memory device 900a may be nearest to the second memory device 900b and the edge Eac$_{104b}$ of the bottom electrode 104b of the second memory device 900b may be nearest to the first memory device 900a. Similarly, formation of conducting filaments between these edges Ebd$_{108}$a, Eac$_{104b}$ may also be unlikely due to the difference in the electric field strengths at these edges Ebd$_{108a}$, Eac$_{104b}$ and at the edges Ebc$_{108}$a, Ead$_{104}$a, Ebc$_{108}$b, Ead$_{104b}$ of the memory devices 900a, 900b.

Although FIGS. 38A and 38B show each memory structure 3800, 3801 as being formed of a same type of memory device 600a, 600b/900a, 900b, in alternative non-limiting embodiments, memory structures formed of different types of memory devices may be provided. Further, the memory devices forming the memory structures may include any one of the memory devices 100-3700 as described above. The memory structures may also include any type of structure, such as, but not limited to a cross-bar structure.

The above-described memory devices 400-3700 may be fabricated using a process similar to that shown in FIGS. 3A to 3D, where the process may be a CMOS compatible stack process. In addition, the performance of the memory devices 100-3700 may be robust to inaccuracies arising from the fabrication processes (e.g. lithography misalignment/unalignment), since conducting filaments may still be formed even with the lateral offset in positions of the top and bottom electrodes 108, 104.

Further, as described above, in each of the memory devices 100-3700, electric field strengths may be enhanced at particular edges or corners. This can reduce the switching voltages of the memory devices 100-3700 and can also help to better confine the conducting filaments. The improved confinement of the conducting filaments may in turn help to reduce the stochasticity of their formation thus, reducing the variability of the resistance of the switching layers 106 and the memory devices 100-3700 especially when the memory devices 100-3700 are in the HRS. Accordingly, the cycle-to-cycle and device-to-device variability of the memory devices 100-3700 may be reduced, and the scalability of the memory devices 100-3700 may be improved. In particular, conducting filaments may be better confined between corners of the top and bottom electrodes 108, 104 (e.g. corners Cbcf$_{108}$, Cade$_{104}$ of the memory device 400) than between edges of the top and bottom electrodes 108, 104 (e.g. between edges Ebc$_{108}$, Ead$_{104}$ of the memory device 100).

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A resistive random access memory (RRAM) device comprising:
   a base insulating layer;
   a bottom electrode arranged completely within the base insulating layer, wherein a top surface of the bottom electrode and a top surface of the base insulating layer are substantially coplanar;
   a substantially planar switching layer arranged over the base insulating layer; and
   a top electrode arranged over the switching layer, wherein the top electrode is substantially planar along an entire length of the top electrode, and the top electrode is arranged in a laterally offset position relative to the bottom electrode.

2. The RRAM device of claim 1, wherein the top electrode comprises a bottom edge adjoining a bottom surface and a side surface, and the bottom electrode comprises a top edge adjoining a top surface and a side surface;
   wherein one of the side surface of the top electrode and the side surface of the bottom electrode is a right surface, and the other of the side surface of the top electrode and the side surface of the bottom electrode is a left surface; and
   wherein the bottom edge of the top electrode and the top edge of the bottom electrode at least partially extend along a same vertical plane.

3. The RRAM device of claim 2, wherein a front surface of the top electrode and a front surface of the bottom electrode at least partially extend along a same vertical plane;
   wherein the front surface of the top electrode and the front surface of the bottom electrode face a same direction; and
   wherein the front surface of the top electrode adjoins the side surface of the top electrode and the front surface of the bottom electrode adjoins the side surface of the bottom electrode respectively.

4. The RRAM device of claim 2, wherein a front surface of the top electrode and a front surface of the bottom electrode at least partially extend along different vertical planes substantially parallel to and laterally spaced apart from each other;
   wherein the front surface of the top electrode and the front surface of the bottom electrode face a same direction; and
   wherein the front surface of the top electrode adjoins the side surface of the top electrode and the front surface of the bottom electrode adjoins the side surface of the bottom electrode respectively.

5. The RRAM device of claim 4, wherein a corner of the top electrode is vertically aligned with a corner of the bottom electrode;
   wherein one of the corner of the top electrode and the corner of the bottom electrode adjoins a front surface with two other surfaces of the electrode, and the other of the corner of the top electrode and the corner of the bottom electrode adjoins a back surface with two other surfaces of the electrode.

6. The RRAM device of claim 1, wherein the top electrode comprises a bottom edge adjoining a bottom surface and a side surface, and the bottom electrode comprises a top edge adjoining a top surface and a side surface,
   wherein one of the side surface of the top electrode and the side surface of the bottom electrode is a right surface, and the other of the side surface of the top electrode and the side surface of the bottom electrode is a left surface; and
   wherein the bottom edge of the top electrode and the top edge of the bottom electrode at least partially extend along different vertical planes laterally offset from each other.

7. The RRAM device of claim 1, wherein the switching layer is arranged planarly over and across the base insulating layer and the bottom electrode, and the bottom surface of the top electrode partially overlaps with the top surface of the bottom electrode.

8. The RRAM device of claim 7, wherein a front surface of the top electrode and a front surface of the bottom electrode at least partially extend along a same vertical plane, wherein the front surface of the top electrode and the front surface of the bottom electrode face a same direction.

9. The RRAM device of claim 7, wherein a front surface of the top electrode and a front surface of the bottom electrode at least partially extend along different vertical planes substantially parallel to and laterally spaced apart from each other, wherein the front surface of the top electrode and the front surface of the bottom electrode face a same direction.

10. The RRAM device of claim 9, wherein the top surface of the bottom electrode overlaps with a corner of the top electrode, and the bottom surface of the top electrode overlaps with a corner of the bottom electrode;
    wherein one of the corner of the top electrode and the corner of the bottom electrode adjoins a front surface with two other surfaces of the electrode, and the other of the corner of the top electrode and the corner of the bottom electrode adjoins a back surface with two other surfaces of the electrode.

11. The RRAM device of claim 10, wherein the bottom electrode comprises a first segment and a second segment substantially perpendicular to each other, and wherein the corner of the bottom electrode lies between the first segment and the second segment.

12. The RRAM device of claim 1, wherein the bottom surface of the top electrode and the top surface of the bottom electrode have a same shape.

13. The RRAM device of claim 1, wherein the bottom surface of the top electrode and the top surface of the bottom electrode have different shapes.

14. The RRAM device of claim 1, wherein the top electrode is in direct contact with the switching layer, and the bottom surface of the top electrode and the top surface of the bottom electrode are laterally spaced apart.

15. The RRAM device of claim 14, wherein a front surface of the top electrode and a front surface of the bottom electrode at least partially extend along a same vertical plane, wherein the front surface of the top electrode and the front surface of the bottom electrode face a same direction.

16. The RRAM device of claim 14, wherein a front surface of the top electrode and a front surface of the bottom electrode at least partially extend along different vertical planes substantially parallel to and laterally spaced apart from each other, wherein the front surface of the top electrode and the front surface of the bottom electrode face a same direction.

17. The RRAM device of claim 1, further comprising at least one additional top electrode arranged over the switching layer in a laterally offset position relative to the bottom electrode, wherein each of the at least one additional top electrode is substantially planar.

18. A resistive random access memory (RRAM) device comprising:
   a base insulating layer;
   a bottom electrode arranged completely within the base insulating layer, wherein a top surface of the bottom electrode and a top surface of the base insulating layer are substantially coplanar;
   a substantially planar switching layer arranged over the base insulating layer; and
   a top electrode arranged over the switching layer, wherein the top electrode is substantially planar along an entire length of the top electrode, and the top electrode is arranged in a laterally offset position relative to the bottom electrode;
   wherein a bottom edge between a bottom surface and a side surface of the top electrode, and a top edge between a top surface and a side surface of the bottom electrode are spaced apart by a distance at least equal to a thickness of the switching layer.

19. The RRAM device of claim 18, wherein the bottom edge of the top electrode and the top edge of the bottom electrode at least partially extend along different vertical planes substantially parallel to and laterally spaced apart from each other.

20. A method of fabricating a resistive random access memory (RRAM) device, the method comprising:
   providing a base insulating layer;
   forming a bottom electrode completely within the base insulating layer, wherein a top surface of the bottom electrode and a top surface of the base insulating layer are substantially coplanar;
   forming a substantially planar switching layer over the base insulating layer; and
   forming a top electrode over the switching layer in a laterally offset position relative to the bottom electrode, wherein the top electrode is substantially planar along an entire length of the top electrode.

* * * * *